US006545893B2

(12) United States Patent
Kunikiyo

(10) Patent No.: US 6,545,893 B2
(45) Date of Patent: Apr. 8, 2003

(54) NON-VOLATILE SEMICONDUCTOR MEMORY

(75) Inventor: Tatsuya Kunikiyo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/960,335

(22) Filed: Sep. 24, 2001

(65) Prior Publication Data

US 2002/0149958 A1 Oct. 17, 2002

(30) Foreign Application Priority Data

Apr. 11, 2001 (JP) ........................................ 2001-112520

(51) Int. Cl.$^7$ ................................................ G11C 5/02
(52) U.S. Cl. .............................. 365/51; 365/63; 365/72; 257/300; 257/314; 257/319; 257/390; 257/391
(58) Field of Search ............................... 365/51, 63, 72; 257/314, 319, 300, 323, 390, 391

(56) References Cited

U.S. PATENT DOCUMENTS

| | | | | |
|---|---|---|---|---|
| 5,641,979 A | * | 6/1997 | Ema et al. .................... | 257/312 |
| 5,900,661 A | * | 5/1999 | Sato ............................ | 257/315 |
| 6,239,465 B1 | * | 5/2001 | Nakagawa ................... | 257/314 |
| 6,437,394 B1 | * | 8/2002 | Kawata et al. .............. | 257/315 |
| 2001/0038115 A1 | * | 11/2001 | Amanuma ................... | 257/303 |

FOREIGN PATENT DOCUMENTS

JP 11-195718 7/1999

OTHER PUBLICATIONS

Boaz Eitan, et al., "Can NROM, a 2 Bit, Trapping Storage NVM Cell, Give a Real Challenge to Floating Gate Cells?" Extended Abstracts of the 1999 International Conference on Solid State Devices and Materials, Tokyo, 1999, pp. 522–524.

* cited by examiner

Primary Examiner—Richard Elms
Assistant Examiner—Toan Le
(74) Attorney, Agent, or Firm—Oblon, Spivak, McClelland, Maier & Neustadt, P.C.

(57) ABSTRACT

A non-volatile semiconductor memory capable of suppressing the occurrence of disturb failure during erase operation is provided by arranging as follows. Bit lines (BL) extend in the row direction of a matrix. Gate electrodes (9) are disposed on a channel region (CH). The non-volatile semiconductor memory comprises plugs (10) for connecting the gate electrodes (9) and word lines. The word lines at each row have two sub-word lines (WL). The first pair of sub-word lines (WL1$a$, WL1$b$) and the second pair of sub-word lines (WL2$a$, WL2$b$) belong to the same row, respectively. The first sub-word line of the first pair (WL1$a$) is in contact with first plugs ($10_{12}$, $10_{14}$), the second sub-word line of the first pair (WL1$b$) is in contact with second plugs ($10_{11}$, $10_{13}$), the first sub-word line of the second pair (WL2$a$) is in contact with third plugs ($10_{22}$, $10_{24}$), and the second sub-word line of the second pair (WL2$b$) is in contact with fourth plugs ($10_{21}$, $10_{23}$).

20 Claims, 61 Drawing Sheets

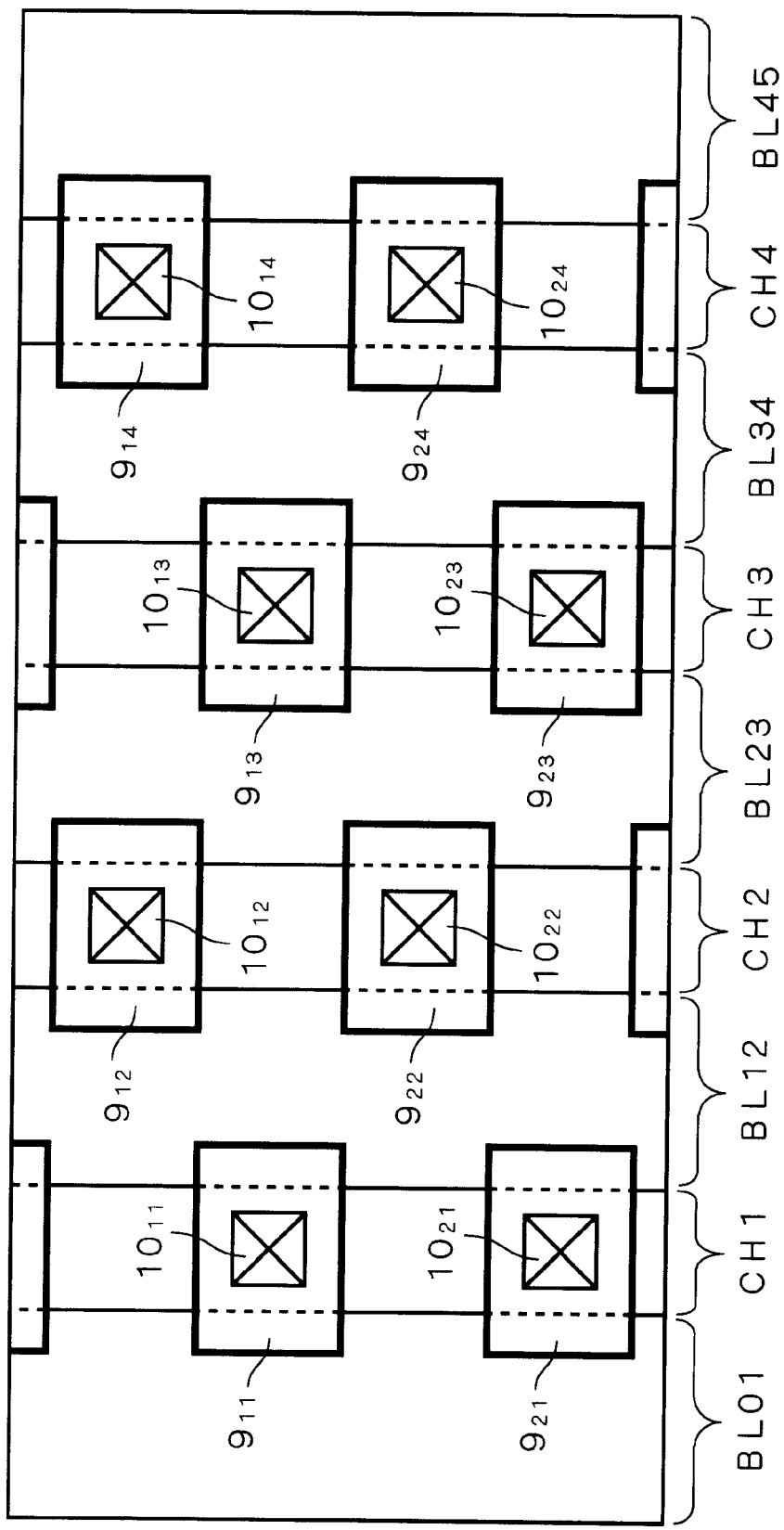
F I G. 17

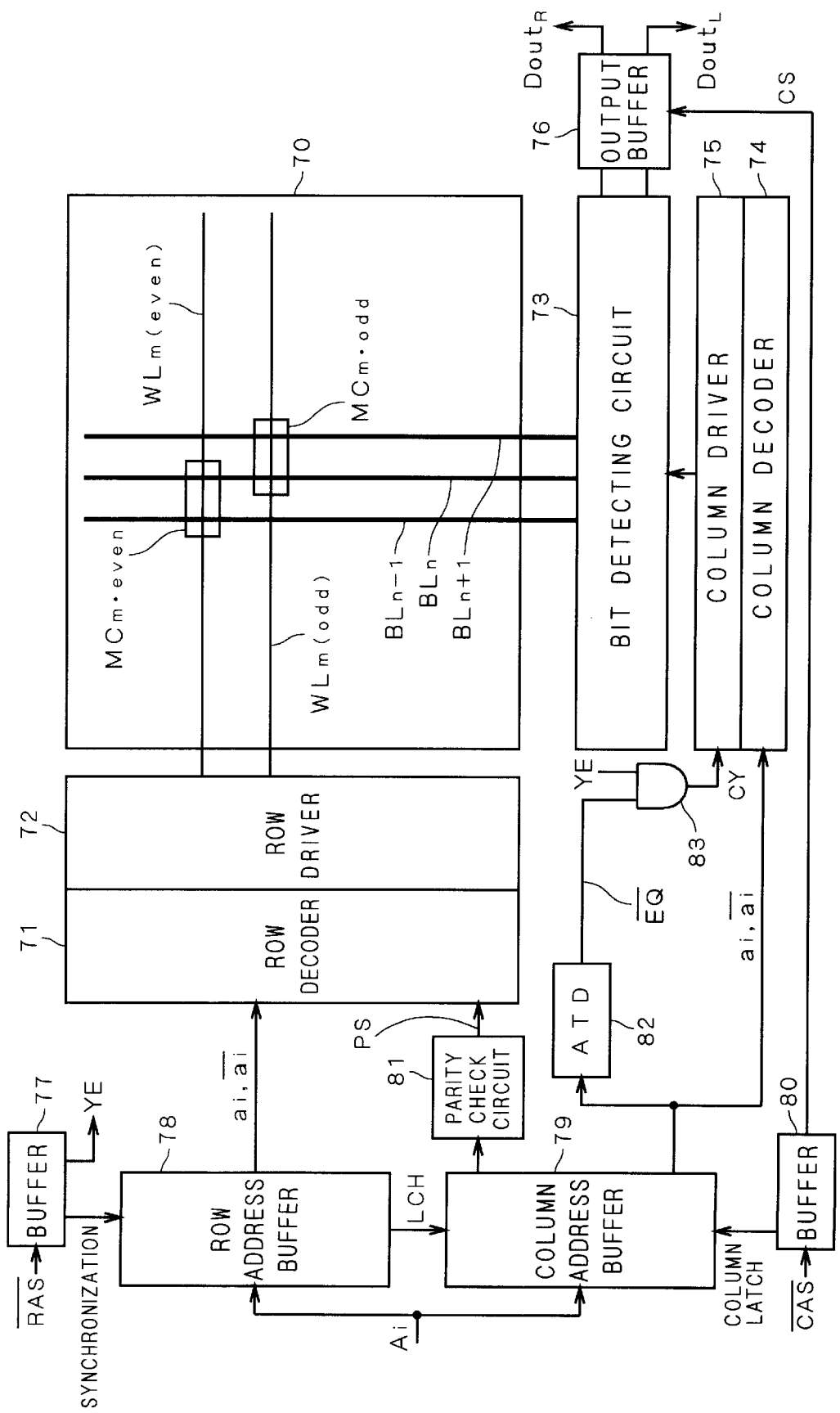
F I G. 43

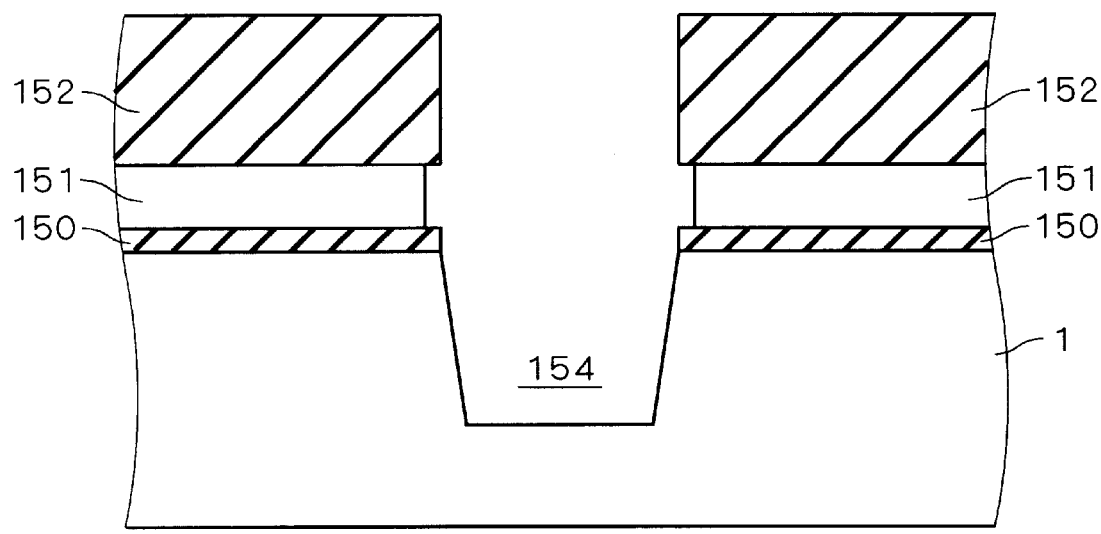
F I G . 4 8
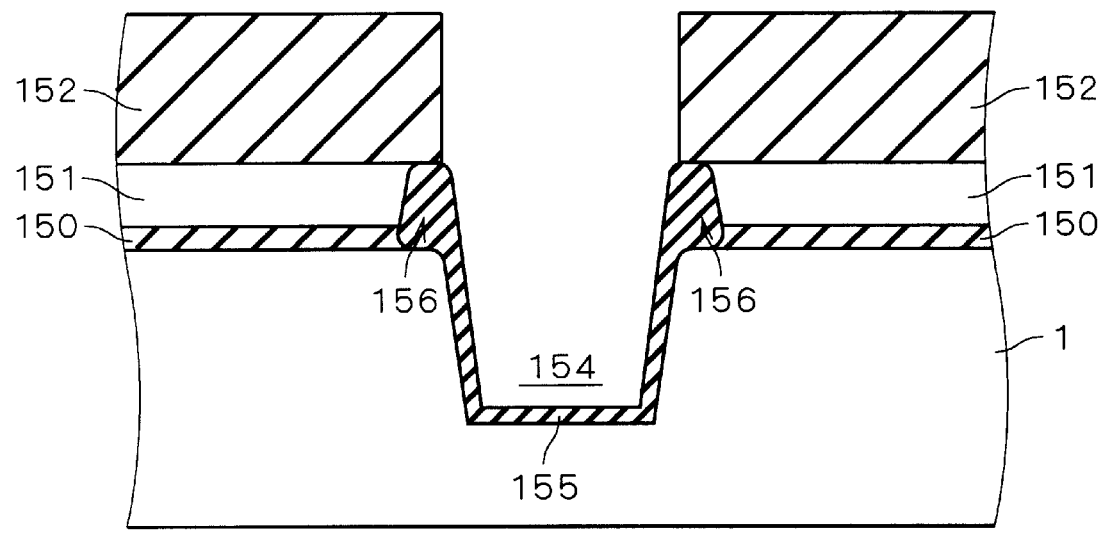
F I G . 4 9

F I G . 5 2
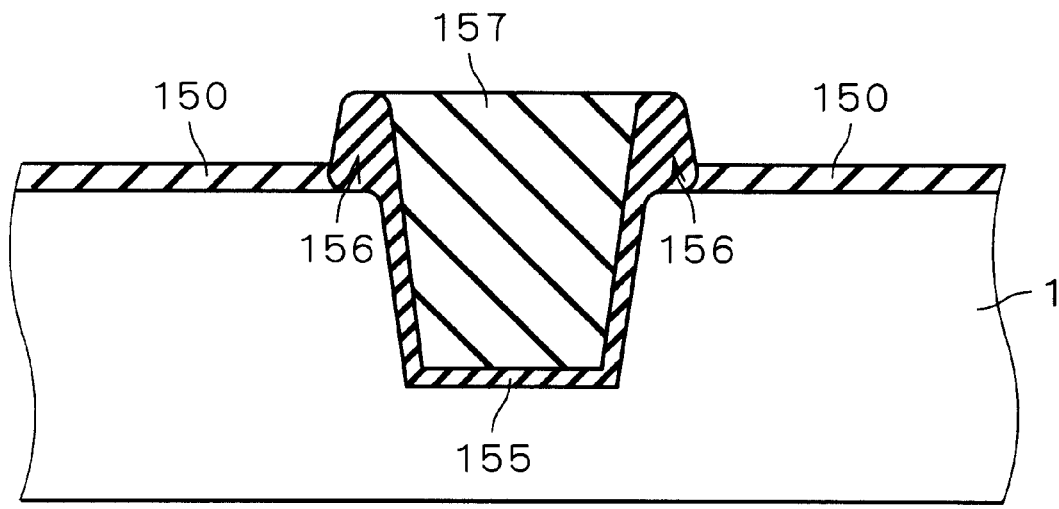
F I G . 5 3
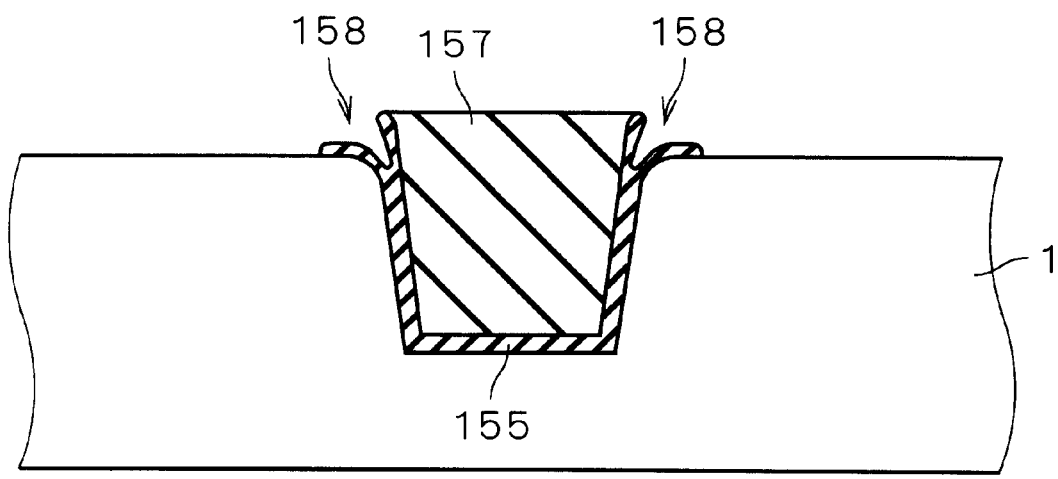

Bit R WRITE

Bit L WRITE

Bit R ERASE

Bit L ERASE

Bit R READ

Bit L READ

NON-VOLATILE SEMICONDUCTOR MEMORY

BACKGROUND OF THE INVENTION

1. Field of the Invention

The present invention relates to a non-volatile semiconductor memory and, in particular, to a structure of a NROM (nitride read only memory) type non-volatile semiconductor memory.

2. Description of the Background Art

FIG. 61 is a top view illustrating part of the structure of a conventional NROM type non-volatile semiconductor memory, and it schematically shows only the arrangement of word lines WL1 and WL2, bit lines BL1 and BL2, and channel regions CH1 to CH3. The word lines WL1 and WL2 extend in a predetermined direction (hereinafter referred to as "row direction"). The bit lines BL1 and BL2 extend in a direction orthogonal to the row direction (hereinafter referred to as "column direction). The channel regions CH1 to CH3 are disposed between bit lines adjacent with each other, and extend in the column direction.

FIG. 62 is a sectional view of a memory cell transistor structure, corresponding to a cross-sectional structure taken along the line A1—A1 in FIG. 61. LOCOS (local oxidation of silicon) type isolation insulating films $106_{12}$ and $106_{23}$ for defining an element-forming region are selectively formed in the upper surface of a silicon substrate 101. $N^+$ type impurity diffusion regions $107_{12}$ and $107_{23}$ are formed at the interfacial portions between the silicon substrate 101 and the isolation insulating films $106_{12}$ and $106_{23}$. The impurity diffusion regions $107_{12}$ and $107_{23}$ correspond to the bit lines BL1 and BL2 shown in FIG. 61. The impurity diffusion regions $107_{12}$ and $107_{23}$ can be formed by introducing, by ion implantation method, an n-type impurity into the silicon substrate 101 beneath the isolation insulating films $106_{12}$ and $106_{23}$, and then subjecting the impurity to thermal diffusion.

ONO films $105_1$ to $105_3$ are formed on the upper surface of the silicon substrate 101 in the element-forming region. The ONO films $105_1$ to $105_3$ extend so as to overlie the end portions of the isolation insulating films $106_{12}$ and $106_{23}$. The ONO films $105_1$ to $105_3$ have such a three-layer structure that silicon oxide films $102_1$ to $102_3$, silicon nitride films $103_1$ to $103_3$, and silicon oxide films $104_1$ to $104_3$ are formed in this order on the silicon substrate 101. Unlike MNOS (metal nitride oxide semiconductor) type memory cell transistors, the silicon oxide films $102_1$ to $102_3$ and $104_1$ to $104_3$ have a thickness of not less than 5 nm, in order to prevent tunneling phenomenon of electrons.

A conductive film $109_1$ is disposed on the ONO films $105_1$ to $105_3$ and the isolation insulating films $106_{12}$ and $106_{23}$. The conductive film $109_1$ has, for example, polycide structure or polymetal structure. For the purpose of increasing the operation speed of memory cell transistors, it is preferable to employ polymetal structure having lower resistance than polycide structure. The conductive film $109_1$ corresponds to the word line WL1 shown in FIG. 61. P-type channel regions $108_1$ to $108_3$ are disposed in the upper surface of the silicon substrate 101 in the element-forming region. The channel regions $108_1$ to $108_3$ correspond to the channel regions CH1 to CH3 shown in FIG. 61. By adjusting the impurity concentration of the channel regions $108_1$ to $108_3$, the threshold voltage of the memory cell transistor can be set to a desired value.

The impurity diffusion regions $107_{12}$ and $107_{23}$ function as the source/drain regions of the memory cell transistors. The ONO films $105_1$ to $105_3$ function as the gate insulating film of the memory cell transistors. The conductive film $109_1$ overlying the ONO films $105_1$ to $105_3$ functions as the gate electrode of the memory cell transistors.

The isolation insulating films $106_{12}$ and $106_{23}$ are formed in the following manner. First, an ONO film is formed on the entire upper surface of a silicon substrate 101. The ONO film is then patterned to form ONO films $105_1$ to $105_3$, thereby to expose part of the upper surface of the silicon substrate 101. The exposed part of the silicon substrate 101 is then subjected to thermal oxidation, thereby forming isolation insulating films $106_{12}$ and $106_{23}$. Thus, by arranging such that the ONO films $105_1$ to $105_3$ function as an oxidation preventing mask in forming the isolation insulating films $106_{12}$ and $106_{23}$, in addition to the function of the gate insulating film of the memory cell transistor, the number of manufacturing steps can be reduced.

An NROM type non-volatile semiconductor memory, as will be described below, can store a 2-bit information in total, a 1-bit for each of two locations in one memory cell transistor. Referring to FIG. 61, the unit cell area of the NROM type non-volatile semiconductor memory is $2F \times 2.5F = 5F^2$, wherein F (featured size) corresponds to a design rule. When F=0.35 μm, $5F^2 = 0.6125$ μm$^2$. When F=0.25 μm, $5F^2 = 0.3125$ μm$^2$. The NROM type non-volatile semiconductor memory can be manufactured relatively easily only by adding four photomasks (two of which are for memory cell, and the remainder for peripheral circuit) to existing CMOS process. For the reason for this, the NROM type non-volatile semiconductor memory has the features of having high storage density and low manufacturing cost.

The operation of a NROM type memory cell transistor will now be fully described. The NROM type memory cell transistor can store a 1-bit information at each of two locations of one memory cell transistor. In the present specification, one location storing information is defined as "Bit R", and the other location is defined as "Bit L".

FIGS. 63(A) and 63(B) are schematic diagrams illustrating write operation. FIG. 63(A) shows the write operation to the Bit R. A voltage of $V_S$=0 V is applied to an impurity diffusion region $107_{12}$ functioning as a source region, a voltage of $V_D$=4 V is applied to an impurity diffusion region $107_{23}$ functioning as a drain region, and a voltage of $V_G$=8 V is applied to a gate electrode $109_1$. Thereby, channel hot electrons are introduced via a silicon oxide film $102_2$ into a silicon nitride film $103_2$, and the introduced electrons are then trapped and stored by traps (also called trap levels or trap centers) which are discretely distributed in the silicon nitride film $103_2$. Unlike electrons stored in a floating gate such as of a flash memory, the electrons stored in the silicon nitride film $103_2$ are less dispersible in a lateral direction (the gate length direction) in the silicon nitride film $103_2$. The number of electrons needed in writing is as few as 200 to 500, and writing is completed in a short time of about 100 ns. By reversing the voltages applied to the impurity diffusion regions $107_{12}$ and $107_{23}$, writing to the Bit L can be performed as shown in FIG. 63(B).

FIGS. 64(A) and 64(B) are schematic diagrams illustrating erase operation. FIG. 64(A) shows an erase operation related to the Bit R. A voltage of $V_{SD12}$=0 V is applied to the impurity diffusion region $107_{12}$, a voltage of $V_{SD23}$=4 V is applied to the impurity diffusion region $107_{23}$, and a voltage of $V_G$=−6 V is applied to the gate electrode $109_1$. Thereby, there occurs a potential difference between the silicon substrate 101 (or the channel region $108_2$) and the impurity diffusion region $107_{23}$. As a result, the energy bands of the silicon substrate 101 is curved, and interband tunnel current flows. By the interband tunnel current, hot holes are induced, and the hot holes are attracted by the gate voltage of −6 V and then introduced into the silicon nitride film $103_2$ via the silicon oxide film $102_2$. The introduced holes are then coupled to electrons stored in the silicon nitride film $103_2$, thereby erasing the stored information of the Bit R. Since the number of electrons to be erased is small, its erase is completed in a short time in the range of about 1 to 10 μs. By reversing the voltages applied to the impurity diffusion regions $107_{12}$ and $107_{23}$, erase related to the Bit L can be performed as shown in FIG. 64(B).

FIGS. 65(A) and 65(B) are schematic diagrams illustrating read operation. FIG. 65(A) shows the read operation from the Bit R. A voltage of $V_D$=1.5 V is applied to the impurity diffusion region $107_{12}$ functioning as a drain region, a voltage of $V_S$=0 V is applied to the impurity diffusion region $107_{23}$ functioning as a source region, and a voltage of $V_G$=3 V is applied to the gate electrode $109_1$. By applying a voltage of $V_D$=1.5 V to the impurity diffusion region $107_{12}$, channel current is allowed to flow to the impurity diffusion region $107_{12}$, irrespective of the contents stored in the Bit L. When electrons are stored in the silicon nitride film $103_2$ of the Bit R, it is in a state raised in threshold voltage, and no channel current flows even by applying a voltage of 3V to the gate electrode $109_1$. On the other hand, when no electrons are stored in the silicon nitride film $103_2$ of the Bit R, it is in a state lowered in threshold voltage, and channel current flows by applying a voltage of 3V to the gate electrode $109_1$. Therefore, the stored information of the Bit R can be read by detecting drain current or drain voltage. By reversing the voltages applied to the impurity diffusion regions $107_{12}$ and $107_{23}$, the read from the Bit L can be performed as shown in FIG. 65(B).

FIG. 66 is a circuit diagram illustrating a memory cell array configuration in a conventional NROM type non-volatile semiconductor memory. Bit lines form a hierarchical structure of main bit lines MBL1 and MBL2 and sub-bit lines SBL1 to SBL5. The bit lines BL1 and BL2 shown in FIG. 61 and the impurity diffusion regions $107_{12}$ and $107_{23}$ shown in FIG. 62 correspond to the sub-bit lines SBL1 to SBL5 in FIG. 66. Although two main bit lines MBL1 and MBL2 and five sub-bit lines SBL1 to SBL5 are depicted in FIG. 66, these numbers are cited merely by way of example and without limitation. The sub-bit lines SBL2 to SBL4, except for the sub-bit lines SBL1 and SBL5 at the opposite ends, are common to two memory cells adjacent each other in the row direction, thereby realizing a high integration degree of the memory cell array.

Selective transistors ST1a to ST4a and ST2b to ST5b are respectively connected to the opposite ends of the sub-bit lines SBL1 to SBL5. The selective transistors ST1a to ST4a are connected to the main bit line MBL1, and the selective transistors ST2b to ST5b are connected to the main bit line MBL2. The gates of the selective transistors ST1a to ST4a and ST2b to ST5b are connected to selective wirings SL1a to SL4a and SL2b to SL5b, respectively. Connection between the main bit lines MBL1, MBL2, and the sub-bit lines SBL1 to SBL5, can be controlled by a voltage applied to the selective wirings SL1a to SL4a and SL2b to SL5b.

Taking the memory cell transistor MT11 as example, consider the case of performing the wire operation shown in FIG. 63(A). Firstly, a voltage of 0 V is applied to the main bit line MBL1, and a voltage of 4 V is applied to the main bit line MBL2. Then, a voltage of 1.5 V+Vth is applied to the selective wiring SL1a, and a voltage of 4 V+Vth is applied to the selective wiring SL2b. As used herein, "Vth" is a threshold voltage of the selective transistors ST1a to ST4a and ST2b to ST5b. Accordingly, a voltage of 0 V and a voltage of 4 V are applied to the sub-bit lines SBL1 and SBL2, respectively. Subsequently, by applying a voltage of 8 V to the word line WL1, electrons are introduced into the ONO film on the sub-bit line SBL2 side of the memory cell transistor MT11, thereby performing write to the Bit R.

FIG. 67 is a timing chart illustrating each of write, read and erase operations related to the Bit R of the memory cell transistor MT11. The write operation is as described above. When performing read operation, a voltage of 1.5 V and a voltage of 0 V are applied to the main bit lines MBL1 and MBL2, respectively, a voltage of 1.5 V+Vth is applied to the selective wirings SL1a and SL2b, and a voltage of 3 V is applied to the word line WL1. In performing erase operation, a voltage of 0V and a voltage of 4 V are applied to the main bit lines MBL1 and MBL2, respectively, a voltage of 1.5 V+Vth and a voltage of 4 V+Vth are applied to the selective wirings SL1a and SL2b, respectively, and a voltage of −6 V is applied to the word line WL1. When using two power sources of 1.5 V and 0 V, other voltages of 8V, 4 V, 3 V and −6 V are required to generate in the interior of a chip.

However, the foregoing conventional non-volatile semiconductor memory has suffered from the following problems.

First Problem

FIG. 68 is a sectional view illustrating the structure of two memory cell transistors MT12 and MT13 adjacent each other in the row direction. An impurity diffusion region $107_{23}$ is common to the two memory cell transistors MT12 and MT13. Part of the conductive film $109_1$ which is located on an ONO film $105_2$ functions as the gate electrode of the memory cell transistor MT12, and part of the conductive film $109_1$ which is located on an ONO film $105_3$ functions as the gate electrode of the memory cell transistor MT13. The gate electrode of the memory cell transistor MT12 and the gate electrode of the memory cell transistor MT13 are electrically connected via part of the conductive film $109_1$ which is located on an isolation insulating film $106_{23}$.

It is assumed that in the Bit R of the memory cell transistor MT12 and the Bit L of the memory cell transistor MT13, electrons are stored in both of the ONO films $105_2$ and $105_3$. Consider now the case of erasing the contents stored in the Bit R of the memory cell transistor MT12. In this case, by applying a voltage of 0 V to the impurity diffusion region $107_{12}$, a voltage of 4 V to the impurity diffusion region $107_{23}$, and a voltage of −6 V to the conductive film $109_1$, hot holes are introduced into the ONO film $105_2$, thereby erasing the stored contents.

At this time, due to the application of the voltage of 4 V to the impurity diffusion region $107_{23}$, hot holes are also induced in the adjacent memory cell transistor MT13 that is not selected. Further, since the voltage of −6 V is applied to the gate electrode of the memory cell transistor MT13, the inducted hot holes are introduced into the ONO film $105_3$. As a result, the contents stored in the Bit L of the non-selected memory cell transistor MT13 is erased. Thus, with the conventional non-volatile semiconductor memory, when easing the stored contents of the memory cell transistor, the stored contents of the adjacent non-selected memory cell transistor are also erased. That is, there has been the problems of causing disturb failure during erasing.

Second Problem

Referring to FIG. 62, in the NROM type memory cell transistor, the $n^+$ type impurity diffusion region 107 is formed in the silicon substrate 101, and the impurity diffusion region 107 corresponds to the sub-bit line SBL in FIG. 66. For instance, the sheet resistance of the word line WL of polycide structure is about 5 to 6 Ω/□, whereas the sheet resistance of the $n^+$ type impurity diffusion region 107 is about 100 Ω/□. Accordingly, a delay time of signal transmission in the sub-bit line SBL is larger than that in the word line WL. This results in the problem that the operation speed of the memory cell transistors is lowered as a whole.

Third Problem

As set forth, in the NROM type memory cell transistor, the contents stored in a memory cell transistor is read by detecting as to whether the transistor has a high or low threshold voltage resulting from the presence or absence of electrons stored in the ONO film 105. In order to accurately read the stored contents of the memory cell transistor, it is desirable that there is a large difference between a threshold voltage when electrons are stored in the ONO film 105 and a threshold voltage when no electrons are stored therein, namely that the threshold voltage distribution is sharp.

FIG. 69 is a diagram showing a threshold voltage distribution. The threshold voltage distribution of the memory cell transistor when electrons are stored in the ONO film 105 corresponds to "0", and that when no electrons are stored therein corresponds to "1". A larger difference between the maximum value of the distribution "0" and the minimum value of the distribution "1" (hereinafter referred to as "WINDOW") permits more accurate read of the stored contents of the memory cell transistor. However, as shown in FIG. 69, the WINDOW that is relatively large in the initial state is gradually smaller as the operation of the memory cell transistor is repeated.

FIG. 70 is a sectional view illustrating a conventional memory cell transistor structure. Referring to FIG. 70, the miniaturization of WINDOW is caused by the fact that electrons trapped and stored by the traps at the end portions of the silicon nitride film 103 gradually move to the center by means of hopping or the like. Such a conventional non-volatile semiconductor memory suffers from the problem that as the operation of a memory cell transistor is repeated, the WINDOW is gradually smaller, thus failing to accurately read the stored contents of the memory cell transistor.

SUMMARY OF THE INVENTION

According to a first aspect of the invention, a non-volatile semiconductor memory comprises: a semiconductor substrate; plural memory cell transistors disposed in the form of a matrix in the semiconductor substrate; plural bit lines disposed at each column of the matrix; and plural word lines disposed at each row of the matrix, wherein the word lines have plural sub-word lines; and gate electrodes of the memory cell transistors adjacent each other in the row direction of the matrix are connected to the sub-word lines different from each other.

According to a second aspect of the invention, the non-volatile semiconductor memory of the first aspect further comprises an interlayer insulating film covering the memory cell transistors, and is characterized in that the sub-word lines extend in the row direction of the matrix and are disposed in the interlayer insulating film; that the gate electrodes are disposed on the semiconductor substrate via a gate insulting film capable of storing electrons, and are connected to the sub-word lines via a plug disposed in the interlayer insulating film; and that a wide portion of the gate electrodes is disposed at a contact portion between the gate electrodes and the plug.

According to a third aspect of the invention, the non-volatile semiconductor memory of the first aspect further comprises an interlayer insulating film covering the memory cell transistors, and is characterized in that the sub-word lines extend in the row direction of the matrix and are disposed in the interlayer insulating film; that the gate electrodes are disposed on the semiconductor substrate via a gate insulting film capable of storing electrons, and are connected to the sub-word lines via a plug disposed in the interlayer insulating film; and that the plug is in contact with the central portion of the gate electrodes.

According to a fourth aspect of the invention, the non-volatile semiconductor memory of the first aspect further comprises an interlayer insulating film covering the memory cell transistors, and is characterized in that the sub-word lines are disposed in the interlayer insulating film; that the gate electrodes are disposed on the semiconductor substrate via a gate insulting film capable of storing electrons, and are connected to the sub-word lines via a plug disposed in the interlayer insulating film; and that the sub-word lines extend linearly in the row direction of the matrix.

According to a fifth aspect of the invention, the non-volatile semiconductor memory of the first aspect is characterized in that the bit lines have an impurity diffusion region extending in the column direction of the matrix and being disposed in the semiconductor substrate, further comprises: an interlayer insulating film covering the memory cell transistors; and wiring extending in the column direction of the matrix and being disposed in the interlayer insulating film, the wiring being connected to the impurity diffusion region via a plug disposed in the interlayer insulating film and having higher conductivity than the impurity diffusion region.

According to a sixth aspect of the invention, the non-volatile semiconductor memory of the first aspect is characterized in that the sub-word lines extend in the row direction of the matrix and have a portion functioning as the gate electrodes of the memory cell transistors and overlying the semiconductor substrate via a gate insulating film capable of storing electrons, further comprises: an interlayer insulating film covering the memory cell transistors; and wiring extending in the row direction of the matrix and being disposed in the interlayer insulating film, the wiring being connected to the sub-word lines via a plug disposed in the interlayer insulating film and having higher conductivity than the sub-word lines.

According to a seventh aspect of the invention, the non-volatile semiconductor memory of one of the first to sixth aspects is characterized in that the gate electrodes are disposed on a main surface of the semiconductor substrate via a gate insulating film having a charge storing region capable of storing charge; that the memory cell transistors further have source/drain regions disposed in the main surface of the semiconductor substrate; and that the charge storing region is disposed only in the end portion of the gate insulating film adjacent to the source/drain regions.

According to an eighth aspect of the invention, the non-volatile semiconductor memory of the seventh aspect is characterized in that the gate insulating film is a silicon oxide film; and that the charge storing region is a polysilicon film disposed in the silicon oxide film.

According to a ninth aspect of the invention, the non-volatile semiconductor memory of one of the first to eighth aspects further comprises: a detecting circuit to detect a bit line to be activated from the plural bit lines, based on a column address signal; and a selecting circuit to select a sub-word line to be activated from the plural sub-word lines, based on a row address signal and the result of detection of the detecting circuit.

According to a tenth aspect of the invention, the non-volatile semiconductor memory of one of the first to eighth aspects is characterized in that the word lines have two sub-word lines, further comprises: a parity check circuit to detect the parity of a column address signal; and a selecting circuit to select one sub-word line to be activated from the two sub-word lines, based on a row address signal and the result of detection of the parity check circuit.

According to an eleventh aspect of the invention, the non-volatile semiconductor memory of the first aspect further comprises a first isolation insulating film of trench type being disposed in a main surface of the semiconductor substrate and isolating the memory cell transistors adjacent each other in the row direction of the matrix, and is characterized in that the bit lines have an impurity diffusion region disposed in the interface between the semiconductor substrate and the first isolation insulating film.

According to a twelfth aspect of the invention, the non-volatile semiconductor memory of the eleventh aspect is characterized in that the semiconductor substrate has a memory cell array part in which the plural memory cell transistors are disposed, and a peripheral circuit part in which a peripheral circuit for controlling the memory cell transistors is disposed, further comprises a second isolation insulating film of trench type disposed at the boundary portion between the memory cell array part and the peripheral circuit part in the main surface of the semiconductor substrate, the second isolation insulating film being deeper than the first isolation insulating film.

According to a thirteenth aspect of the invention, the non-volatile semiconductor memory of the eleventh or twelfth aspect is characterized in that the gate electrodes are formed so as to overlie the end portion of the first isolation insulating film at the boundary portion with the main surface of the semiconductor substrate; and that a recess buried with the gate electrodes is disposed in the upper surface of the end portion of the first isolation insulating film.

According to a fourteenth aspect of the invention, the non-volatile semiconductor memory of one of the eleventh to thirteenth aspects is characterized in that the first isolation insulating film has a cross-section of substantially T-shape of which central portion has a larger depth than its end portion; and that the impurity diffusion region of one of the memory cell transistors and the impurity diffusion region of the other memory cell transistor adjacent to the one memory cell transistor via the first isolation insulating film, are isolated by the central portion of the first isolation insulating film.

According to a fifteenth aspect of the invention, the non-volatile semiconductor memory of one of the first to fourteenth aspects is characterized in that the semiconductor substrate is a semiconductor layer of an SOI substrate having such a structure that a support substrate, an insulating layer and the semiconductor layer are stacked in this order.

According to a sixteenth aspect of the invention, the non-volatile semiconductor memory of the twelfth aspect is characterized in that the semiconductor substrate is a semiconductor layer of an SOI substrate having such a structure that a support substrate, an insulating layer and the semiconductor layer are stacked in this order; and that the second isolation insulating film is in contact with the insulating layer.

According to a seventeenth aspect of the invention, the non-volatile semiconductor memory of the twelfth aspect is characterized in that the semiconductor substrate is a semiconductor layer of an SOI substrate having such a structure that a support substrate, an insulating layer and the semiconductor layer are stacked in this order; and that the bottom surface of the second isolation insulating film is present in the semiconductor layer.

According to an eighteenth aspect of the invention, a non-volatile semiconductor memory comprises: a semiconductor substrate; plural memory cell transistors disposed in the form of a matrix in the semiconductor substrate; plural bit lines disposed at each column of the matrix; plural word lines disposed at each row of the matrix; and an interlayer insulating film covering the memory cell transistors, wherein the bit lines have an impurity diffusion region extending in the column direction of the matrix and being disposed in the semiconductor substrate, further comprises wiring extending in the column direction of the matrix and being disposed in the interlayer insulating film, the wiring being connected to the impurity diffusion region via a plug disposed in the interlayer insulating film and having higher conductivity than the impurity diffusion region.

According to a nineteenth aspect of the invention, the non-volatile of semiconductor memory of the eighteenth aspect is characterized in that the word lines extend in the row direction of the matrix and have a portion functioning as the gate electrodes of the memory cell transistors and overlying the semiconductor substrate via a gate insulating film capable of storing electrons; further comprises: wiring extending in the row direction of the matrix and being disposed in the interlayer insulating film, the wiring being connected to the word lines via a plug disposed in the interlayer insulating film and having higher conductivity than the word lines.

According to a twentieth aspect of the invention, a non-volatile semiconductor memory comprises: a semiconductor substrate; and plural memory cell transistors disposed in the form of a matrix in the semiconductor substrate, the memory cell transistors having a gate insulating film being disposed on a main surface of the semiconductor substrate and having a charge storing region capable of storing charge; a gate electrode disposed on the gate insulating film; and source/drain regions disposed in the main surface of the semiconductor substrate, the charge storing region being disposed only in the end portion of the gate insulating film adjacent to the source/drain regions.

In the first aspect, different voltages can be applied individually to each gate electrode of the memory cell transistors adjacent each other in the row direction of the matrix. This enables avoiding the occurrence of disturb failure during erasing.

In the second aspect, there is the effect of increasing mask alignment offset margin when alignment with the gate electrodes is made to form the plug in the interlayer insulating film.

In the third aspect, there is also the effect of increasing mask alignment offset margin when alignment with the gate electrodes is made to form the plug in the interlayer insulating film.

In the fourth aspect, as compared to the case that the sub-word lines snake and extend in the row direction, the wiring length of the sub-word lines is shortened thereby to reduce a delay time of signal transmission in the sub-word lines.

In the fifth aspect, by arranging such that the wiring of low resistance is connected via the plug to the impurity diffusion region, the resistance value of the bit lines can be lowered thereby to reduce the delay time of signal transmission in the bit lines.

In the sixth aspect, by connecting the wiring of low resistance to the sub-word lines, the resistance value of the sub-word lines can be lowered thereby to reduce the delay time of signal transmission in the sub-word lines.

In the seventh aspect, it is able to suppress the charge stored in the charge-storing region from diffusing in the gate insulating film. This enable to suppress the miniaturization of WINDOW caused by the repetitive operation of the memory cell transistors.

In the eighth aspect, charge can be stored in the polysilicon film functioning as a floating gate. Further, since the gate insulating film is composed of a silicon oxide film having less traps, the miniaturization of WINDOW can be effectively suppressed.

In the ninth aspect, the selecting circuit can select a suitable sub-word line from a plurality of sub-word lines that belong to the same row in the matrix, depending on the bit line to be activated.

In the tenth aspect, the selecting circuit can select a suitable sub-word line from two sub-word lines that belong to the same row in the matrix, depending on the parity of a row address signal.

In the eleventh aspect, as compared to the case of having the LOCOS type isolation insulating film, the area occupied by a bird's beak is reduced to increase the integration degree of the chip.

The twelfth aspect enables to suppress the interference between the memory cell transistors and the peripheral circuit.

In the thirteenth aspect, the efficiency of write and erase operations can be increased because the field strength is increased at the portion having the recess.

In the fourteenth aspect, the occurrence of disturb failure during erasing can be avoided because the impurity diffusion region of one memory cell transistor and the impurity diffusion region of the other memory cell transistor are separated by the central portion of the first isolation insulating film.

In the fifteenth aspect, resistance to soft error can be improved and, by reducing parasitic capacity, the operation speed can be increased.

In the sixteenth aspect, the semiconductor layer in the memory cell array part and the semiconductor layer in the peripheral circuit part are electrically isolated by the second isolation insulating film, thereby completely preventing the interference between the memory cell transistors and the peripheral circuit.

In the seventeenth aspect, the semiconductor layer in the memory cell array part and the semiconductor layer in the peripheral circuit part are electrically connected with each other. Therefore, when fixing the body potential of the memory cell transistors and the transistors of the peripheral circuit part, the body voltage generating circuit can be shared between the memory cell array part and the peripheral circuit part.

In the eighteenth aspect, by arranging such that the wiring of low resistance is connected via the plug to the impurity diffusion region, the resistance value of the bit lines can be lowered thereby to reduce the delay time of signal transmission in the bit lines.

In the nineteenth aspect, by connecting the wiring of low resistance to the word lines, the resistance value of the word lines can be lowered thereby to reduce the delay time of signal transmission in the word lines.

In the twentieth aspect, it is able to suppress the charge stored in the charge storing region from diffusing in the gate insulating film, thereby to suppresses the miniaturization of WINDOW caused by the repetitive operation of the memory cell transistors.

It is an object of the present invention to overcome the foregoing problems by providing a non-volatile semiconductor memory that can suppress or avoid disturb failure during erase operation, can suppress a reduction in operation speed of memory cell transistors due to high resistance of sub-bit lines, and can avoid malfunction of the memory cell transistors due to the miniaturization of WINDOW.

These and other objects, features, aspects and advantages of the present invention will become more apparent from the following detailed description of the present invention when taken in conjunction with the accompanying drawings.

BRIEF DESCRIPTION OF THE DRAWINGS

FIG. 17 is a top view schematically illustrating a non-volatile semiconductor memory structure according to a seventh modification of the first preferred embodiment;

FIG. 43 is a block diagram illustrating the overall configuration of a non-volatile semiconductor memory according to a fourth preferred embodiment;

FIGS. 46 to 53 are sectional views illustrating the steps in sequence in a method of forming an STI according to the first modification of the fifth preferred embodiment;

DESCRIPTION OF THE PREFERRED EMBODIMENTS

First Preferred Embodiment

Figure 1:
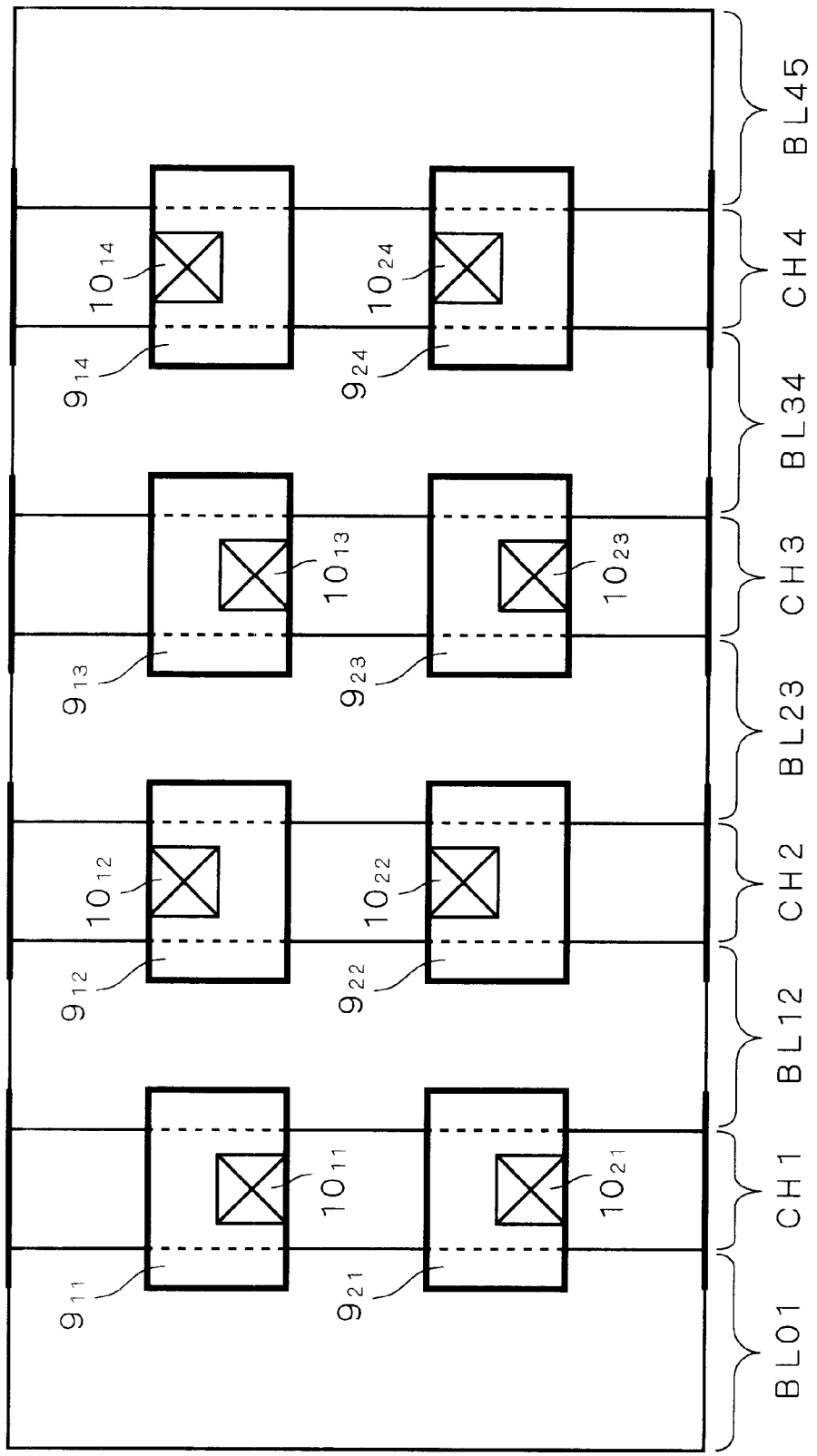
FIG. 1 is a top view schematically illustrating a non-volatile semiconductor memory structure according to a first preferred embodiment of the invention.

FIG. 1 is a top view schematically illustrating a non-volatile semiconductor memory structure according to a first preferred embodiment of the invention. The non-volatile semiconductor memory comprises a memory cell array part in which a plurality of memory cell transistors are disposed in the form of a matrix in a semiconductor substrate. In FIG. 1, the structure of the memory cell array part is partially shown and word lines are omitted therein. Bit lines BL (indicated by reference numerals BL01, BL12, BL23, BL34, BL45 in FIG. 1) extend in the column direction of the matrix.

Channel regions CH (indicated by reference numerals CH1 to CH4 in FIG. 1) are disposed between adjacent bit lines BL and extend in the column direction. Gate electrodes 9 (indicated by reference numerals $9_{11}$ to $9_{14}$, $9_{21}$ to $9_{24}$ in FIG. 1) overlie the channel regions CH. The gate electrodes $9_{11}$ to $9_{14}$ and the gate electrodes $9_{21}$ to $9_{24}$ are respectively gate electrodes of memory cell transistors that belong to the same row of the matrix. The gate electrodes $9_{11}$ to $9_{14}$ and the gate electrodes $9_{21}$ to $9_{24}$ are arranged linearly in the row direction of the matrix.

The non-volatile semiconductor memory of the first preferred embodiment comprises plugs 10 (indicated by reference numerals $10_{11}$ to $10_{14}$, $10_{21}$ to $10_{24}$ in FIG. 1) which provide a connection between the gate electrodes 9 and the word lines. The plugs $10_{11}$, $10_{13}$, $10_{21}$ and $10_{23}$ are brought into contact with one side of the gate electrodes 9 (the lower side as viewed in FIG. 1) so as to make contact with the gate electrodes $9_{11}$, $9_{13}$, $9_{21}$, and $9_{23}$, respectively. The plugs $10_{12}$, $10_{14}$, $10_{22}$ and $10_{24}$ are brought into contact with the other side of the gate electrodes 9 (the upper side as viewed in FIG. 1) so as to make contact with the gate electrodes $9_{12}$, $9_{14}$, $9_{22}$, and $9_{24}$, respectively.

Figure 2:
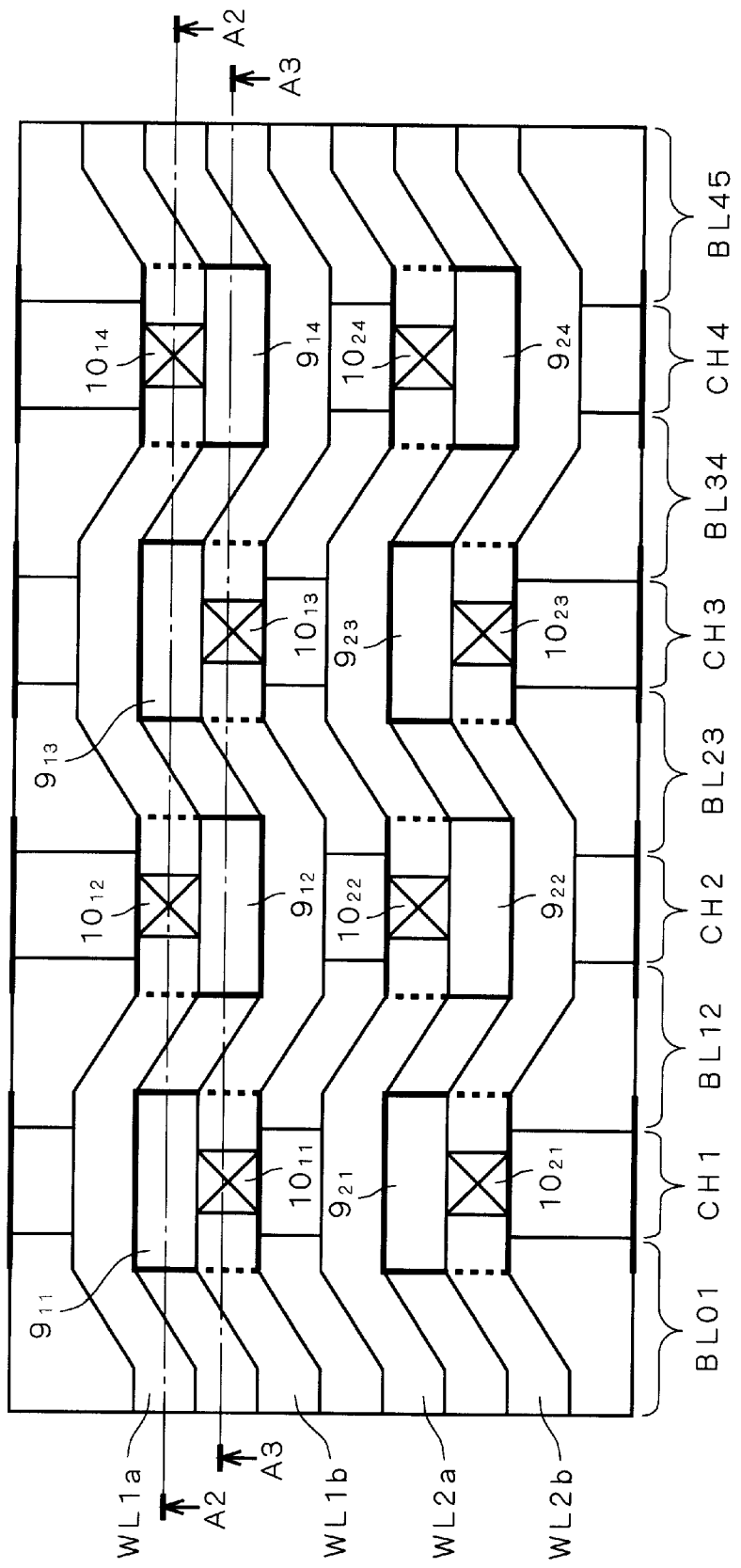
FIG. 2 is a top view obtained by adding word lines to the structure of FIG. 1.

FIG. 2 is a top view obtained by adding word lines to the structure of FIG. 1. The word line in each row of the matrix has two sub-word lines WL (indicated by reference numerals WL1a, WL1b, WL2a, WL2b in FIG. 2). The sub-word lines WL snake and extend in the row direction. The sub-word lines WL1a, WL1b and the sub-word lines WL2a, WL2b belong to an identical row of the matrix. Specifically, the sub-word lines WL1a, WL1b and the gate electrodes $9_{11}$ to $9_{14}$ belong to the same row of the matrix, and the sub-word lines WL2a, WL2b and the gate electrodes $9_{21}$ to $9_{24}$ belong to the same row of the matrix. The sub-word line WL1a is in contact with the plugs $10_{12}$ and $10_{14}$. The sub-word line WL1b is in contact with the plugs $10_{11}$ and $10_{13}$. The sub-word line WL2a is in contact with the plugs $10_{22}$ and $10_{24}$. The sub-word line WL2b is in contact with the plugs $10_{21}$ and $10_{23}$.

Figure 3:
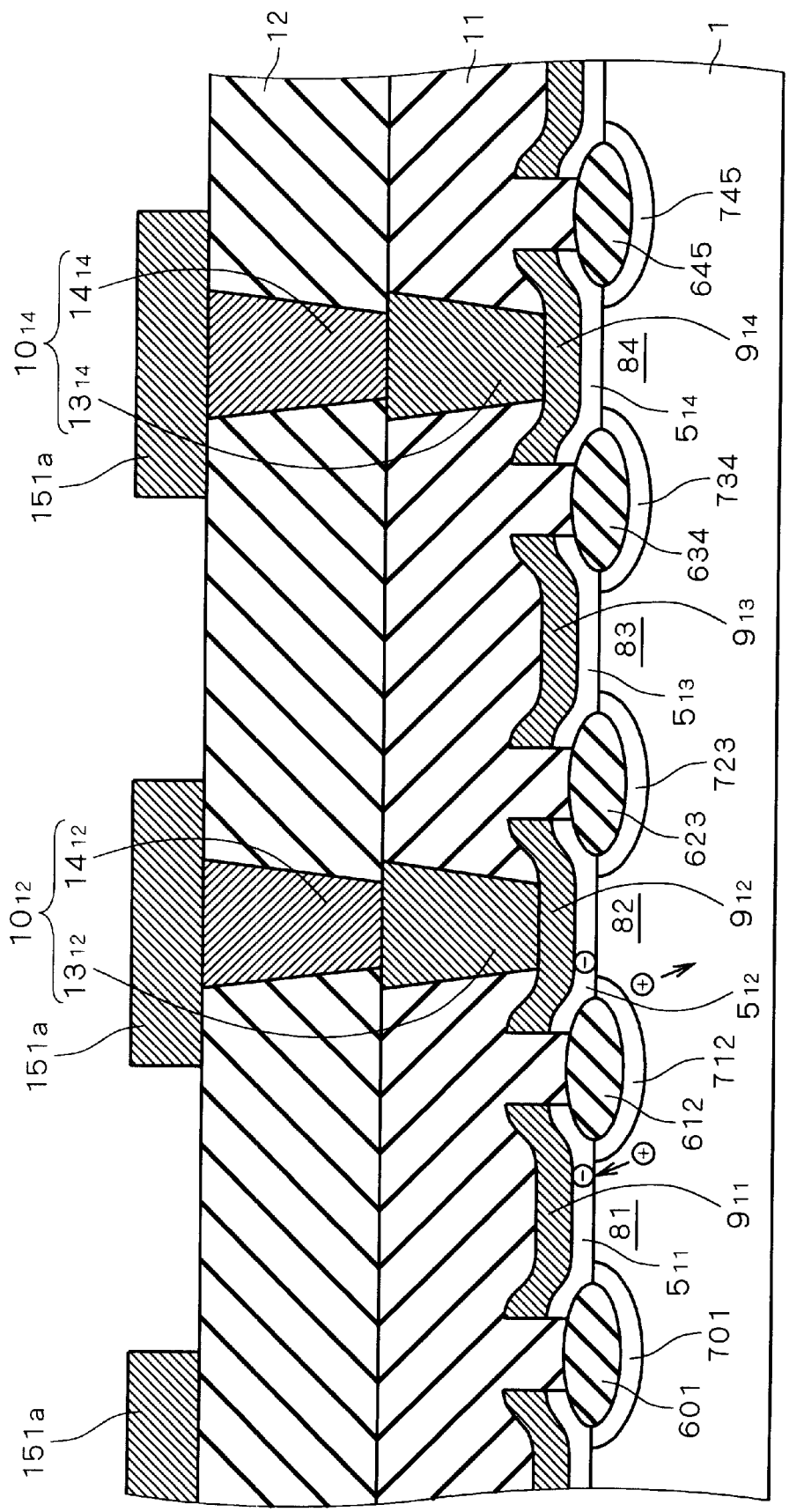
FIG. 3 is a sectional view of a cross-sectional structure taken along the line A2—A2 in FIG. 2.

FIG. 3 is a sectional view illustrating a cross-sectional structure taken along the line A2—A2 in FIG. 2. An isolation insulating film 6 of LOCOS type (indicated by reference numerals 601, 612, 623, 634 and 645 in FIG. 3) for defining an element-forming region is selectively formed in the upper surface of a silicon substrate 1. N$^+$ type impurity diffusion regions 7 (indicated by reference numerals 701, 712, 723, 734, 745 in FIG. 3) are formed in the interfacial portion between the silicon substrate 1 and the isolation insulating film 6. The impurity diffusion regions 701, 712, 723, 734 and 745 correspond to the bit lines BL01, BL12, BL23, BL34 and BL45 in FIGS. 1 and 2, respectively. The impurity diffusion regions 7 function as the source/drain regions of the memory cell transistors.

P-type channel regions 8 (indicated by reference numerals 81 to 84 in FIG. 3) are disposed in the upper surface of the silicon substrate 1 in the element forming region. The channel regions 81 to 84 correspond to the channel regions CH1 to CH4 in FIGS. 1 and 2, respectively.

ONO films 5 (indicated by reference numerals $5_{11}$ to $5_{14}$ in FIG. 3) are disposed on the upper surface of the silicon substrate 1 in the element forming region. The ONO films 5 extend to the end portion of the isolation insulating film 6. The ONO films 5 have a three-layer structure that a silicon oxide film, a silicon nitride film and a silicon oxide film are formed in this order on the silicon substrate 1. In place of the silicon nitride film, a silicon oxide nitride film (SiON) may be formed. The ONO films 5 function as the gate insulating film of the memory cell transistors.

An interlayer insulating film 11 is formed on the entire surface so as to cover the memory cell transistors. An interlayer insulating film 12 is formed on the entire surface of the interlayer insulating film 11. A metal wiring 151a is formed on the interlayer insulating film 12. The metal wiring 151a corresponds to the sub-word line WL1a in FIG. 2. The metal wiring 151a is connected to the gate electrodes $9_{12}$ and $9_{14}$ via plugs 14 disposed in the interlayer insulating film 12 (indicated by reference numerals $14_{12}$ and $14_{14}$ in FIG. 3) and plugs 13 disposed in the interlayer insulating film 11 (indicated by reference numerals $13_{12}$ and $13_{14}$ in FIG. 3). The plug $13_{12}$ and plug $14_{12}$ correspond to the plug $10_{12}$ in FIGS. 1 and 2. The plug $13_{14}$ and plug $14_{14}$ correspond to the plug $10_{14}$ in FIGS. 1 and 2.

Figure 4:
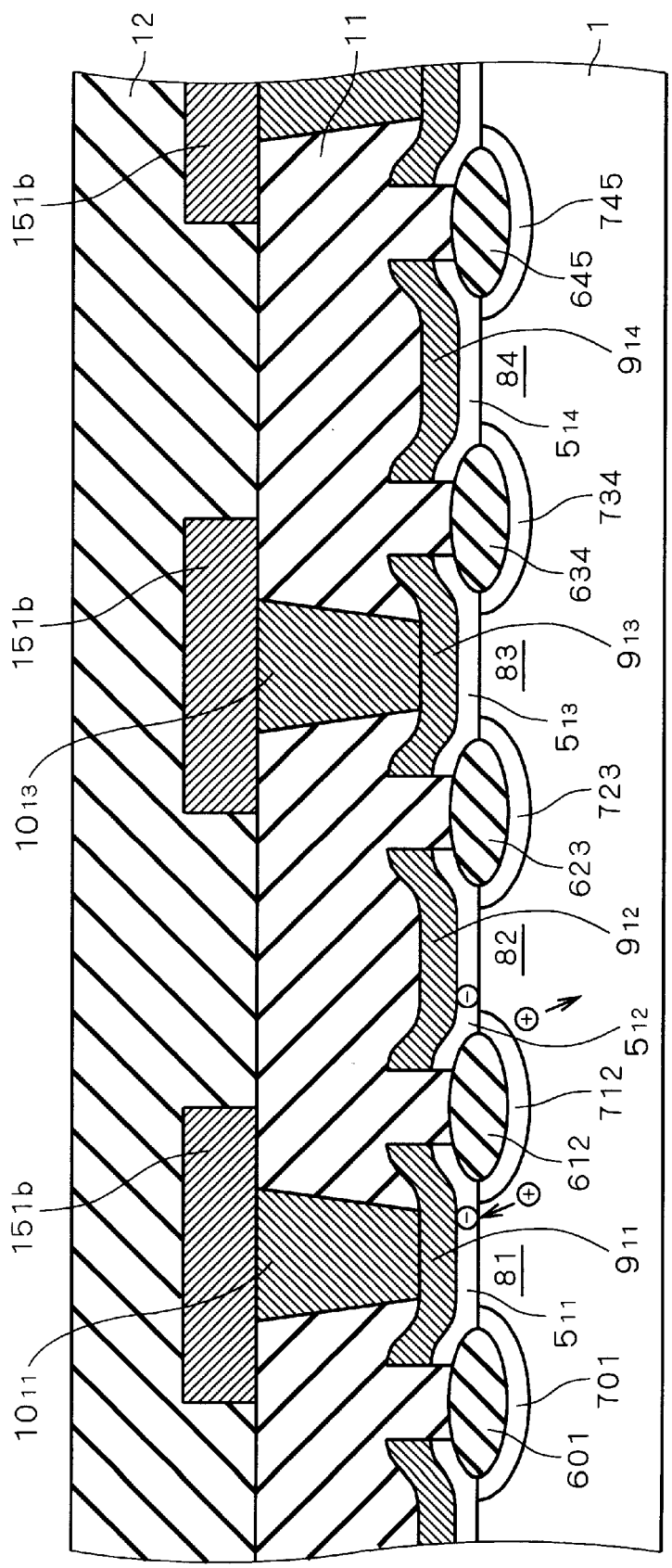
FIG. 4 is a sectional view illustrating a cross-sectional structure taken along the line A3—A3 in FIG. 2.

FIG. 4 is a sectional view illustrating a cross-sectional structure taken along the line A3—A3 in FIG. 2. A metal wiring 151b is formed on the interlayer insulating film 11. The metal wiring 151b corresponds to the sub-word line WL1b in FIG. 2. The metal wiring 151b is connected to the gate electrodes $9_{11}$ and $9_{13}$ via the plugs $10_{11}$ and $10_{13}$ disposed in the interlayer insulating film 11.

The material of the metal wirings 151a and 151b is, for example, W, Al, Cu, AlSi, Ag, Au, Mo, or Zr. Therefore, the metal wirings 151a and 151b have a lower resistance than the wiring of polycide structure, for example. The material of the plugs 10, 13 and 14 is, for example, W, Cu, Ag, Au, Al, metal silicide, or doped polysilicon.

Although the foregoing description has been made of the case that the word line of each row of the matrix has two sub-word lines WL, the number of sub-word lines may be three or more.

Although the foregoing description has been made of the case that the LOCOS type isolation insulating film 6 is disposed, an isolation insulating film 6 of STI (shallow trench isolation) type may be disposed.

Although the foregoing description has been made of the case that the metal wiring 151a and the metal wiring 151b are formed as the wiring of different wiring layers, both metal wirings may be formed as the wiring of the same wiring layer, if only they are electrically isolated form each other.

Thus, with the non-volatile semiconductor memory of the first preferred embodiment, the word line of each row of the matrix in the memory cell array has a plurality of sub-word lines WL, and the gate electrodes 9 of the memory cell transistors adjacent each other in the row direction are connected to different sub-word lines WL. Therefore, different voltages can be individually applied to the gate electrodes 9 adjacent each other in the row direction.

Referring to FIGS. 3 and 4, consider now the case of erasing the stored contents of the Bit R of the memory cell transistor having the gate electrode $9_{11}$. In this case, a voltage of −6 V is applied to the metal wiring 151b corresponding to the sub-word line WL1b, a voltage of 0 V is applied to the impurity diffusion region 701 corresponding to the bit line BL01, and a voltage of 4 V is applied to the impurity diffusion region 712 corresponding to the bit line BL12. At this time, applying a voltage of 0 V to the metal wiring 151a corresponding to the sub-word line WL1a, enables avoiding the occurrence of disturb failure which has been a problem in the conventional non-volatile semiconductor memory. Since the voltage of 0 V is applied to the gate electrode $9_{12}$, hot holes inducted in the silicon substrate 1 flow to the silicon substrate 1, without being introduced into the ONO film $5_{12}$.

Figure 5:
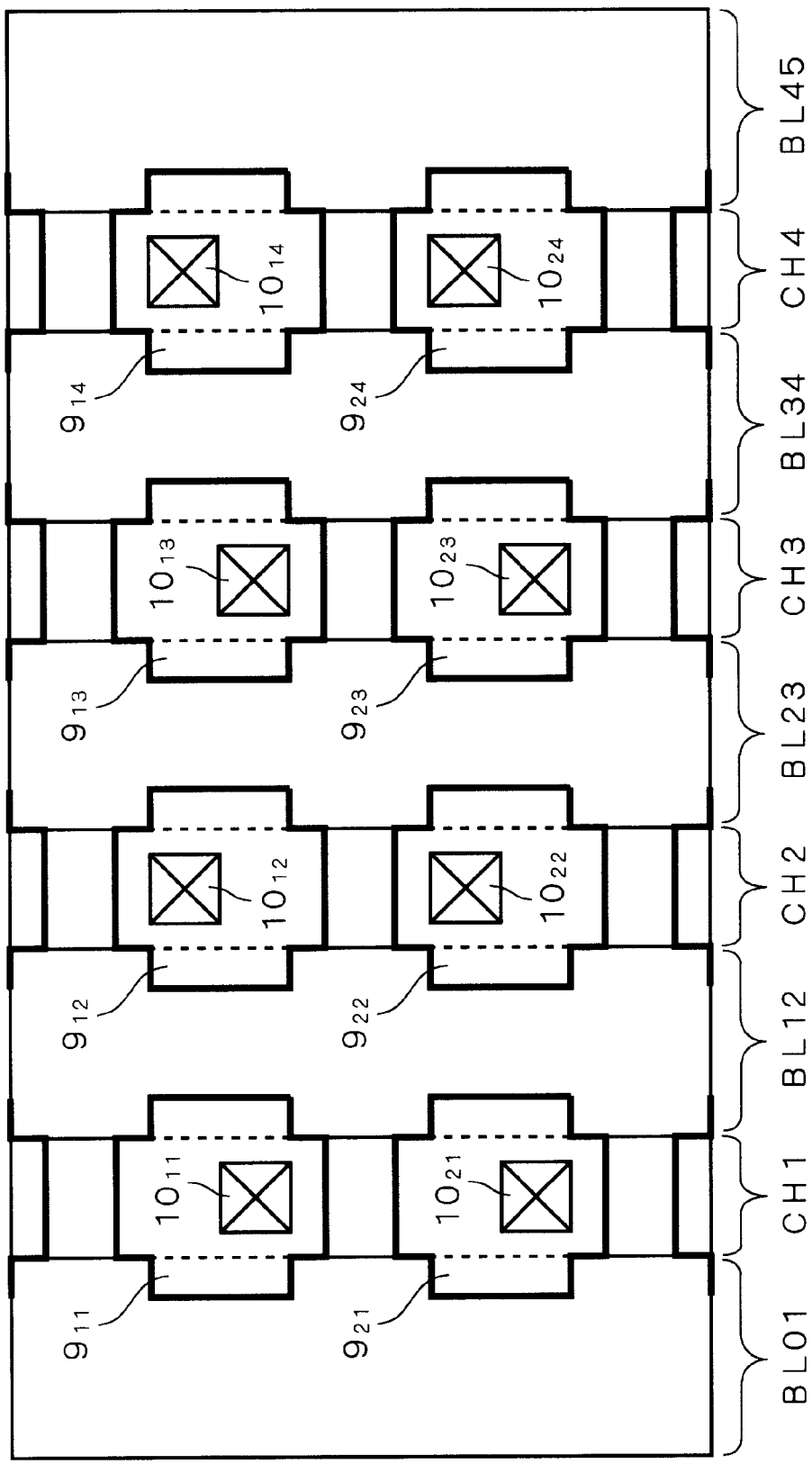
FIG. 5 is a top view schematically illustrating a non-volatile semiconductor memory structure according to a first modification of the first preferred embodiment.
Figure 6:
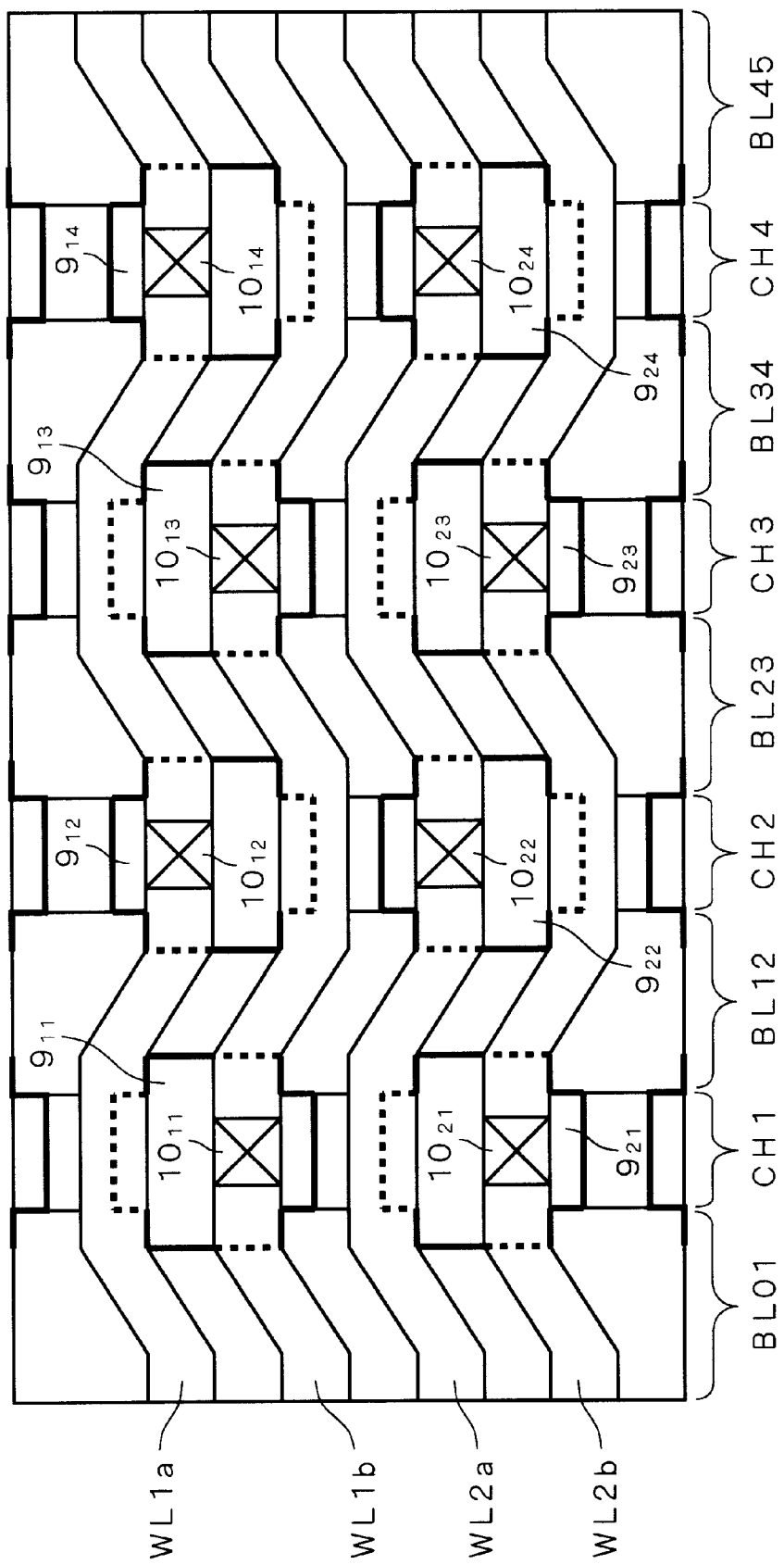
FIG. 6 is a top view obtained by adding word lines to the structure of FIG. 5.

FIG. 5 is a corresponding top view of FIG. 1, schematically illustrating a non-volatile semiconductor memory structure according to a first modification of the first preferred embodiment. The gate width of the central portions of the gate electrodes 9 making contact with plugs 10 are larger than the gate width of the end portions of the gate electrodes 9 overlying bit lines BL. That is, the gate electrodes 9 have such a top face of substantially +-shape that a wide portion is formed at the contact portions with the plugs 10. Gate electrodes $9_{11}$ to $9_{14}$ and gate electrodes $9_{21}$ to $9_{24}$ are arranged linearly in the row direction. The plugs 10 are in the proximity to one side or the other side of the gate electrodes 9 and brought into contact therewith. FIG. 6 is a top view obtained by adding word lines to the structure of FIG. 5. Sub-word lines WL snake and extend in the row direction. The non-volatile semiconductor memory of the first modification in the first preferred embodiment can provide the effect of increasing mask alignment offset margin when the plugs 10 are formed in interlayer insulating films 11 and 12 aligned with the gate electrodes 9.

Figure 7:
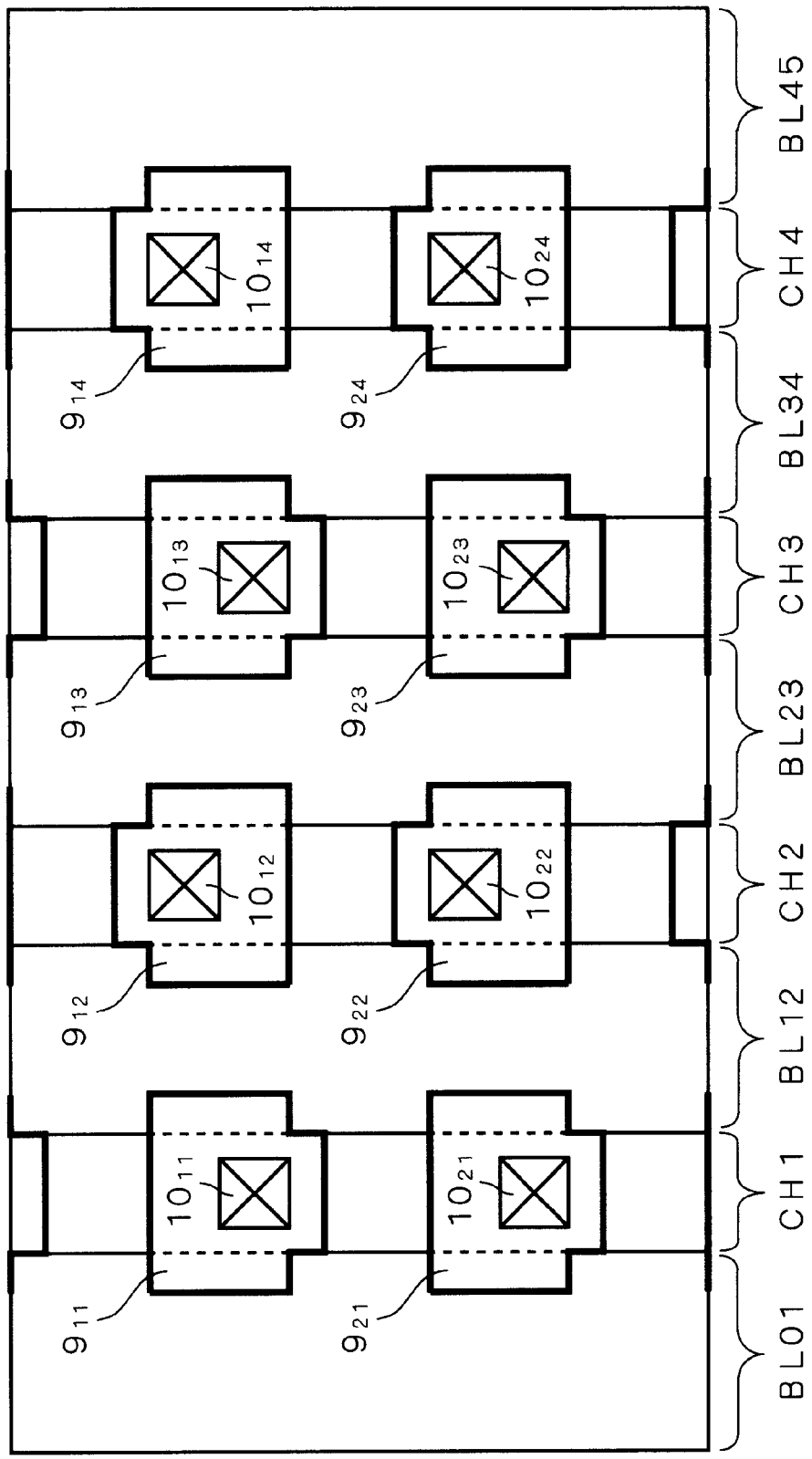
FIG. 7 is a top view schematically illustrating a non-volatile semiconductor memory structure according to a second modification of the first preferred embodiment.
Figure 8:
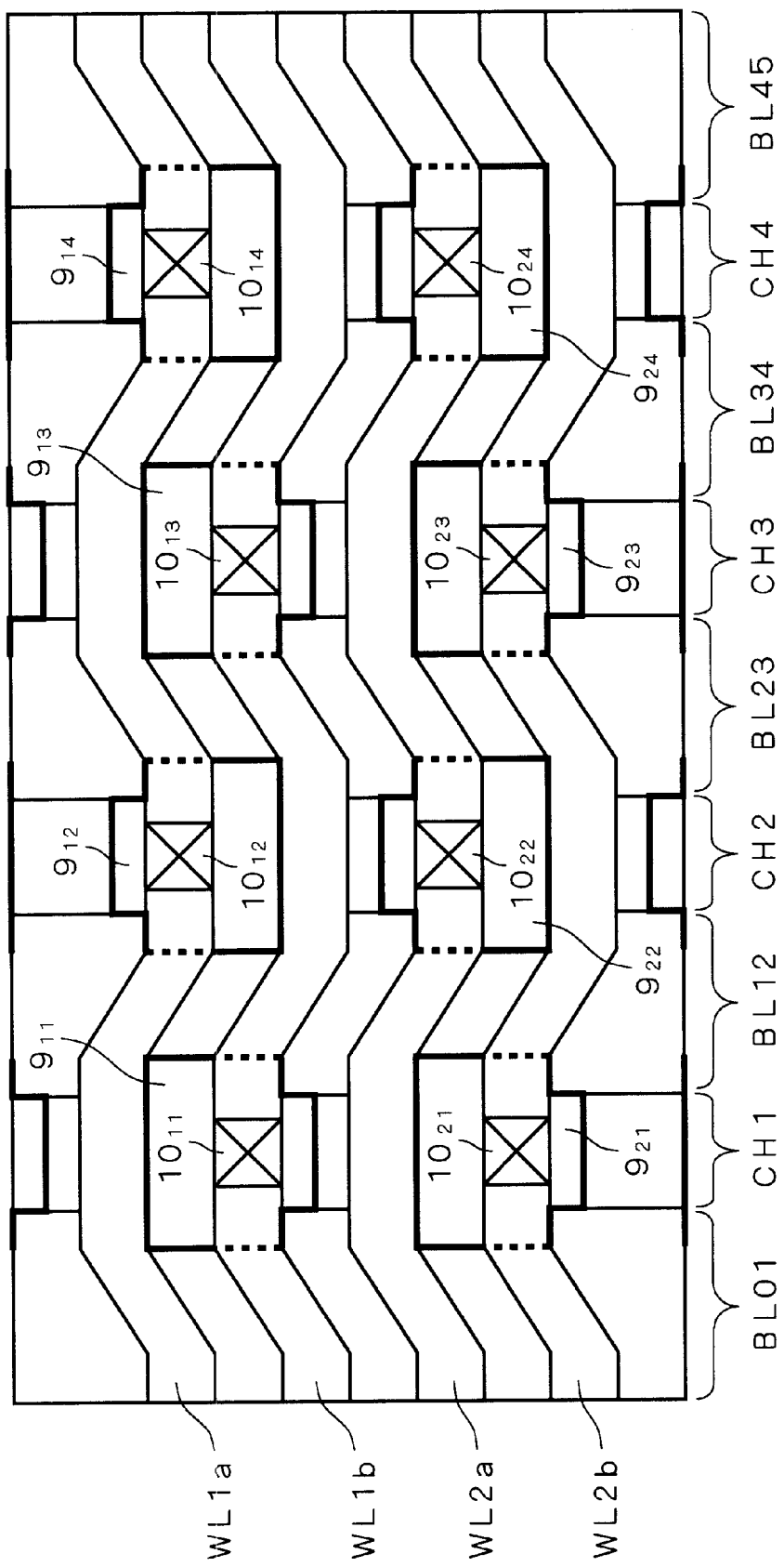
FIG. 8 is a top view obtained by adding word lines to the structure of FIG. 7.

FIG. 7 is a corresponding top view of FIG. 1, schematically illustrating a non-volatile semiconductor memory structure according to a second modification of the first preferred embodiment. Gate electrodes 9 have such a top face of substantially T-shape that a wide portion is formed at the contact portions with the plugs 10. Gate electrodes $9_{11}$ to $9_{14}$ and gate electrodes $9_{21}$ to $9_{24}$ are arranged linearly in the row direction. The plugs 10 are in the proximity to one side or the other side of the gate electrodes 9 and brought into contact therewith. FIG. 8 is a top view obtained by adding word lines to the structure of FIG. 7. Sub-word lines WL snake and extend in the row direction. The non-volatile semiconductor memory of the second modification in the first preferred embodiment can provide the effect of increasing mask alignment offset margin when the plugs 10 are formed in interlayer insulating films 11 and 12 aligned with the gate electrodes 9.

Figure 9:
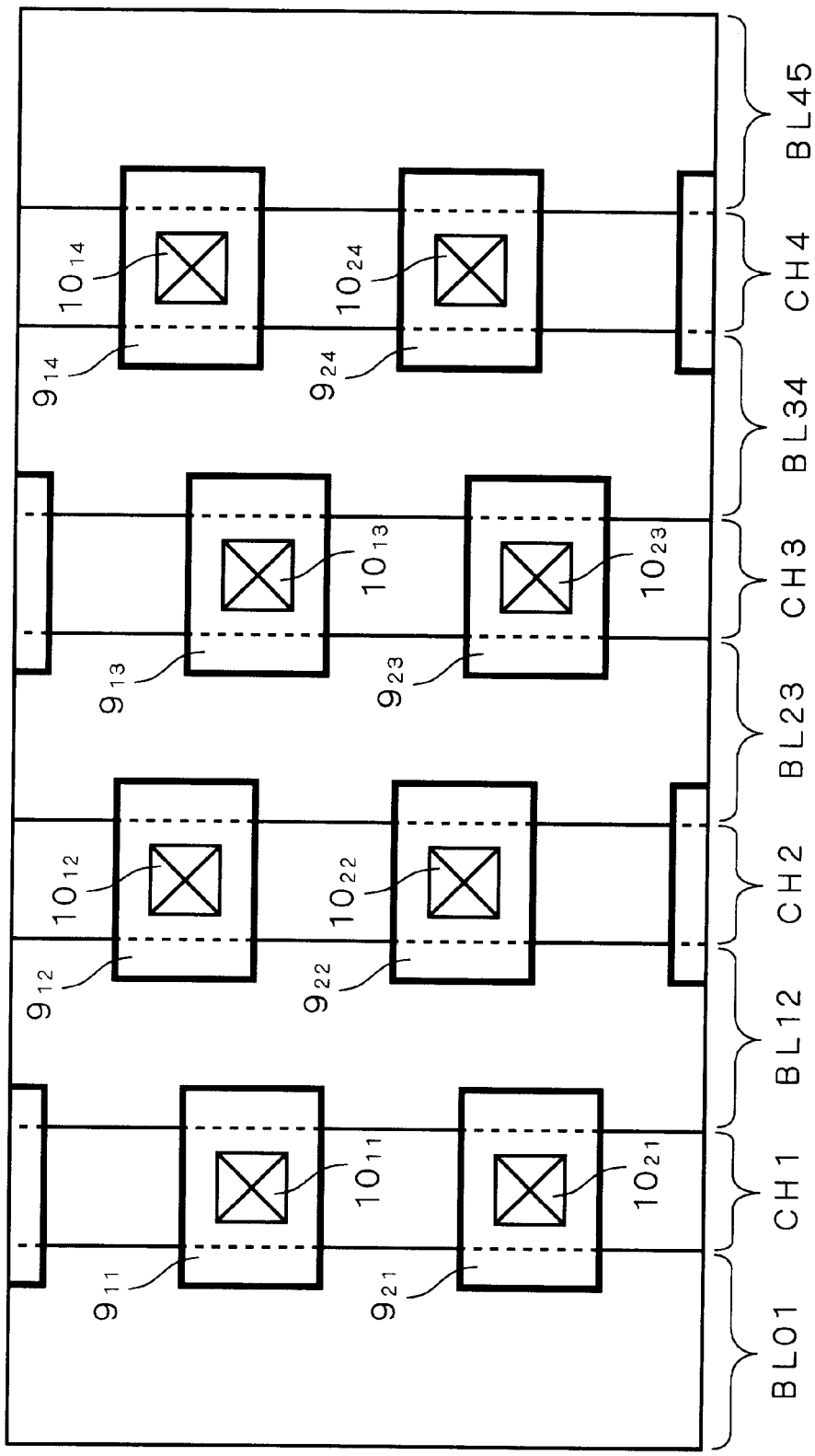
FIG. 9 is a top view schematically illustrating a non-volatile semiconductor memory structure according to a third modification of the first preferred embodiment.
Figure 10:
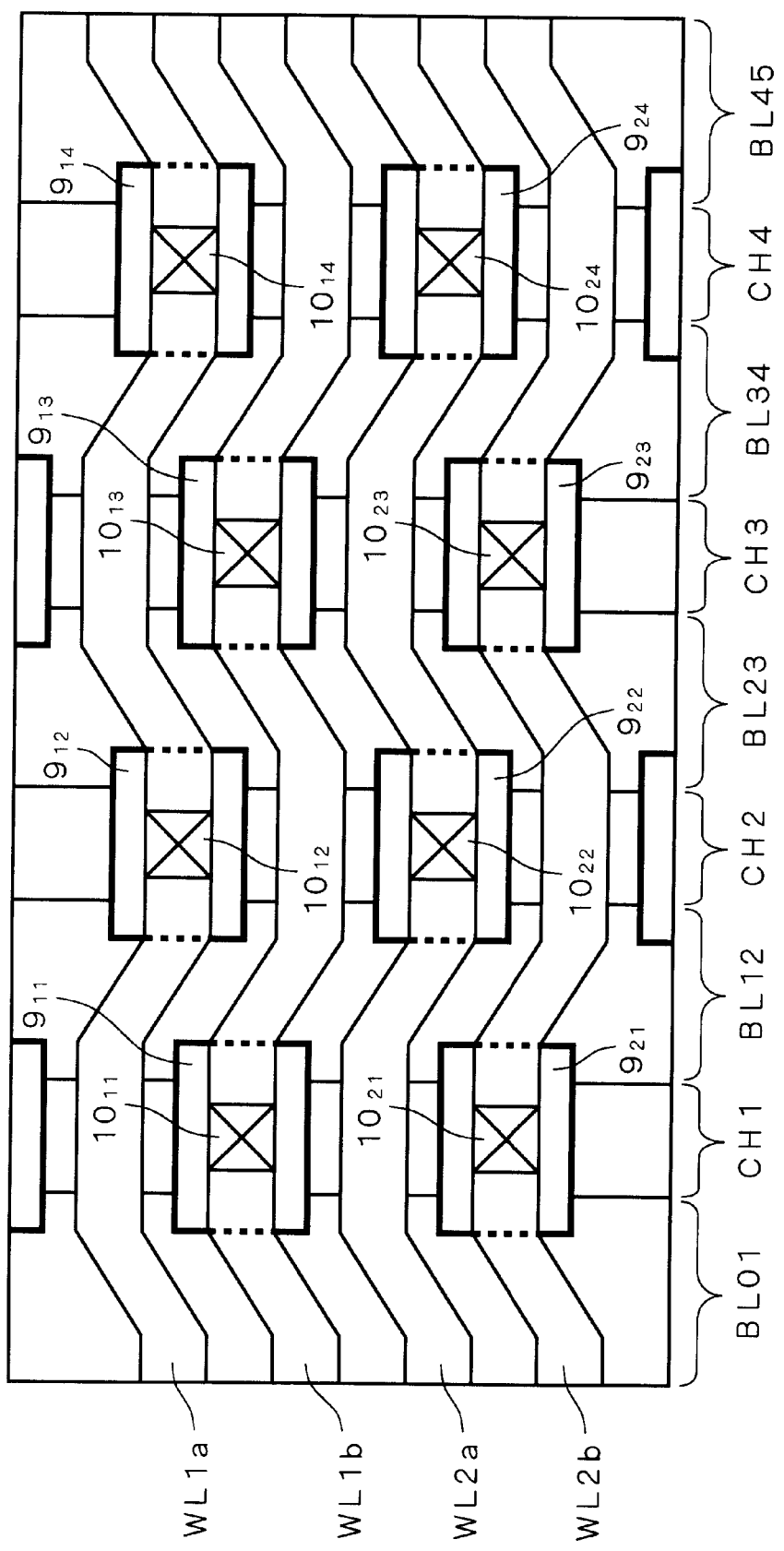
FIG. 10 is a top view obtained by adding word lines to the structure of FIG. 9.

FIG. 9 is a corresponding top view of FIG. 1, schematically illustrating a non-volatile semiconductor memory structure according to a third modification of the first preferred embodiment. Gate electrodes $9_{11}$ and $9_{13}$ are offset 0.5 F in the column direction with respect to gate electrodes $9_{12}$ and $9_{14}$. Gate electrodes $9_{21}$ and $9_{23}$ are offset 0.5 F in the column direction with respect to gate electrodes $9_{22}$ and $9_{24}$. Plugs 10 are brought into contact with the central portions of the gate electrodes 9. FIG. 10 is a top view obtained by adding word lines to the structure of FIG. 9. Sub-word lines WL snake and extend in the row direction. The non-volatile semiconductor memory of the third modification in the first preferred embodiment can provide the effect of increasing mask alignment offset margin when the plugs 10 are disposed in interlayer insulating films 11 and 12 aligned with the gate electrodes 9.

Figure 11:
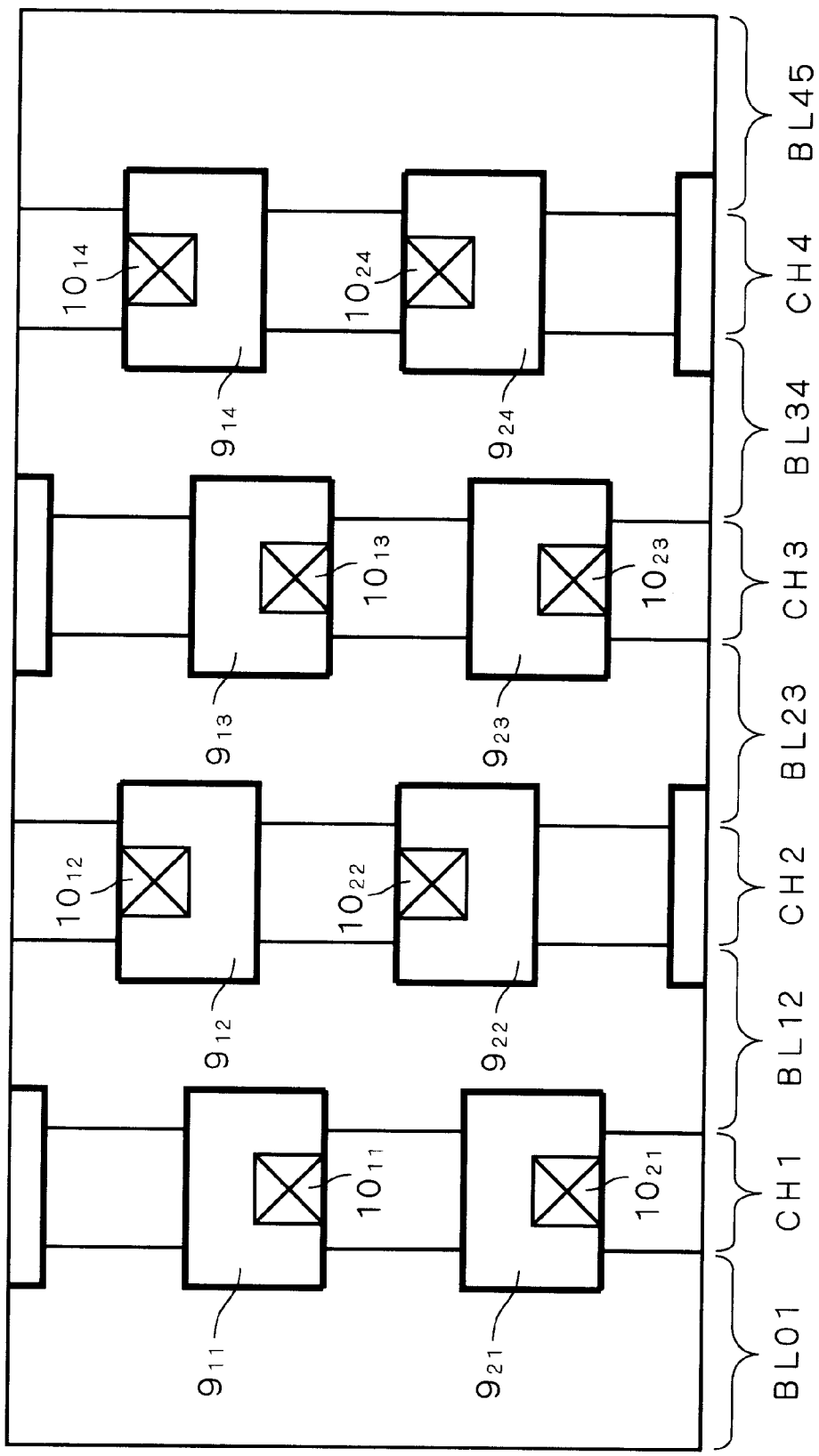
FIG. 11 is a top view schematically illustrating a non-volatile semiconductor memory structure according to a fourth modification of the first preferred embodiment.

FIG. 11 is a corresponding top view of FIG. 1, schematically illustrating a non-volatile semiconductor memory structure according to a fourth modification of the first preferred embodiment. Gate electrodes $9_{11}$ and $9_{13}$ are offset 0.5 F in the column direction with respect to gate electrodes $9_{12}$ and $9_{14}$. Gate electrodes $9_{21}$ and $9_{23}$ are offset 0.5 F in the column direction respect to gate electrodes $9_{22}$ and $9_{24}$.

Figure 12:
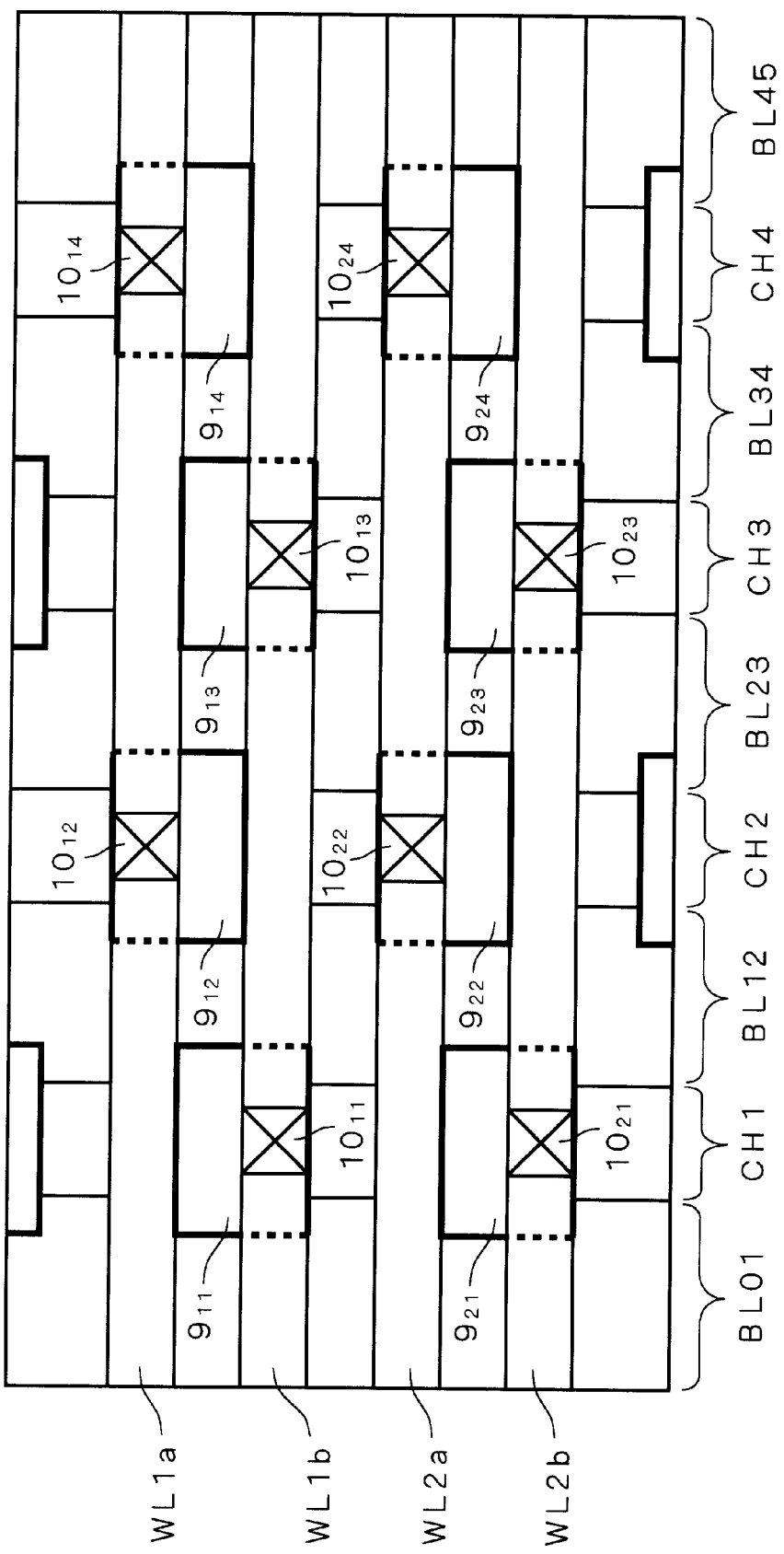
FIG. 12 is a top view obtained by adding word lines to the structure of FIG. 11.

FIG. 12 is a top view obtained by adding word lines to the structure of FIG. 11. Sub-word lines WL extend linearly in the row direction. With the non-volatile semiconductor memory of the fourth modification in the first preferred embodiment, the linearly extending sub-word lines WL have a shorter wiring length than the snaking sub-word lines WL. This provides the effect of reducing the delay time of signal transmission in the sub-word lines WL. This also provides the effect of reducing variations in finished shape when a metal film is patterned to form the sub-word lines WL.

Figure 13:
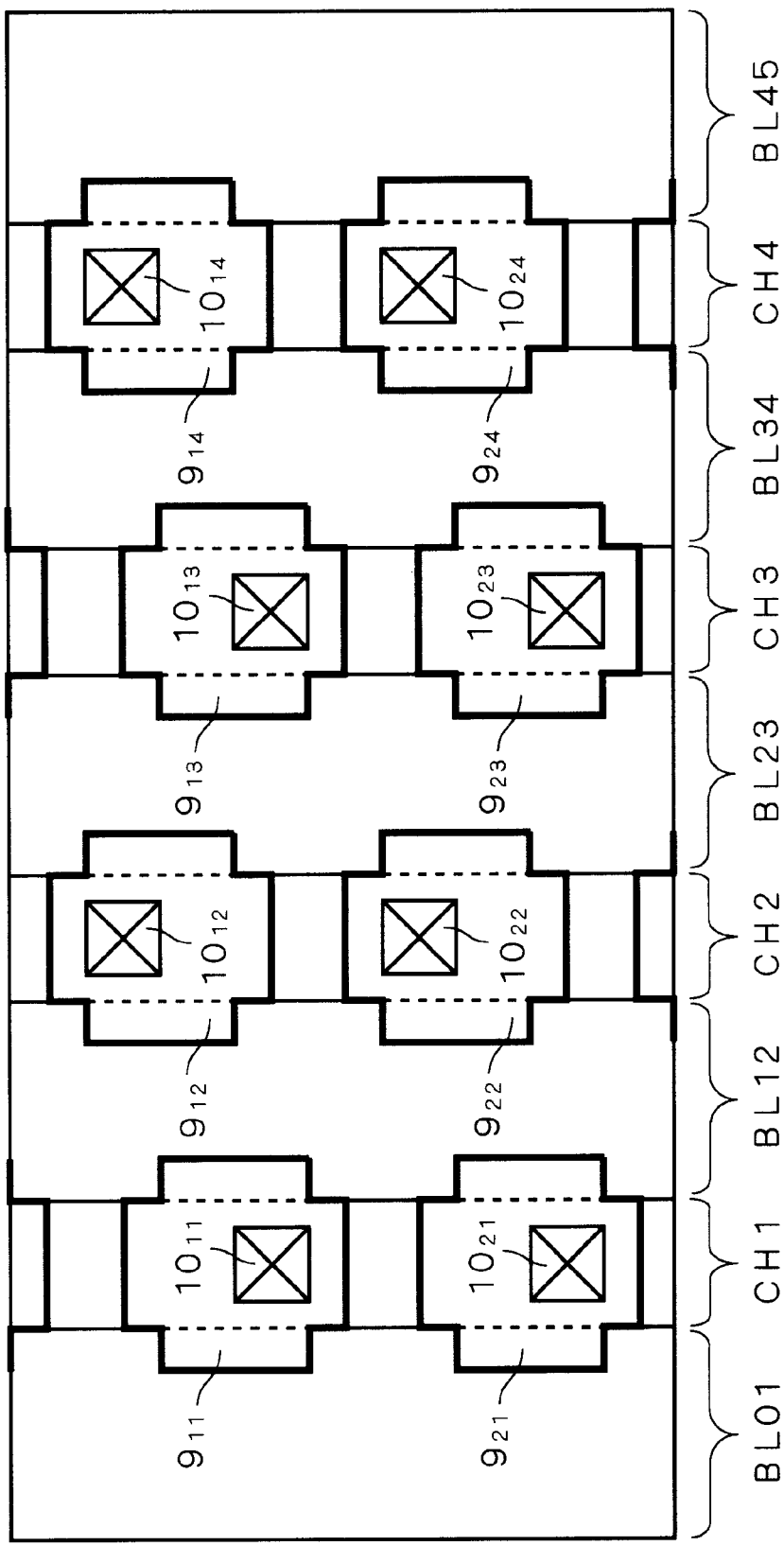
FIG. 13 is a top view schematically illustrating a non-volatile semiconductor memory structure according to a fifth modification of the first preferred embodiment.
Figure 14:
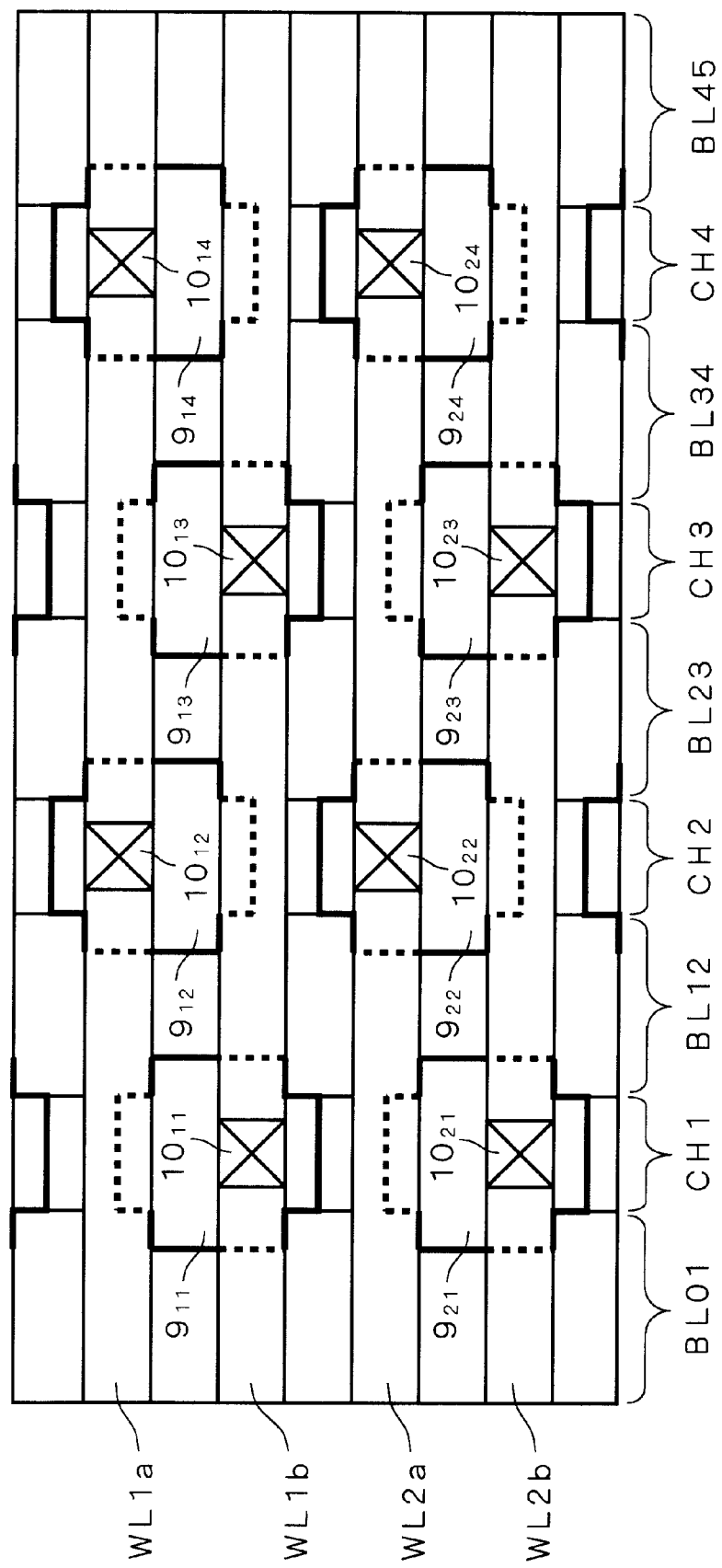
FIG. 14 is a top view obtained by adding word lines to the structure of FIG. 13.

FIG. 13 is a corresponding top view of FIG. 1, schematically illustrating a non-volatile semiconductor memory structure according to a fifth modification of the first preferred embodiment. Gate electrodes $9_{11}$ and $9_{13}$ are offset 0.5 F in the column direction with respect to gate electrodes $9_{12}$ and $9_{14}$. Gate electrodes $9_{21}$ and $9_{23}$ are offset 0.5 F in the column direction with respect to gate electrodes $9_{22}$ and $9_{24}$. The gate electrodes 9 have such a top face of substantially +-shape that a wide portion is formed at the contact portions with the plugs 10. The plugs 10 are in the proximity to one side or the other side of the gate electrodes 9 and brought into contact therewith. FIG. 14 is a top view obtained by adding word lines to the structure of FIG. 13. Sub-word lines WL extend linearly in the row direction. The non-volatile semiconductor memory of the fifth modification in the first preferred embodiment can provide the effect of increasing mask alignment offset margin in forming the plugs 10, and the effect of reducing the delay time of signal transmission in the sub-word lines WL.

Figure 15:
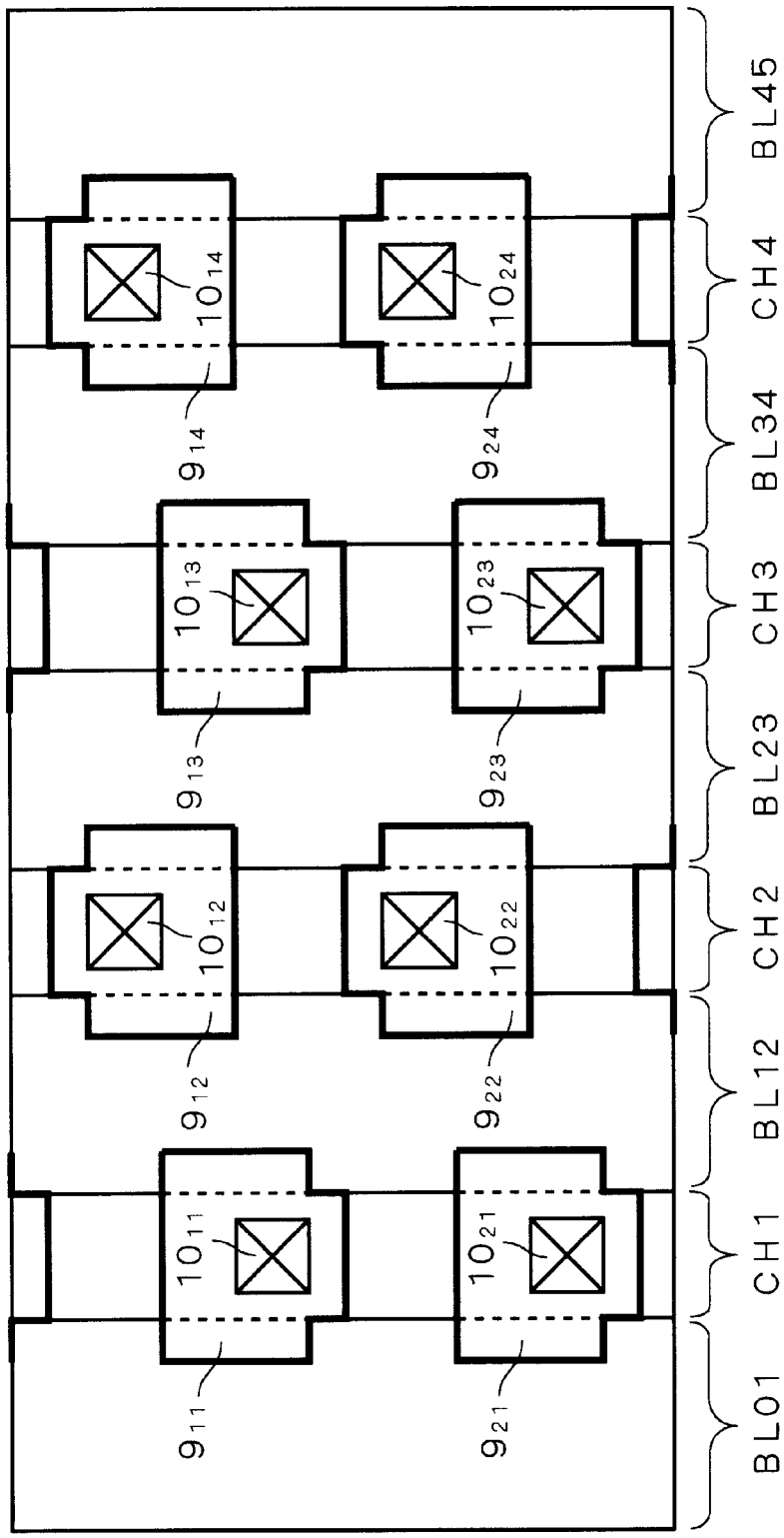
FIG. 15 is a top view schematically illustrating a non-volatile semiconductor memory structure according to a sixth modification of the first preferred embodiment.
Figure 16:
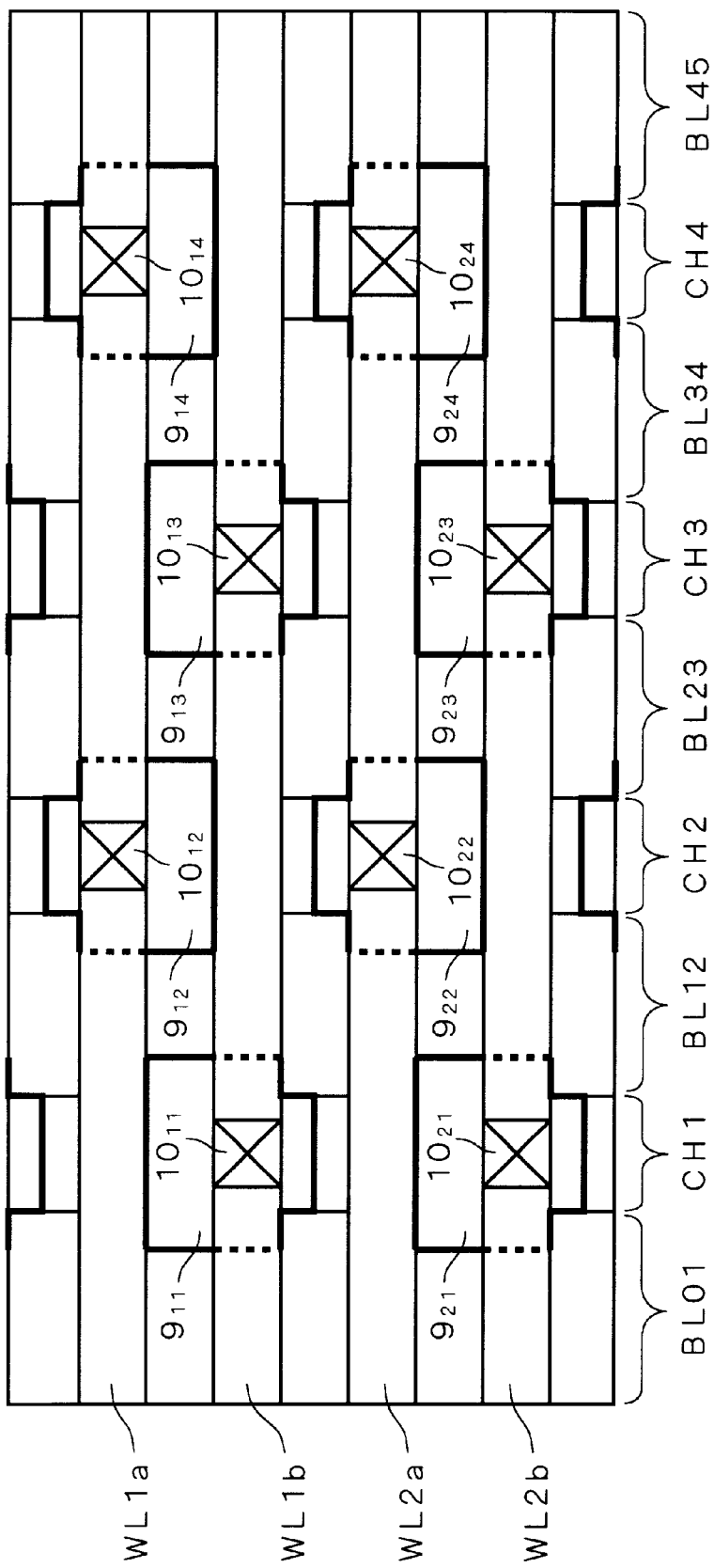
FIG. 16 is a top view obtained by adding word lines to the structure of FIG. 15.

FIG. 15 is a corresponding top view of FIG. 1, schematically illustrating a non-volatile semiconductor memory structure according to a sixth modification of the first preferred embodiment. Gate electrodes $9_{11}$ and $9_{13}$ are offset 0.5 F in the column direction with respect to gate electrodes $9_{12}$ and $9_{14}$. Gate electrodes $9_{21}$ and $9_{23}$ are offset 0.5 F in the column direction with respect to gate electrodes $9_{22}$ and $9_{24}$. The gate electrodes 9 have such a top face of substantially T-shape that a wide portion is formed at the contact portions with the plugs 10. The plugs 10 are in the proximity to one side or the other side of the gate electrodes 9 and brought into contact therewith. FIG. 16 is a top view obtained by adding word lines to the structure of FIG. 15. Sub-word lines WL extend linearly in the row direction. The non-volatile semiconductor memory of the sixth modification in the first preferred embodiment can provide the effect of increasing mask alignment offset margin in forming the plugs 10, and the effect of reducing the delay time of signal transmission in the sub-word lines WL.

Figure 18:
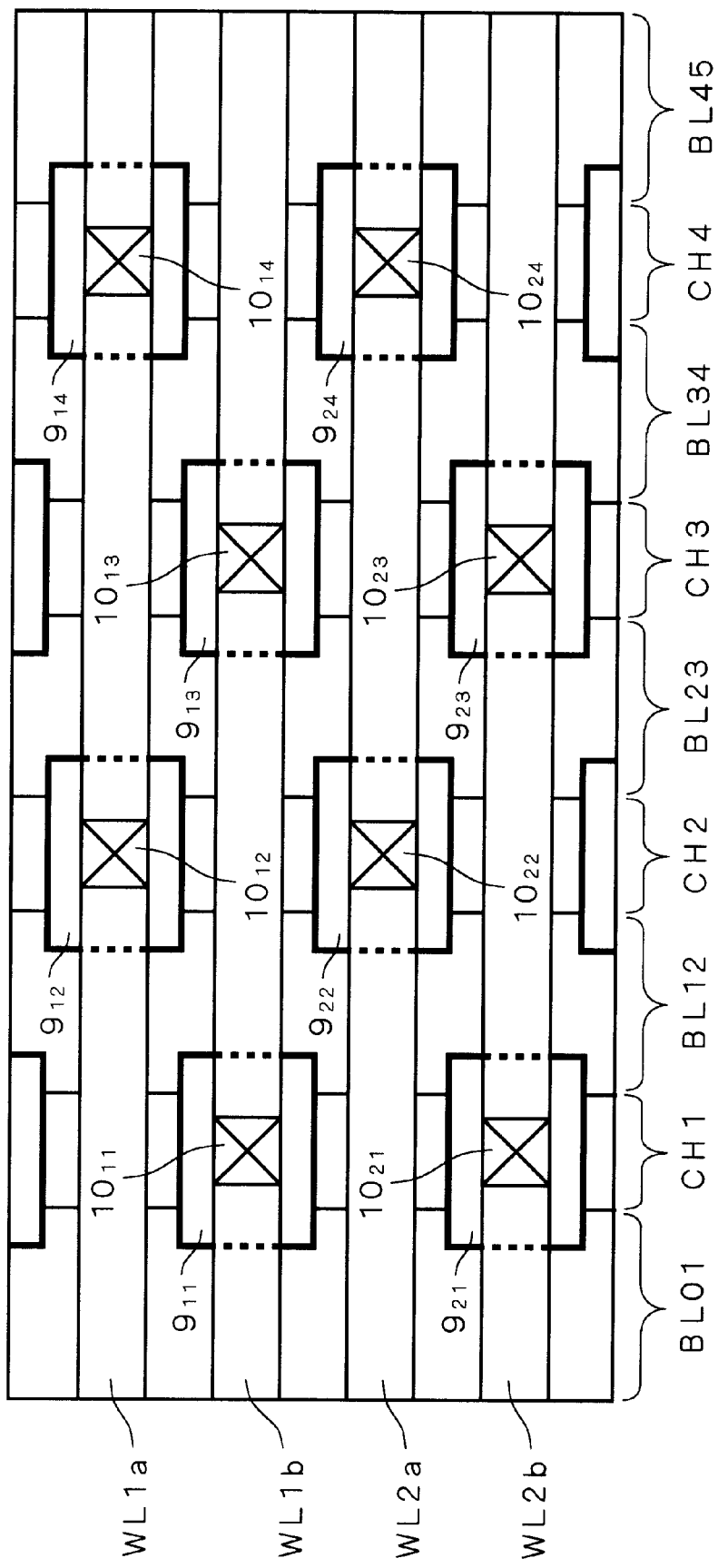
FIG. 18 is a top view obtained by adding word lines to the structure of FIG. 17.

FIG. 17 is a corresponding top view of FIG. 1, schematically illustrating a non-volatile semiconductor memory structure according to a seventh modification of the first preferred embodiment. Gate electrodes $9_{11}$ and $9_{13}$ are offset 1 F in the column direction with respect to gate electrodes $9_{12}$ and $9_{14}$. Gate electrodes $9_{21}$ and $9_{23}$ are offset 1 F in the column direction with respect to gate electrodes $9_{22}$ and $9_{24}$. Plugs 10 are brought into contact with the central portions of the gate electrodes 9. FIG. 18 is a top view obtained by adding word lines to the structure of FIG. 17. Sub-word lines WL extend linearly in the row direction. The non-volatile semiconductor memory of the seventh modification in the first preferred embodiment can provide the effect of increasing mask alignment offset margin in forming the plugs 10, and the effect of reducing the delay time of signal transmission in the sub-word lines WL.

Figure 19:
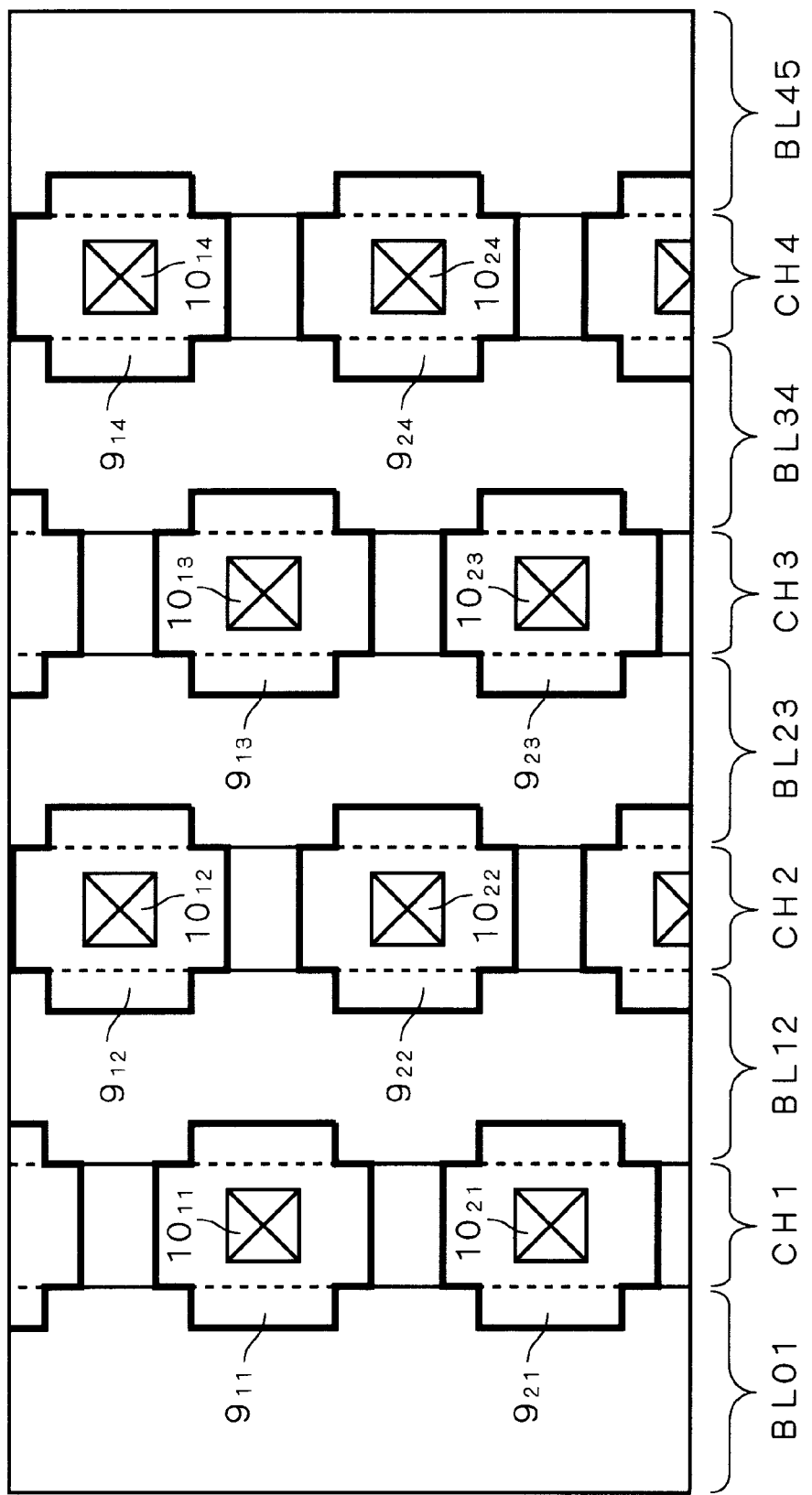
FIG. 19 is a top view schematically illustrating a non-volatile semiconductor memory structure according to an eighth modification of the first preferred embodiment.
Figure 20:
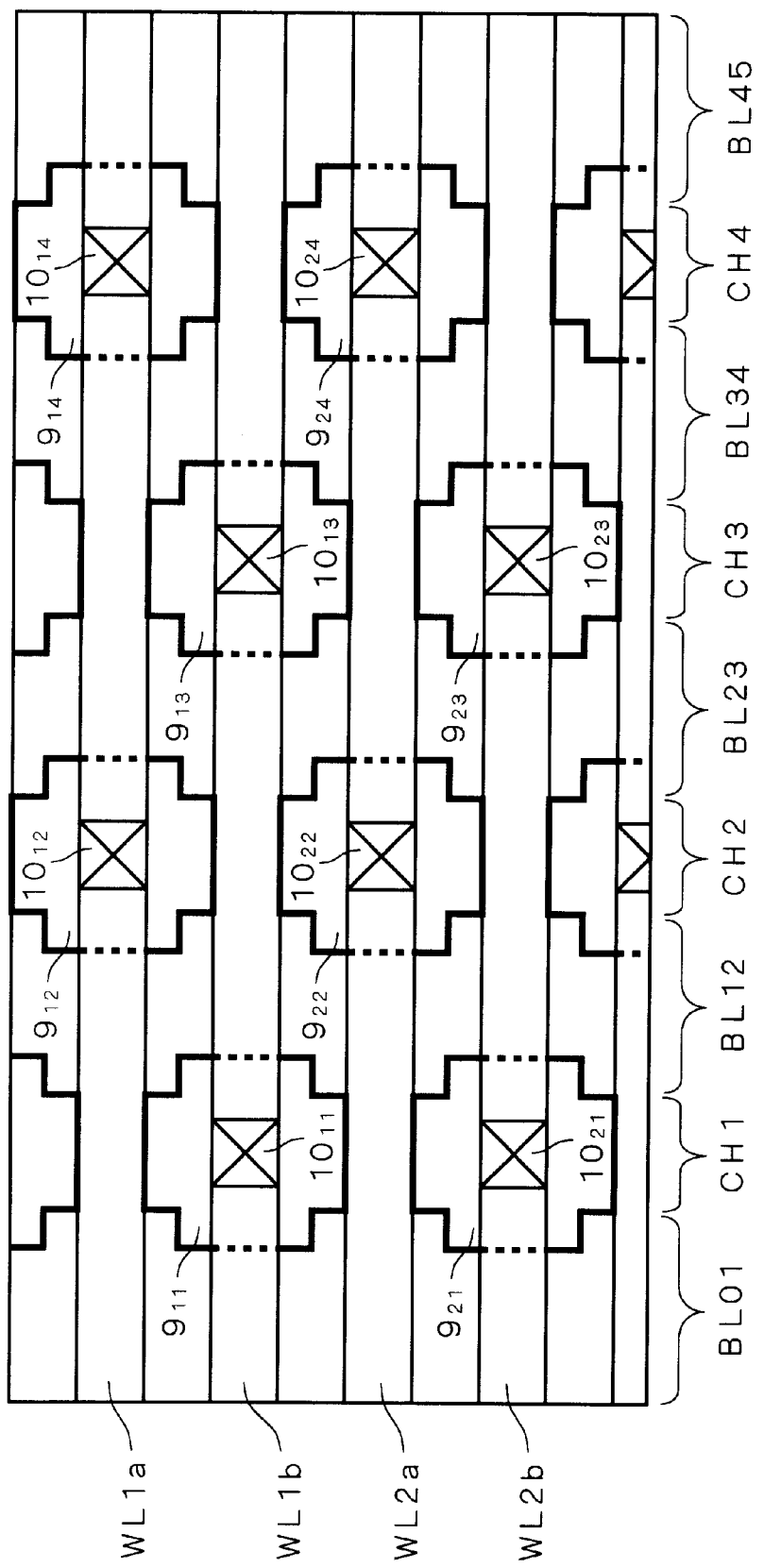
FIG. 20 is a top view obtained by adding word lines to the structure of FIG. 19.

FIG. 19 is a corresponding top view of FIG. 1, schematically illustrating a non-volatile semiconductor memory structure according to an eighth modification of the first preferred embodiment. Gate electrodes $9_{11}$ and $9_{13}$ are offset 1 F in the column direction with respect to gate electrodes $9_{12}$ and $9_{14}$. Gate electrodes $9_{21}$ and $9_{23}$ are offset 1 F in the column direction with respect to gate electrodes $9_{22}$ and $9_{24}$. The gate electrodes 9 have such a top face of substantially +-shape that a wide portion is formed at the contact portions with the plugs 10. The plugs 10 are brought into contact with the central portions of the gate electrodes 9. FIG. 20 is a top view obtained by adding word lines to the structure of FIG. 19. Sub-word lines WL extend linearly in the row direction. The non-volatile semiconductor memory of the eighth modification in the first preferred embodiment can provide the effect of further increasing mask alignment offset margin in forming the plugs 10, and the effect of reducing the delay time of signal transmission in the sub-word lines WL.

Figure 21:
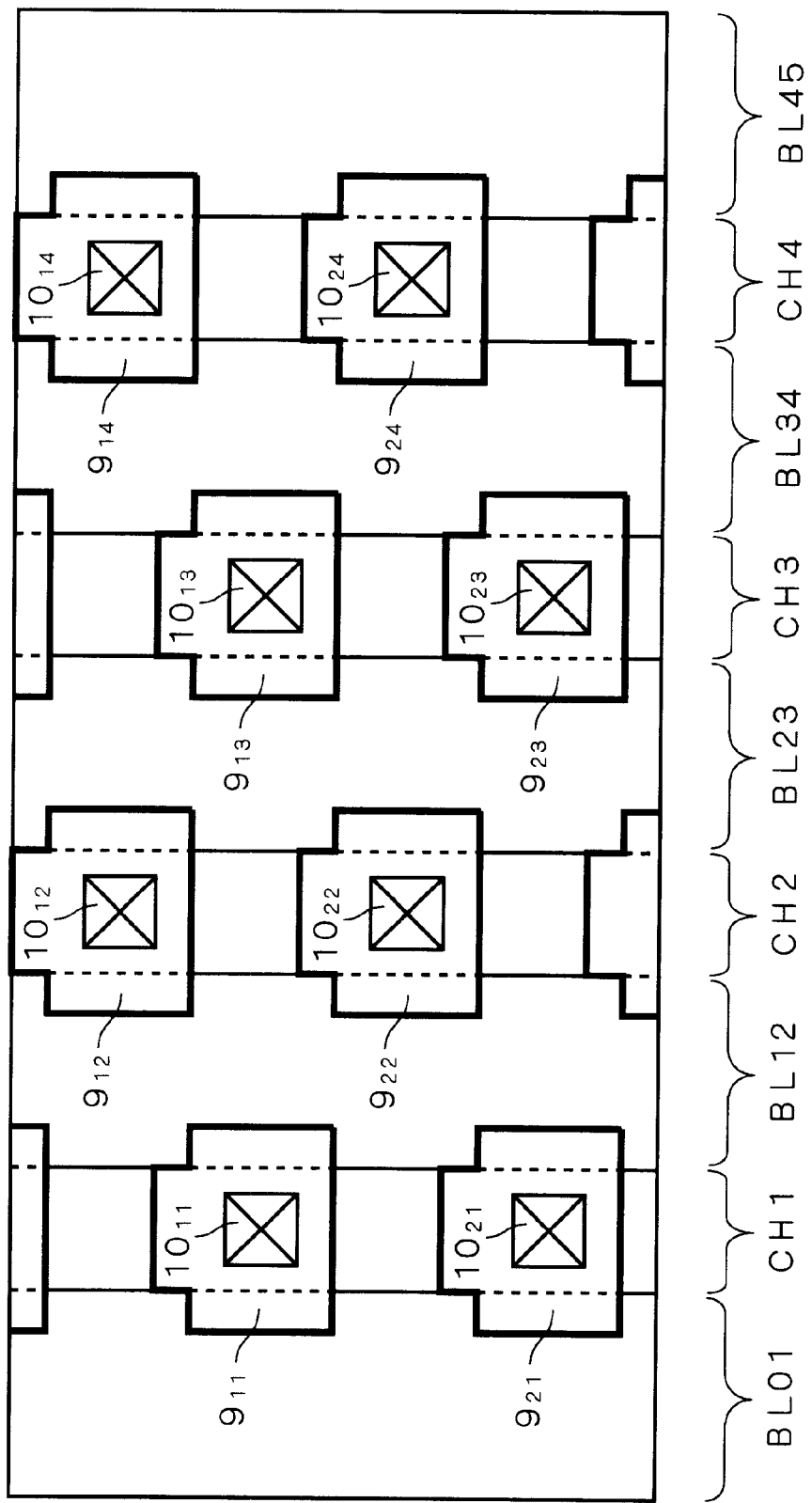
FIG. 21 is a top view schematically illustrating a non-volatile semiconductor memory structure according to a ninth modification of the first preferred embodiment.
Figure 22:
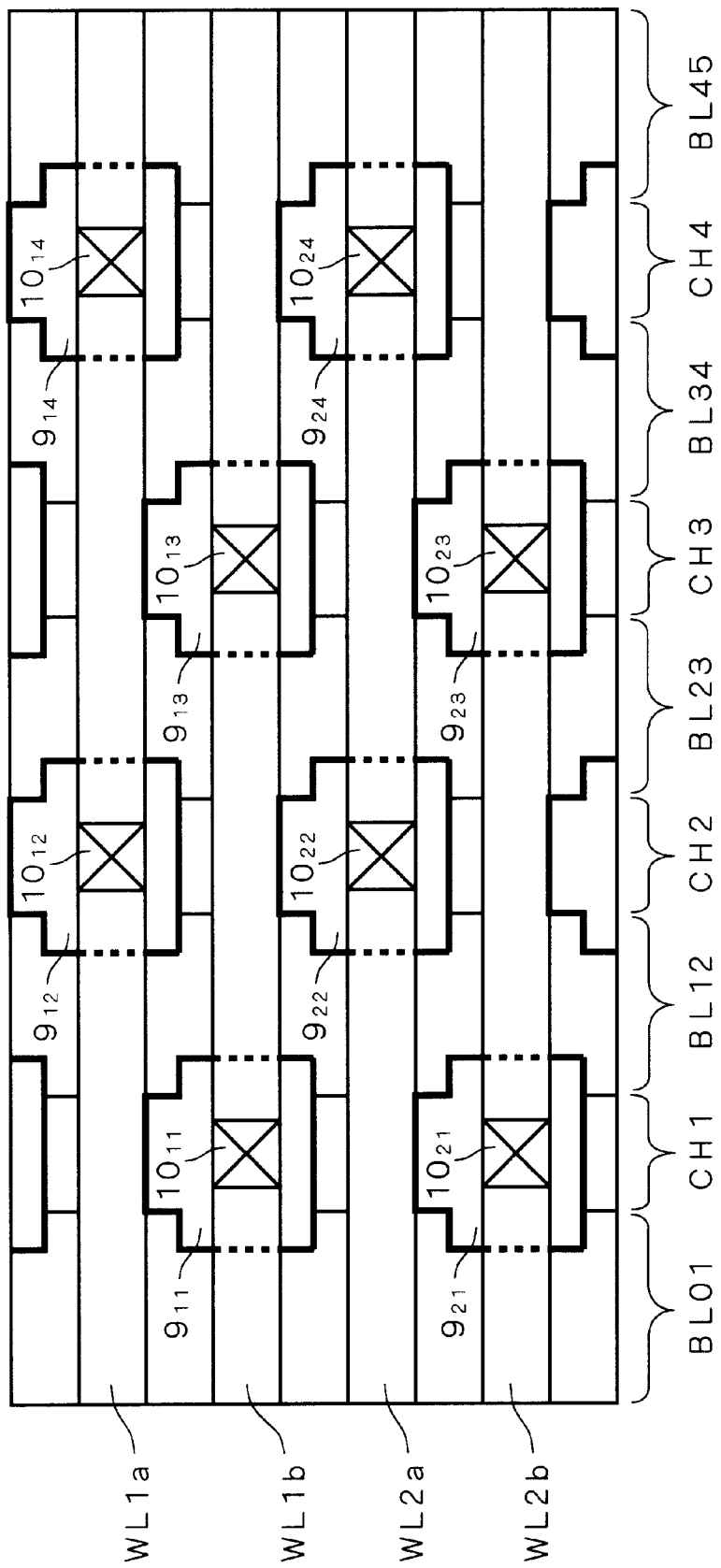
FIG. 22 is a top view obtained by adding word lines to the structure of FIG. 21.

FIG. 21 is a corresponding top view of FIG. 1, schematically illustrating a non-volatile semiconductor memory structure according to a ninth modification of the first preferred embodiment. Gate electrodes $9_{11}$ and $9_{13}$ are offset 1 F in the column direction with respect to gate electrodes $9_{12}$ and $9_{14}$. Gate electrodes $9_{21}$ and $9_{23}$ are offset 1 F in the column direction with respect to gate electrodes $9_{22}$ and $9_{24}$. The gate electrodes 9 have such a top face of substantially T-shape that a wide portion is formed at the contact portions with the plugs 10. The plugs 10 are brought into contact with the central portions of the gate electrodes 9. FIG. 22 is a top view obtained by adding word lines to the structure of FIG. 21. Sub-word lines WL extend linearly in the row direction. The non-volatile semiconductor memory of the ninth modification in the first preferred embodiment can provide the effect of further increasing mask alignment offset margin in forming the plugs 10, and the effect of reducing the delay time of signal transmission in the sub-word lines WL.

Figure 23:
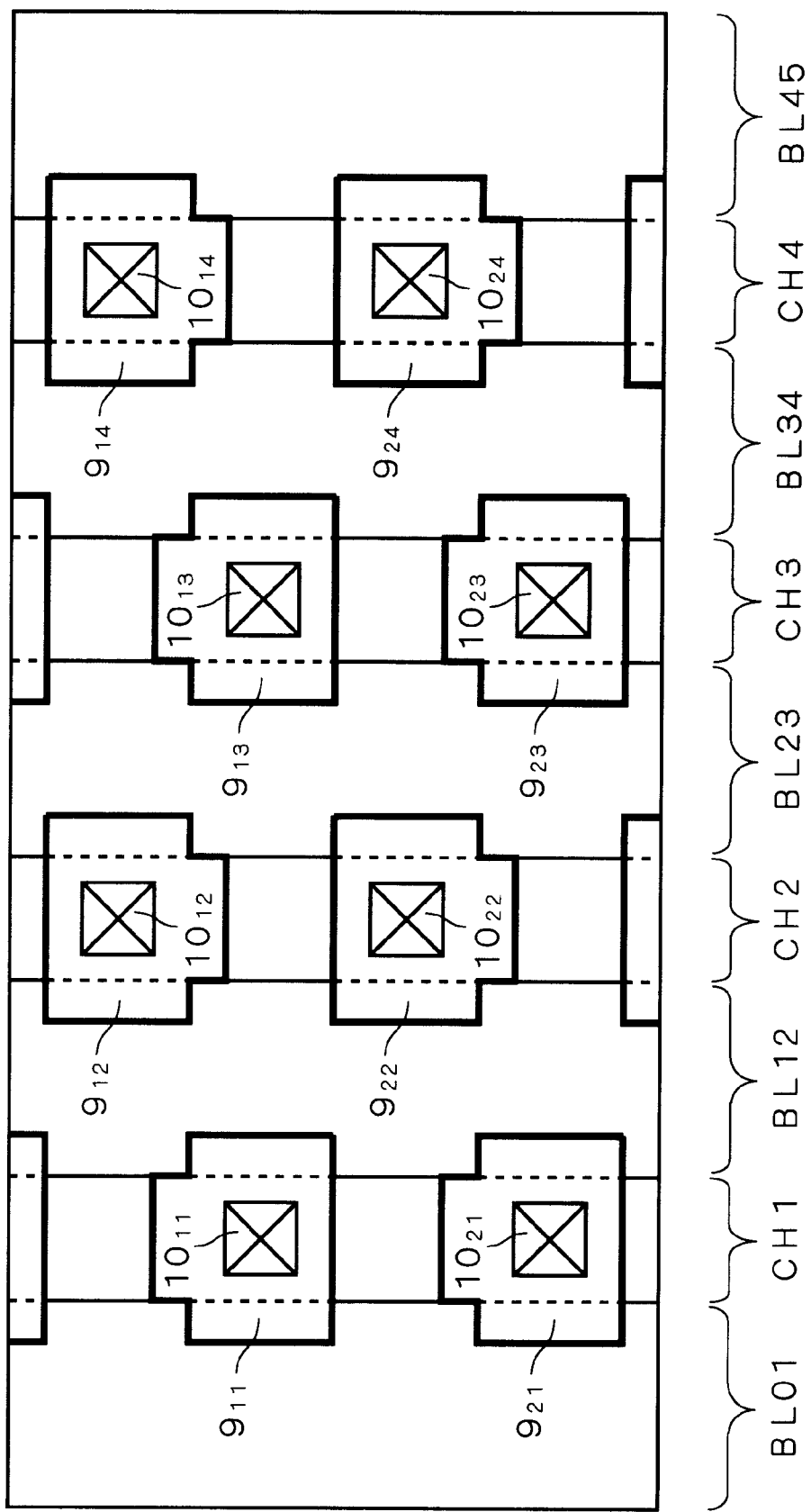
FIG. 23 is a top view schematically illustrating a non-volatile semiconductor memory structure according to a tenth modification of the first preferred embodiment.
Figure 24:
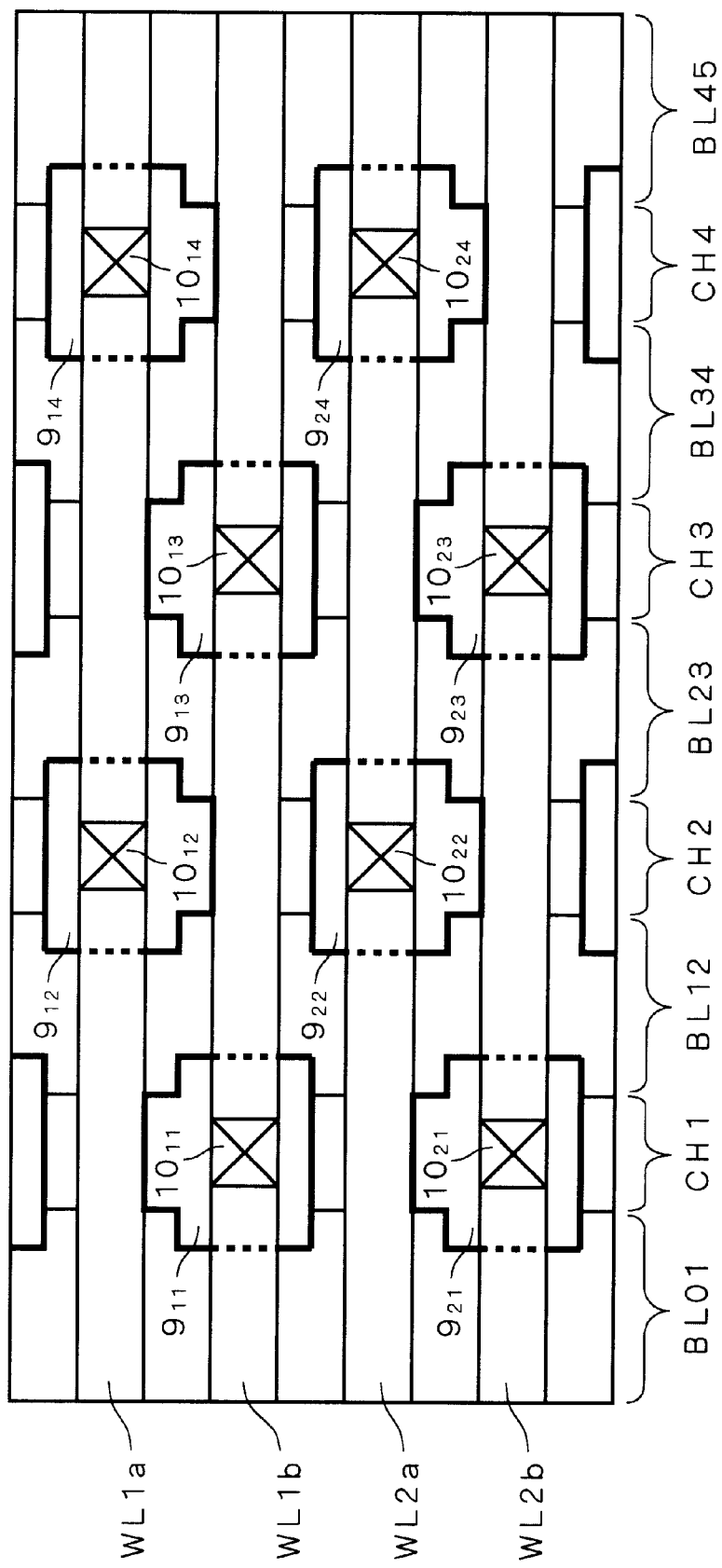
FIG. 24 is a top view obtained by adding word lines to the structure of FIG. 23.

FIG. 23 is a corresponding top view of FIG. 1, schematically illustrating a non-volatile semiconductor memory structure according to a tenth modification of the first preferred embodiment. Gate electrodes $9_{11}$ and $9_{13}$ are offset 1 F in the column direction with respect to gate electrodes $9_{12}$ and $9_{14}$. Gate electrodes $9_{21}$ and $9_{23}$ are offset 1 F in the column direction with respect to gate electrodes $9_{22}$ and $9_{24}$. The gate electrodes 9 have such a top face of substantially T-shape that a wide portion is formed at the contact portions with the plugs 10. The plugs 10 are brought into contact with the central portions of the gate electrodes 9. FIG. 24 is a top view obtained by adding word lines to the structure of FIG. 23. Sub-word lines WL extend linearly in the row direction. The non-volatile semiconductor memory of the tenth modification in the first preferred embodiment can provide the effect of further increasing mask alignment offset margin in forming the plugs 10, and the effect of reducing the delay time of signal transmission in the sub-word lines WL.

Second Preferred Embodiment

Figure 25:
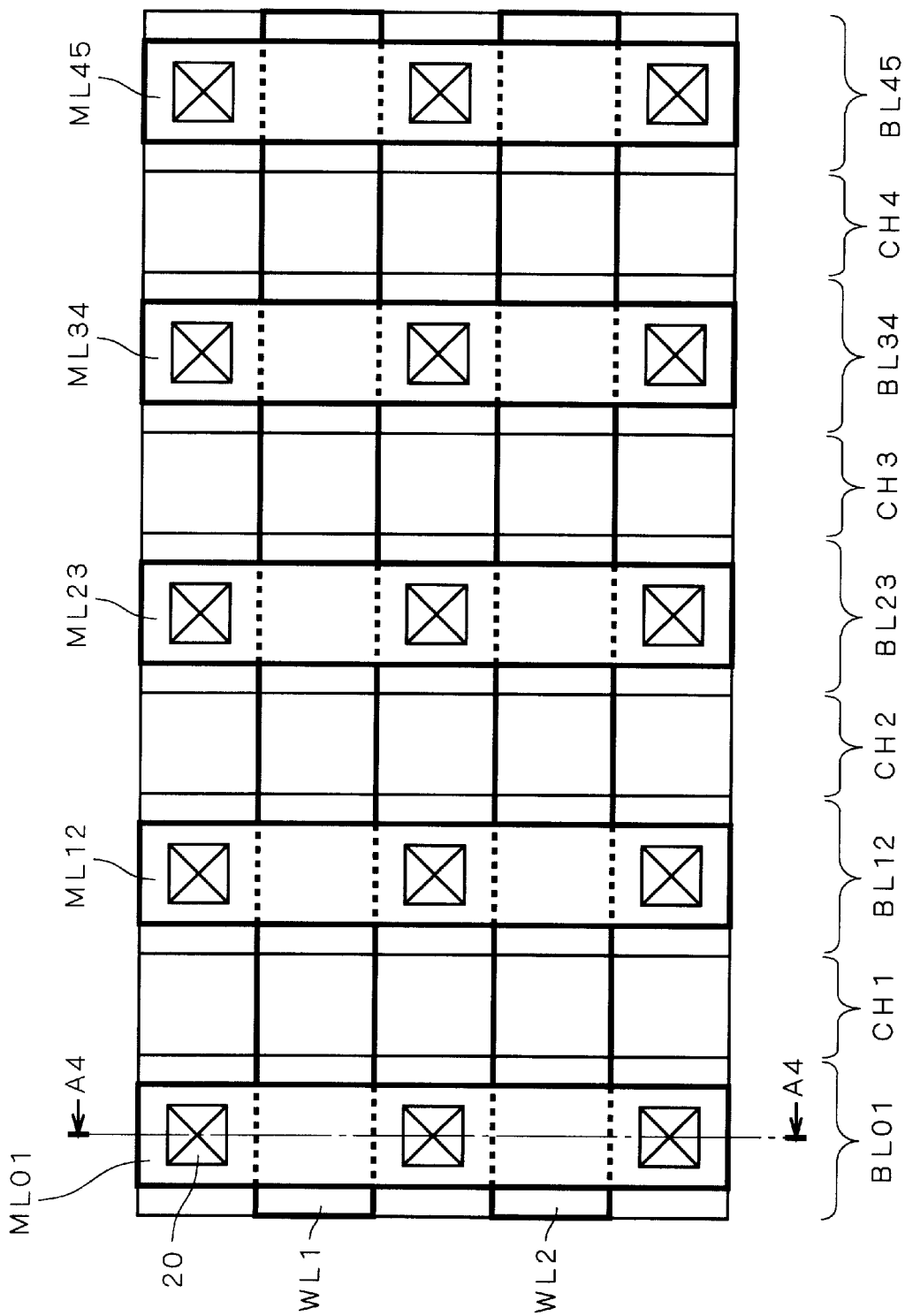
FIG. 25 is a top view schematically illustrating a non-volatile semiconductor memory structure according to a second preferred embodiment.
Figure 61:
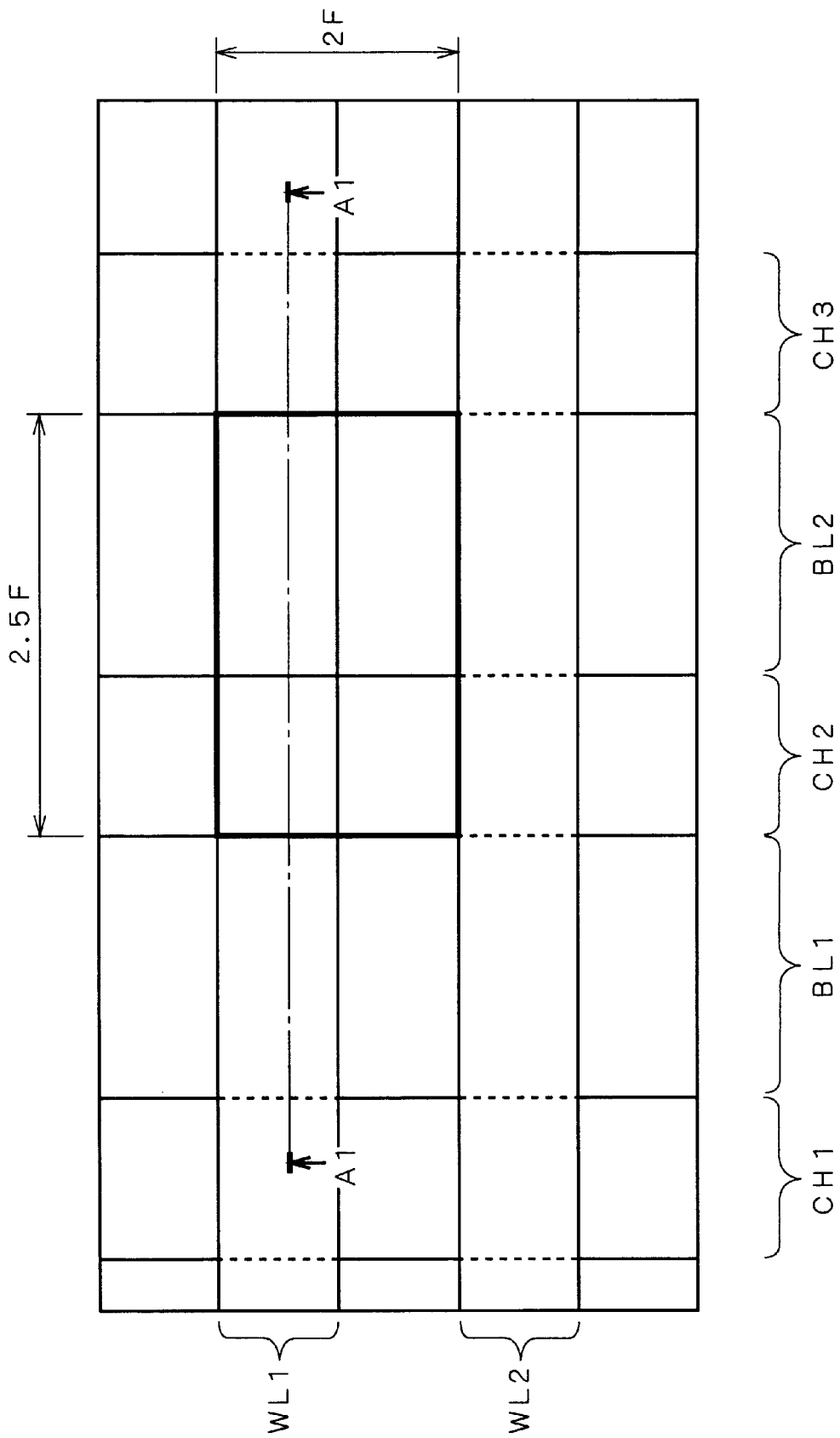
FIG. 61 is a top view partially illustrating part of a conventional non-volatile semiconductor memory structure.
Figure 62:
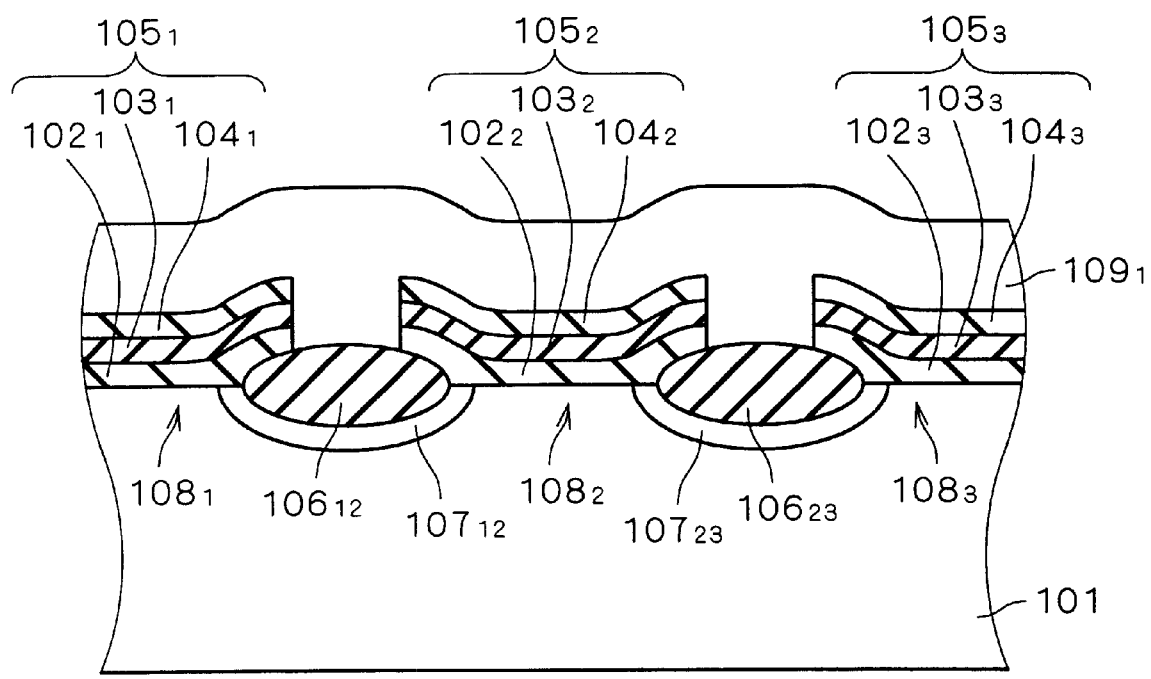
FIG. 62 is a sectional view illustrating a conventional memory cell transistor structure.
Figure 63A:
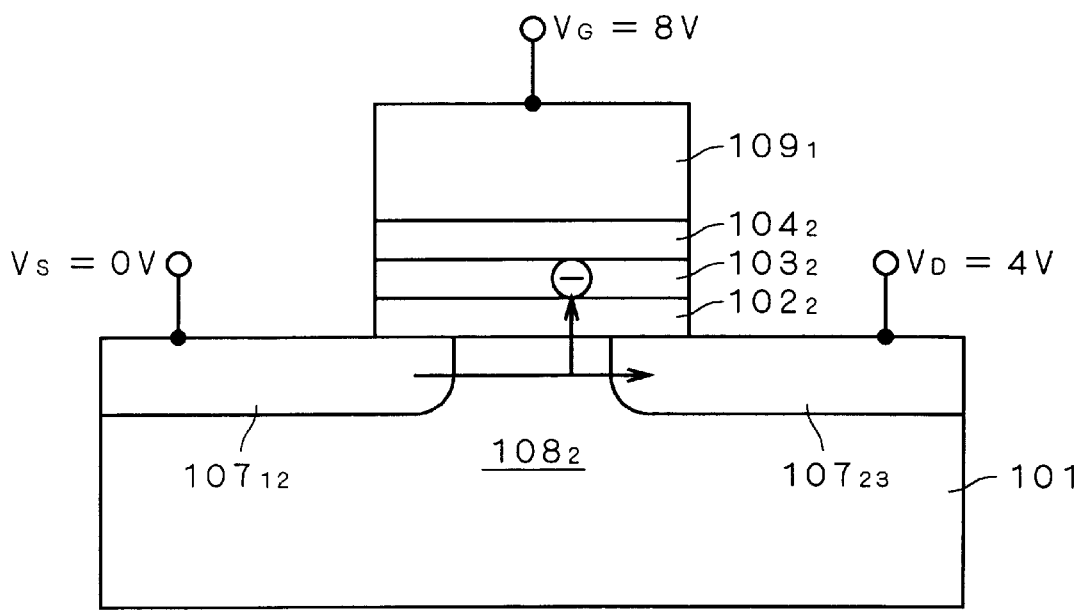
FIGS. 63(A) and 63(B) are schematic diagrams showing write operation.
Figure 63B:
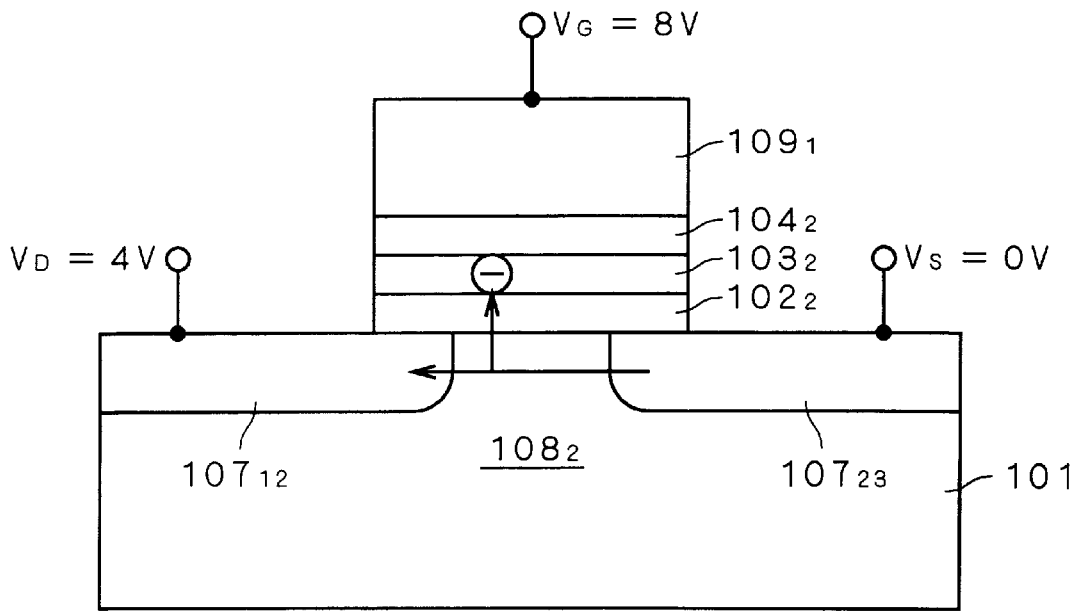
Figure 64A:
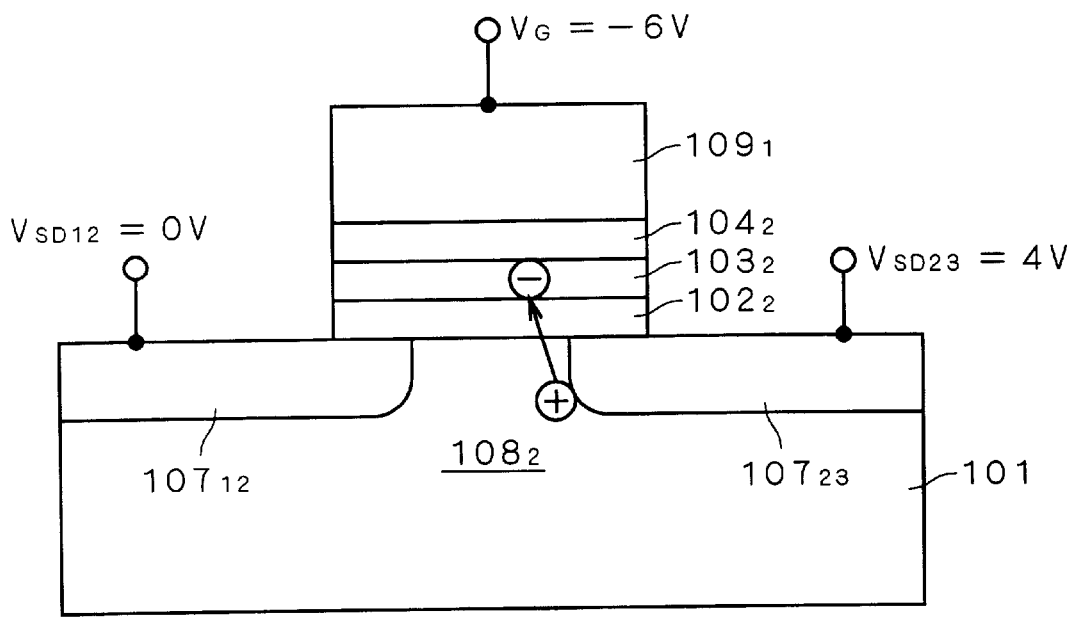
FIGS. 64(A) and 64(B) are schematic diagrams showing erase operation.
Figure 64B:
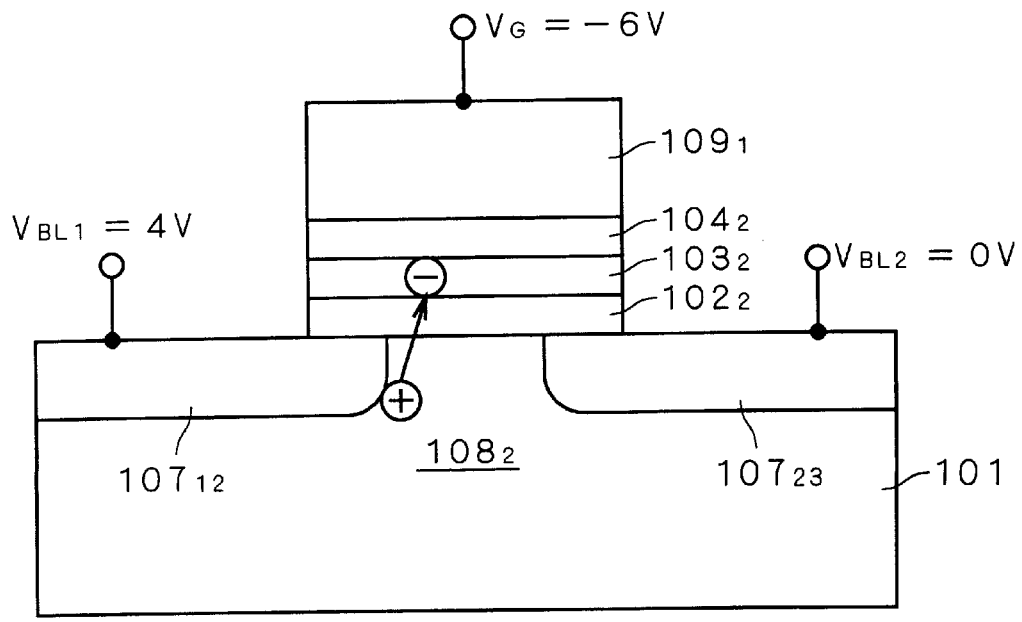
Figure 65A:
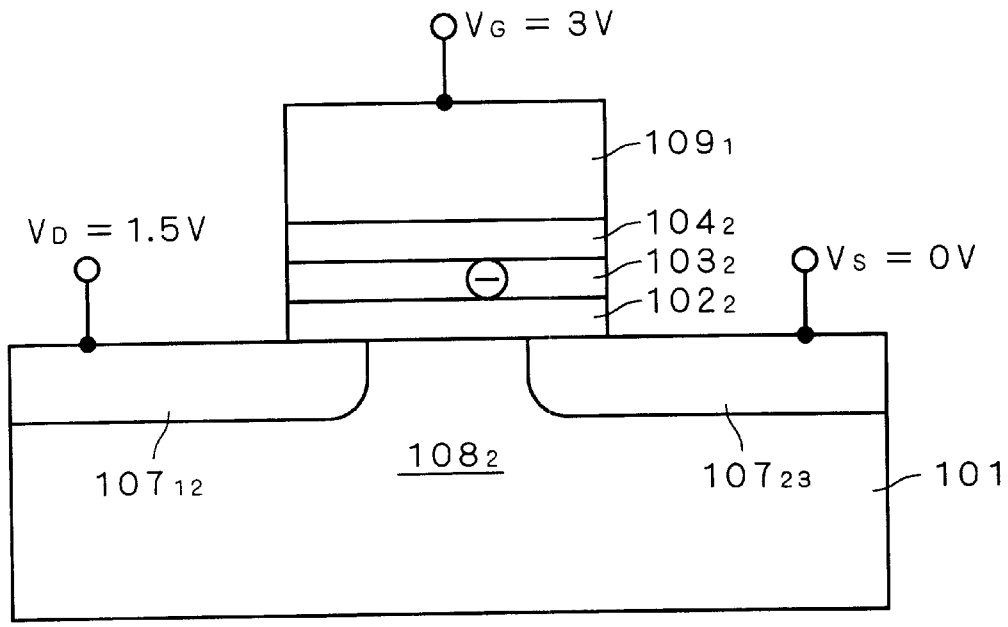
FIGS. 65(A) and 65(B) are schematic diagrams showing read operation.
Figure 65B:
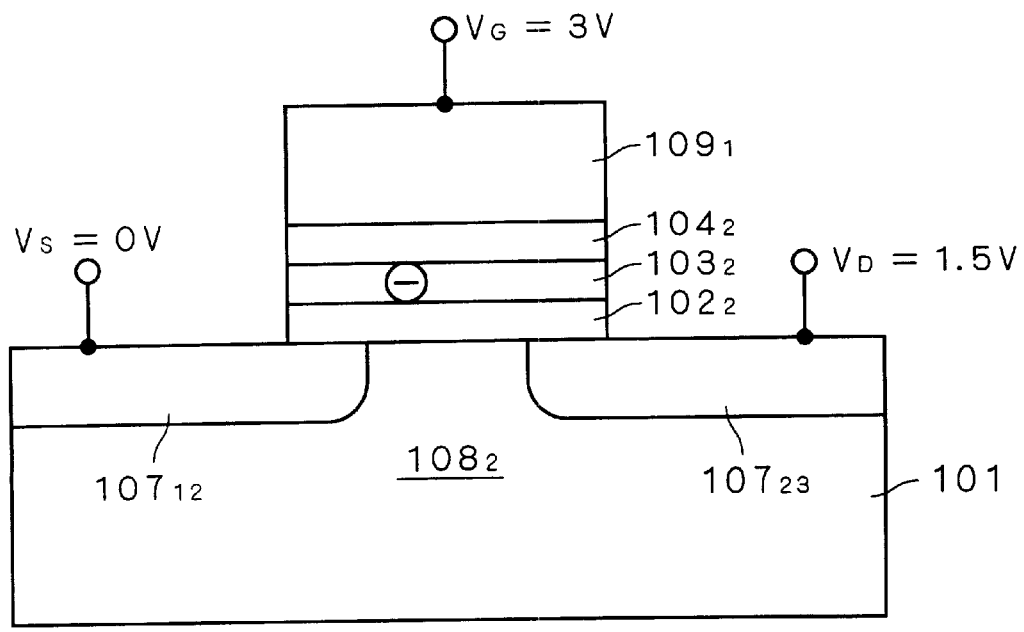
Figure 66:
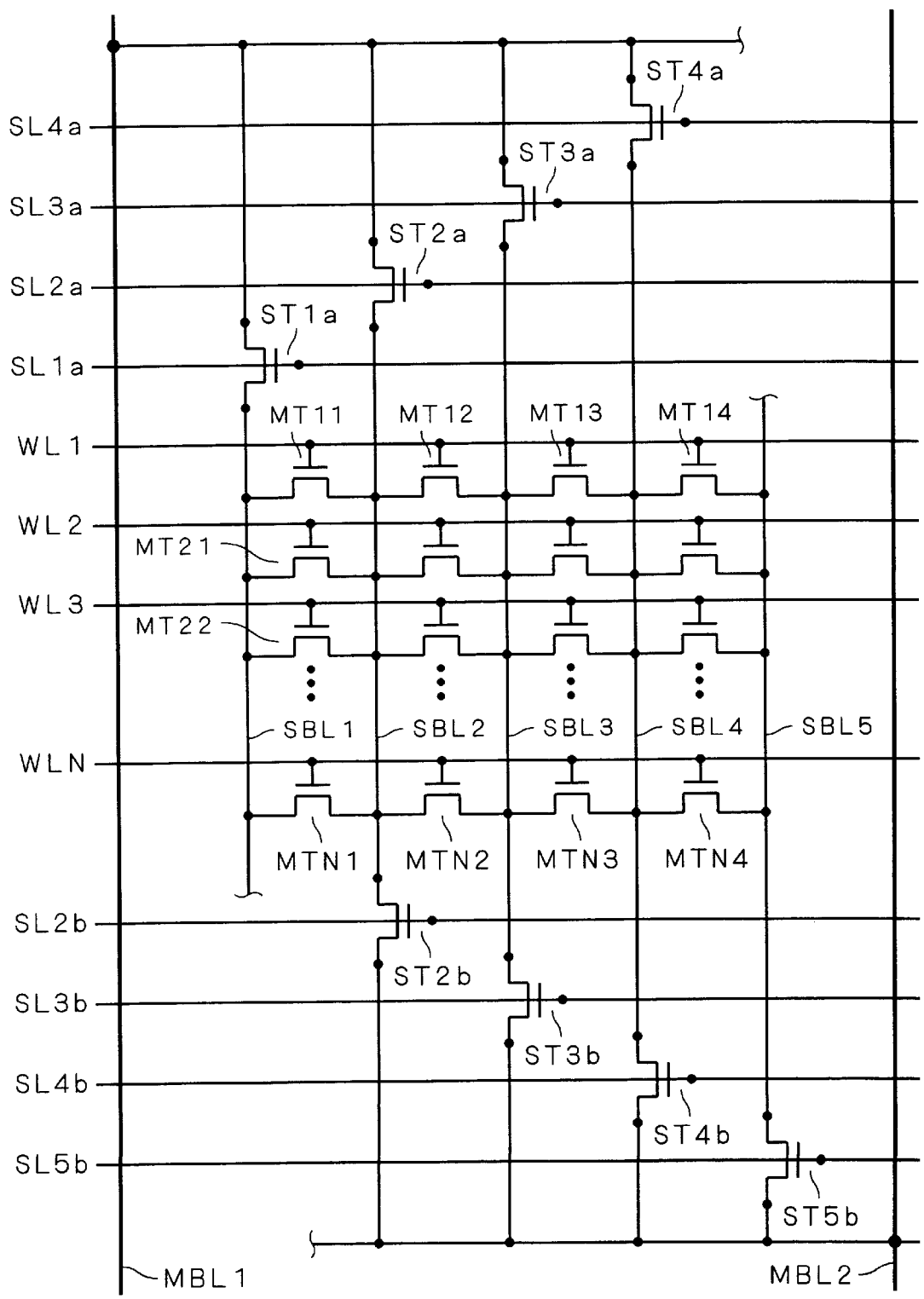
FIG. 66 is a circuit diagram illustrating a memory cell array configuration of a conventional non-volatile semiconductor memory.
Figure 67:
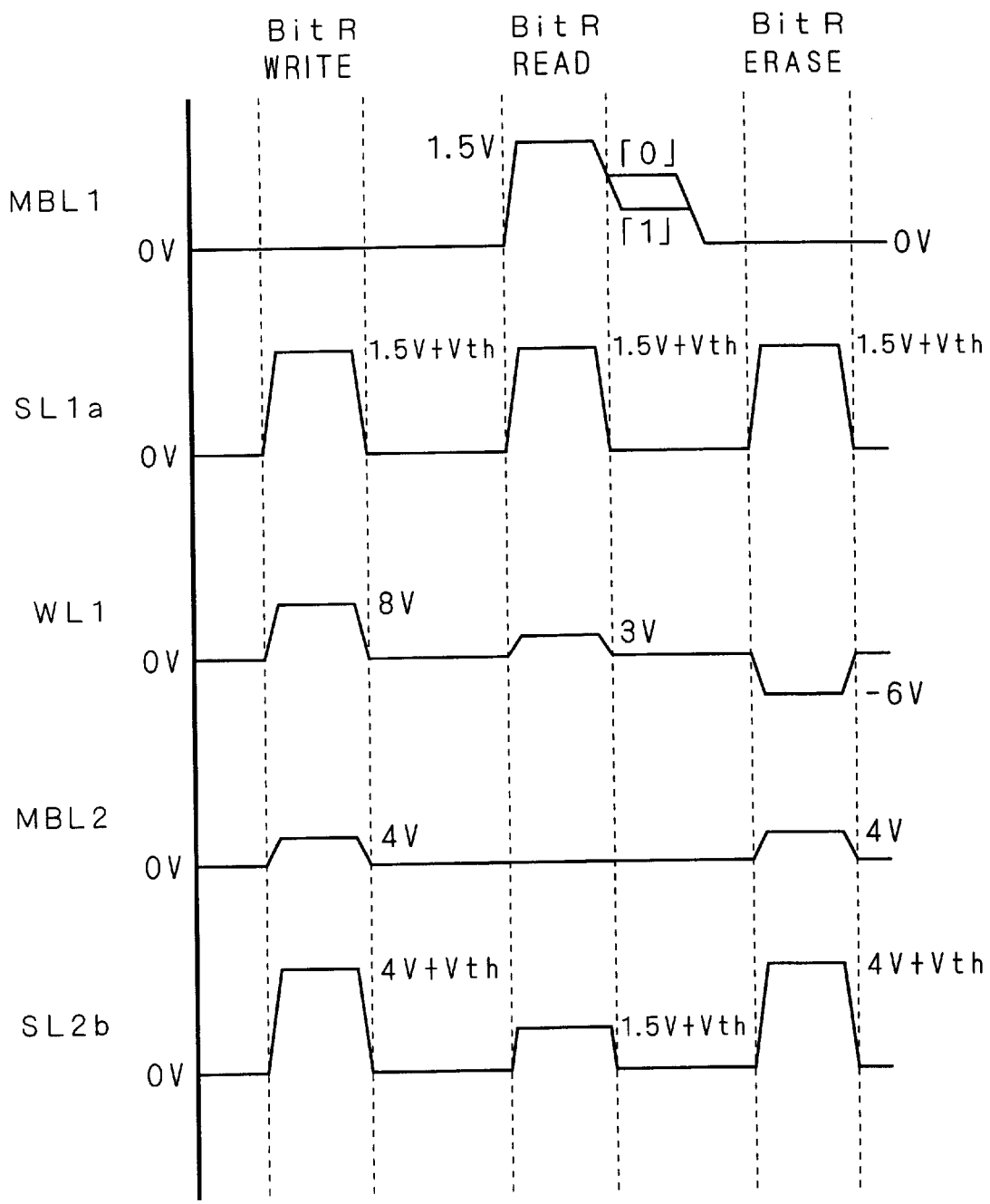
FIG. 67 is a timing chart illustrating write, read and erase operations in a conventional memory cell transistor.
Figure 68:
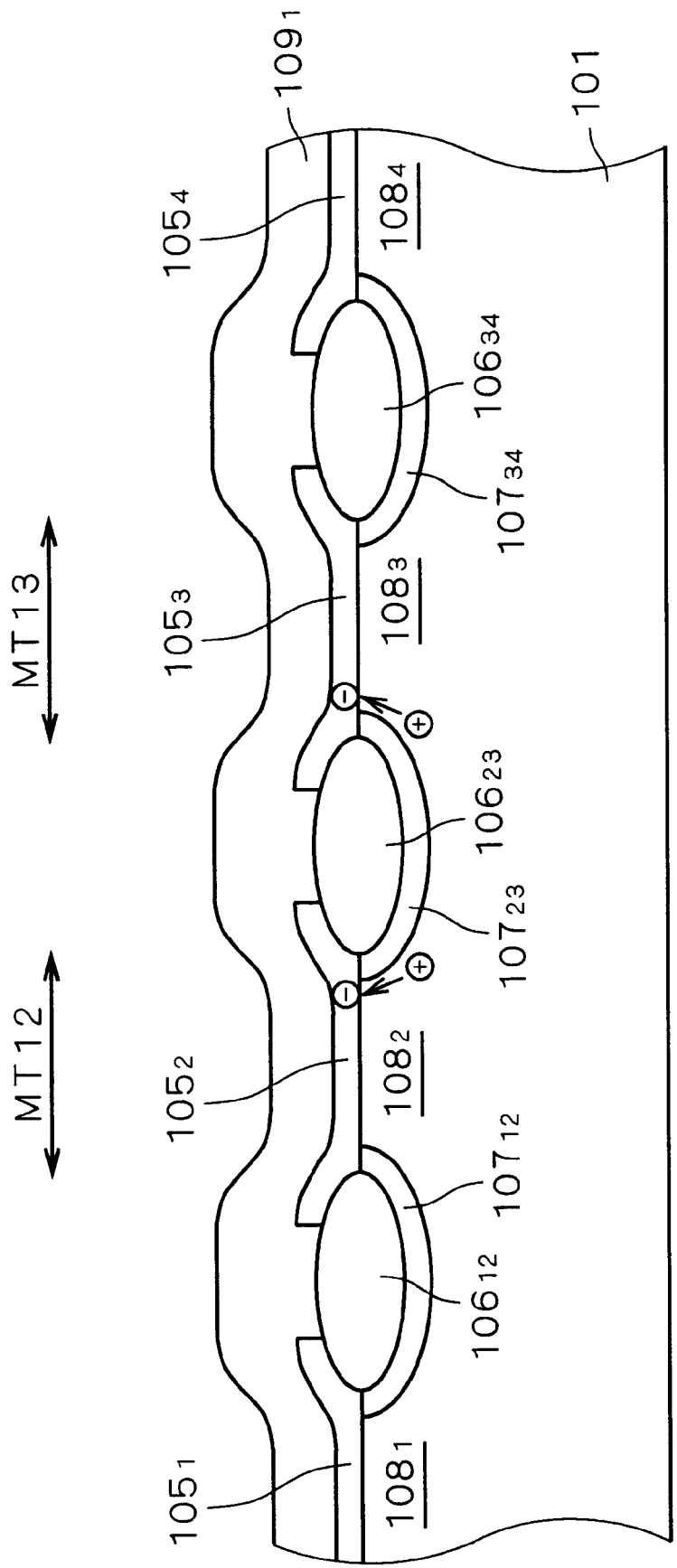
FIG. 68 is a sectional view illustrating two memory cell transistors adjacent each other in the row direction.
Figure 69:
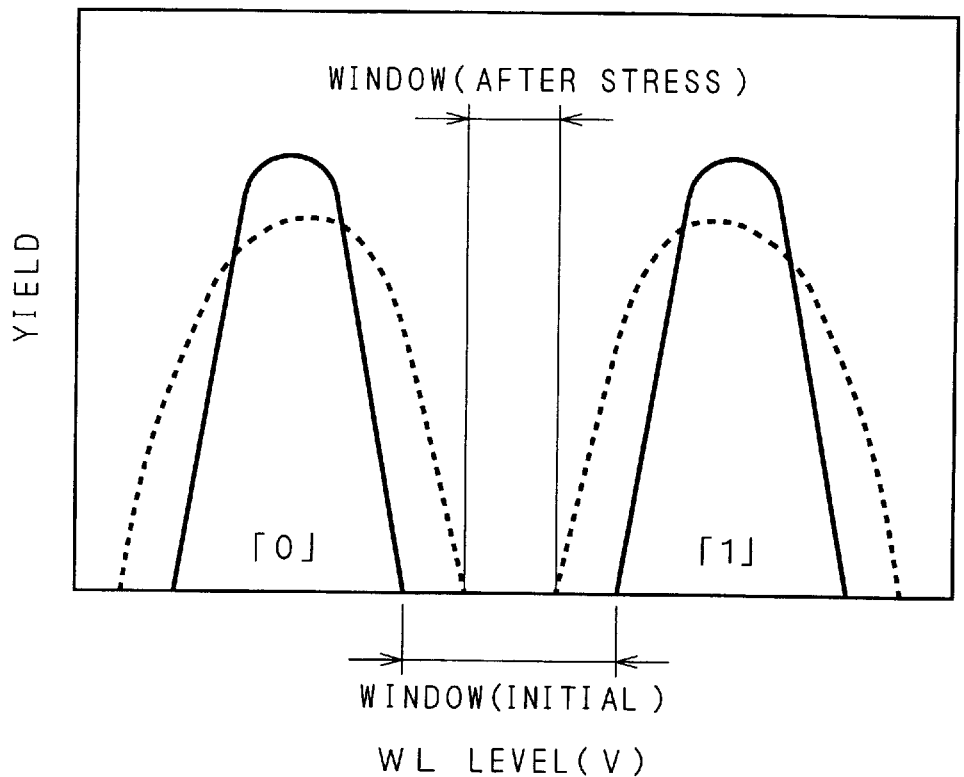
FIG. 69 is a diagram showing a threshold voltage distribution of a conventional memory cell transistor.
Figure 70:
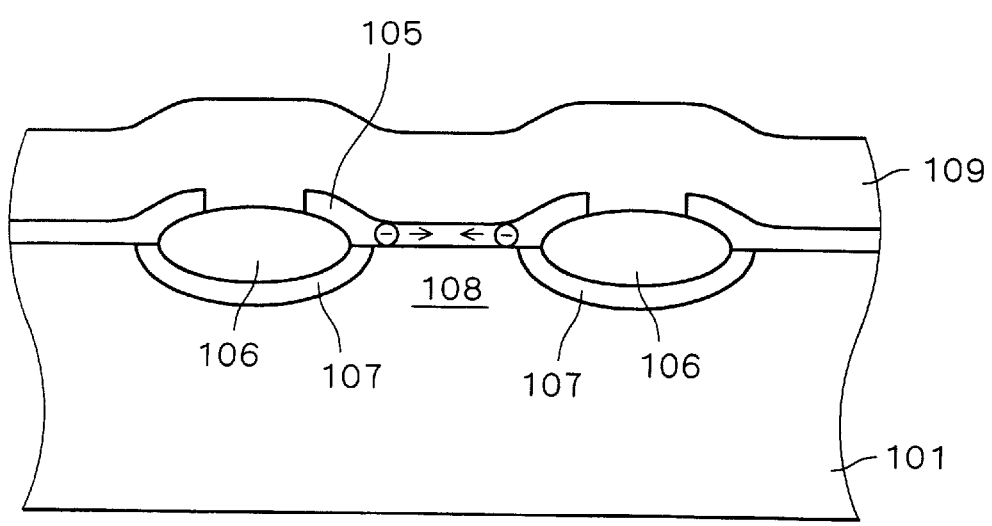
FIG. 70 is a sectional view illustrating a conventional memory cell transistor structure.

FIG. 25 is a top view schematically illustrating a non-volatile semiconductor memory structure according to a second preferred embodiment. This non-volatile semiconductor memory is characterized by having metal wirings ML (indicated by reference numerals ML01, ML12, ML23, ML34, ML45 in FIG. 25) and plugs 20, in addition to the non-volatile semiconductor memory described in the prior art (see FIGS. 61 and 62). The metal wirings ML correspond to their respective bit lines BL and extend in the column direction. The metal wirings ML are connected to their respective bit lines BL via the plugs 20.

Figure 26:
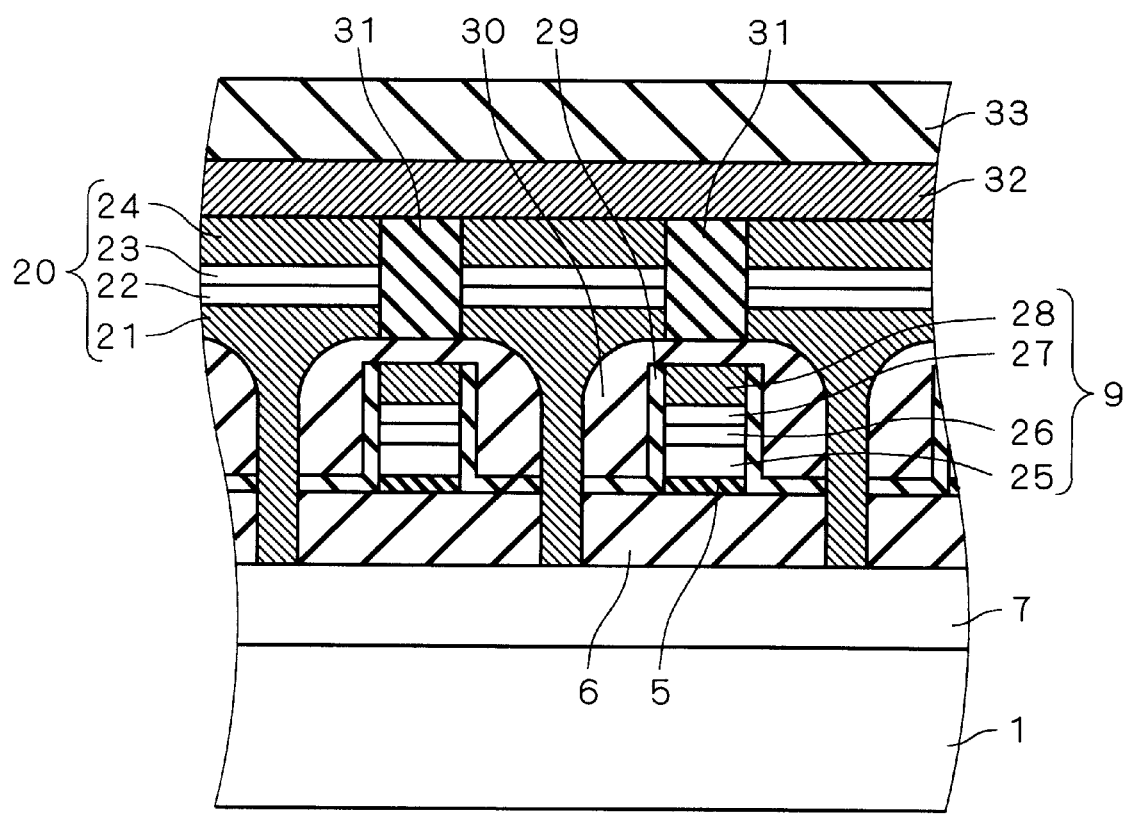
FIG. 26 is a sectional view illustrating a cross-sectional structure taken along the line A4—A4 in FIG. 25.

FIG. 26 is a sectional view illustrating a cross-sectional structure taken along the line A4—A4 in FIG. 25. A conductive film 9 corresponding to the word lines WL1 and WL2 in FIG. 25 has such a structure that a doped polysilicon film 25, tungsten silicide film 26, tungsten nitride film 27 and tungsten film 28 are stacked in this order on an ONO film 5. The ONO film 5 overlies an isolation insulating film 6. Impurity such as phosphorous or arsenic is introduced in the doped polysilicon film 25 in a concentration of not less than $1 \times 10^{20}/cm^3$. The tungsten nitride film 27 functions as a barrier metal, and suppresses the mutual diffusion of atoms between the tungsten film 28 and the tungsten silicide film 26. The tungsten silicide film 26 plays the role of reducing contact resistance between the tungsten film 28 and the doped polysilicon film 25. Note that the tungsten silicide film 26 can be omitted.

As other structure of the conductive film 9, there may be employed a stacked structure of a doped polysilicon film, tungsten nitride film and tungsten film, a stacked structure of a doped polysilicon film, titanium nitride film and tungsten film, a stacked structure of a doped polysilicon film and cobalt silicide film, a stacked structure of a doped polysilicon film and nickel silicide film, or a stacked structure of a doped polysilicon film and tungsten silicide film.

A sidewall composed of a silicon oxide film 29 and a silicon nitride film 30 is disposed on the side surface of the conductive film 9. The relative permittivity of the silicon oxide film 29 is about 3.9 to 4.1, and that of the silicon nitride film 30 is about 7 to 9. Forming the silicon oxide film 29 below the silicon nitride film 30 can lower the parasitic capacitance caused by an impurity diffusion region 7 and the conductive film 9, thereby reducing the delay time of signal transmission in the conductive film 9.

Disposed above the silicon substrate 1 is an interlayer insulating film 31 covering memory cell transistors. A metal wiring 32 corresponding to the metal wirings ML of FIG. 25, overlies the interlayer insulating film 31. The material of the metal wiring 32 is, for example, Cu, Al, Ag, Au, Mo, or W, and the metal wiring 32 has a higher conductivity than the impurity diffusion region 7. That is, the resistance value of the metal wiring 32 is smaller than that of the impurity diffusion region 7. The metal wiring 32 is connected to the impurity diffusion region 7 via a plug 20 formed in the interlayer insulating film 31 and the isolation insulating film 6. The plug 20 has such a structure that a doped polysilicon film 21, cobalt silicide film 22, titanium nitride film 23 and tungsten film 24 are stacked in this order. An interlayer insulating film 33 covering the metal wiring 32 is disposed above the interlayer insulating film 31. For reducing wiring capacitance, the interlayer insulating film 33 should preferably be a low dielectric constant material.

A method of forming the plug 20 will next be described. After forming an interlayer insulating film 31, a photoresist having a predetermined aperture pattern is formed on the interlayer insulating film 31. By anisotropic etching method using the photoresist and the sidewall 30 of a conductive film 9 as an etching mask, the interlayer insulating film 31 and an isolation insulating film 6 are partially etched until an impurity diffusion region 7 is exposed, thereby forming contact holes. Any material may be employed if only its etching selectivity is sufficiently large with respect to the material of the sidewall 30 of the conductive film 9. For reducing wiring capacitance, it is desirable to employ a material of which relative permittivity is small. For instance, it can be considered to use silicon oxyfluoride, hydrogen silsesquioxane (HSQ), fluorinated polysilicon, polyphenylquinoxaline polymer, fluoro-polymide, amorphous fluoro carbon (a–C:F), methylpoly-siloxane (MPS), poly arylene ether (PAE), SiOC, alternatively, an insulated gas of low dielectric constant such as air, helium, argon or nitrogen. In the case of using an insulative gas, the metal wiring 32 is mechanically supported by a columnar insulator.

In the above etching step, if the etching condition is adjusted such that the photoresist formed on the interlayer insulating film 31 is completely removed when the impurity diffusion region 7 is exposed, the photoresist ashing step can be omitted, thereby lowering manufacturing cost.

After forming the contact holes, a doped polysilicon film 21, cobalt silicide film 22, titanium nitride film 23 and tungsten film 24 are deposited in this order so as to fill the contact holes. The reason for forming the cobalt silicide film 22 is to reduce contact resistance. In place of the cobalt silicide film 22, a tungsten silicide film, nickel silicide film or titanium silicide film may be formed. Subsequently, by CMP (chemical mechanical polishing) method, the upper surface of the tungsten film 24 is planarized so as to be even with the upper surface of the interlayer insulating film 31.

Thus, with the non-volatile semiconductor memory of the second preferred embodiment, the impurity diffusion region 7 of relatively high resistance, which functions as bit lines BL, is connected via the plug 20 to the metal wiring 32 of low resistance. Therefore, since the resistance value of the bit lines BL can be lowered than the conventional non-volatile semiconductor memory, the delay time of signal transmission in the bit lines BL can be reduced so that the operation speed of the memory cell transistors can be increased as a whole.

Figure 27:
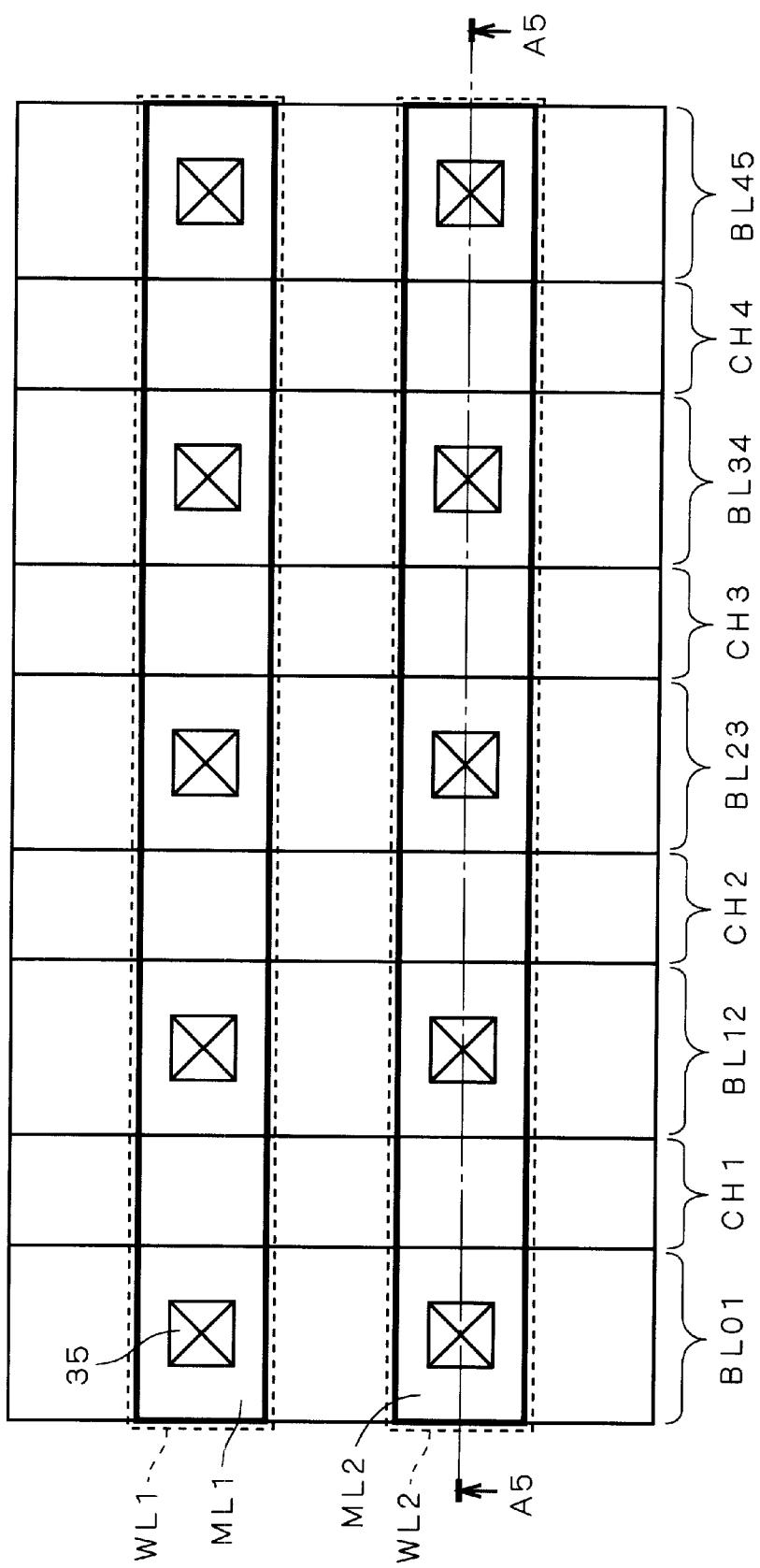
FIG. 27 is a top view schematically illustrating a non-volatile semiconductor memory structure according to a first modification of the second preferred embodiment.

FIG. 27 is a top view schematically illustrating a non-volatile semiconductor memory structure according to a first modification of the second preferred embodiment. This non-volatile semiconductor memory is characterized in that metal wirings ML (indicated by reference numerals ML1 and ML2 in FIG. 27) and plugs 35 are added to the non-volatile semiconductor memory described in the background art (see FIGS. 61 and 62). The metal wirings ML extend in the row direction so as to correspond to their respective word lines WL. The metal wirings ML are connected to the word lines WL via the plugs 35. The plugs 35 are disposed at the location where they overlap with the bit lines BL when viewed from above.

Figure 28:
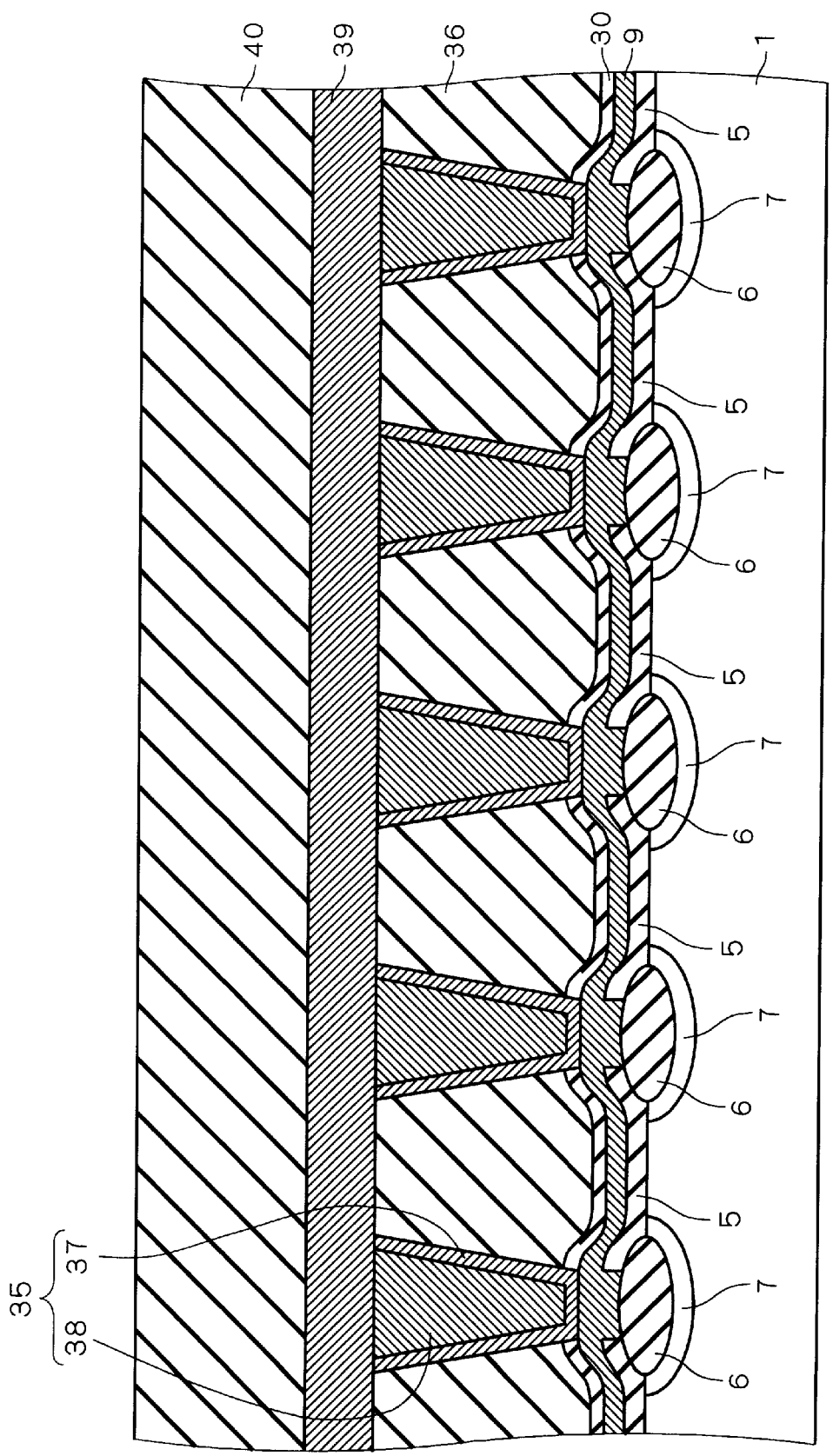
FIG. 28 is a sectional view illustrating a cross-sectional structure taken along the line A5—A5 in FIG. 27.

FIG. 28 is a sectional view illustrating a cross-sectional structure taken along the line A5—A5 in FIG. 27. An interlayer insulating film 36 covering memory cell transistors is disposed above a silicon substrate 1. Disposed on the interlayer insulating film 36 is a metal wiring 39 corresponding to the metal wirings ML in FIG. 27. The material of the metal wiring 39 is, for example, Cu, Al, Ag, Au, Mo, or W. The metal wiring 39 has a higher conductivity than a conductive film 9 corresponding to the word lines WL in FIG. 27. That is, the resistance value of the metal wiring 39 is smaller than that of the conductive film 9. The metal wiring 39 is connected to the conductive film 9 via plugs 35 formed in the interlayer insulating film 36 and a silicon nitride film 39. The plugs 35 are made up of a barrier metal 37 composed of titanium nitride or the like, and a tungsten film 38. Since the diffusion coefficient of tungsten in the interlayer insulating film 36 is small, the barrier metal 37 may be omitted.

Disposed above the interlayer insulating film 36 is an interlayer insulating film 40 covering the metal wiring 39. For reducing wiring capacitance, the interlayer insulating films 36 and 40 should preferably be a low dielectric constant material. For instance, it can be considered to use silicon oxyfluoride, hydrogen silsesquioxane (HSQ), fluorinated polysilicon, poly-phenylquinoxaline polymer, fluoropolymide, amorphous fluoro carbon (a–C:F), methylpolysiloxane (MPS), poly arylene ether (PAE), SiOC, alternatively, an insulated gas of low dielectric constant such as air, helium, argon or nitrogen. In the case that an insulative gas is used for the interlayer insulating film 36, the metal wiring 39 is mechanically supported by a columnar insulator.

A method of forming the plugs 35 will next be described. After forming an interlayer insulating film 36, a photoresist having a predetermined aperture pattern is formed on the interlayer insulating film 36. By anisotropic etching method using the photoresist as an etching mask, the interlayer insulating film 36 is partially etched until a silicon nitride film 30 is exposed. The exposed portion of the silicon nitride film 30 is then removed to expose the conductive film 9, so that contact holes are formed in the interlayer insulating film 36 and silicon nitride film 30. Subsequently, a barrier metal 37 is formed on the side surfaces and bottom surfaces of the contact holes, and the contact holes are then filled with a tungsten film 38.

Thus, with the non-volatile semiconductor memory of the first modification of the second preferred embodiment, the conductive film 9 functioning as word lines WL, is connected via the plugs 35 to the metal wiring 39 of low resistance. Therefore, since the resistance value of the word lines WL can be lowered than the conventional non-volatile semiconductor memory, the delay time of signal transmission in the word lines BL can be reduced so that the operation speed of the memory cell transistors can be increased as a whole.

Figure 29:
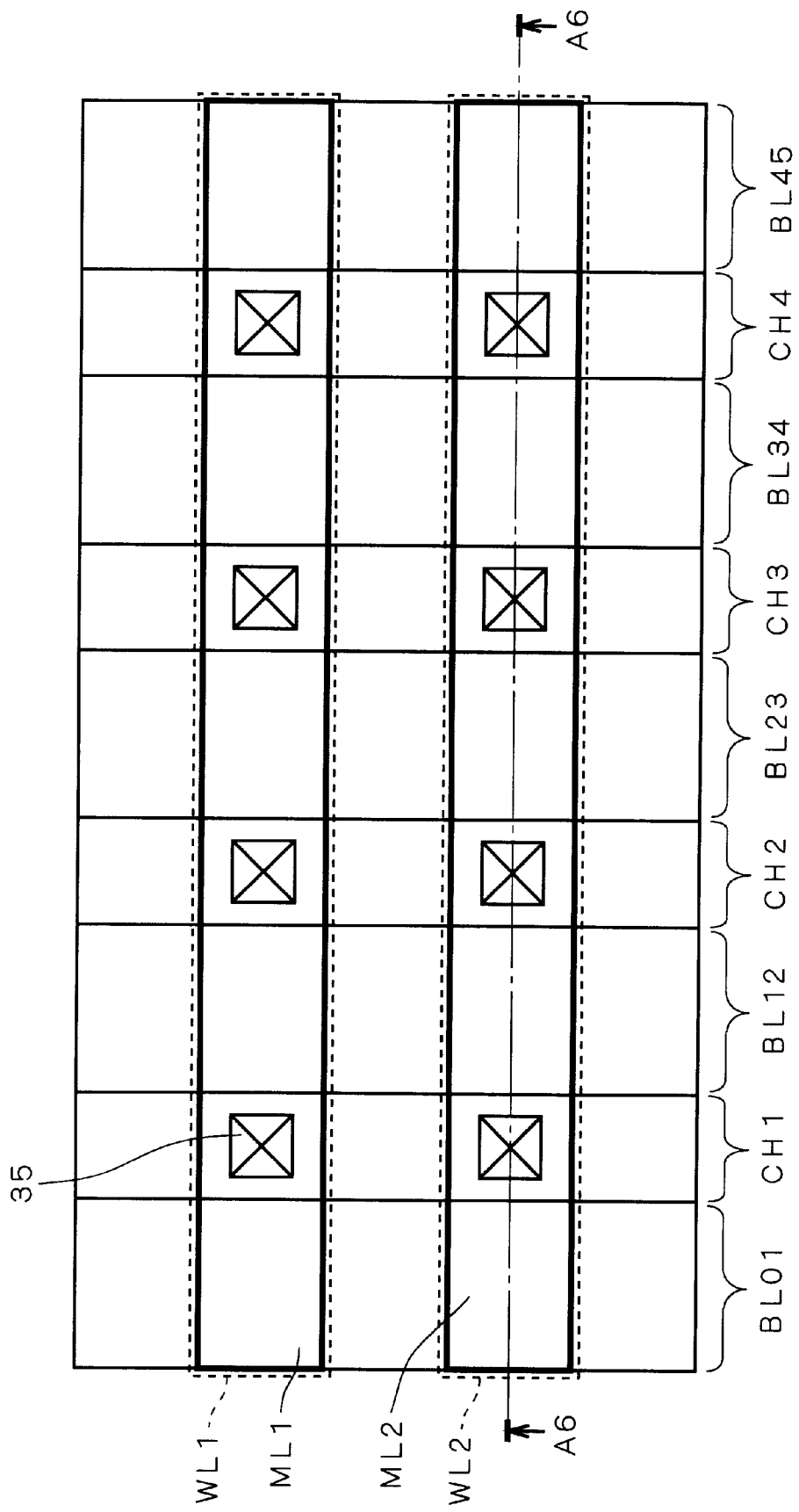
FIG. 29 is a top view schematically illustrating a non-volatile semiconductor memory structure according to a second modification of the second preferred embodiment.
Figure 30:
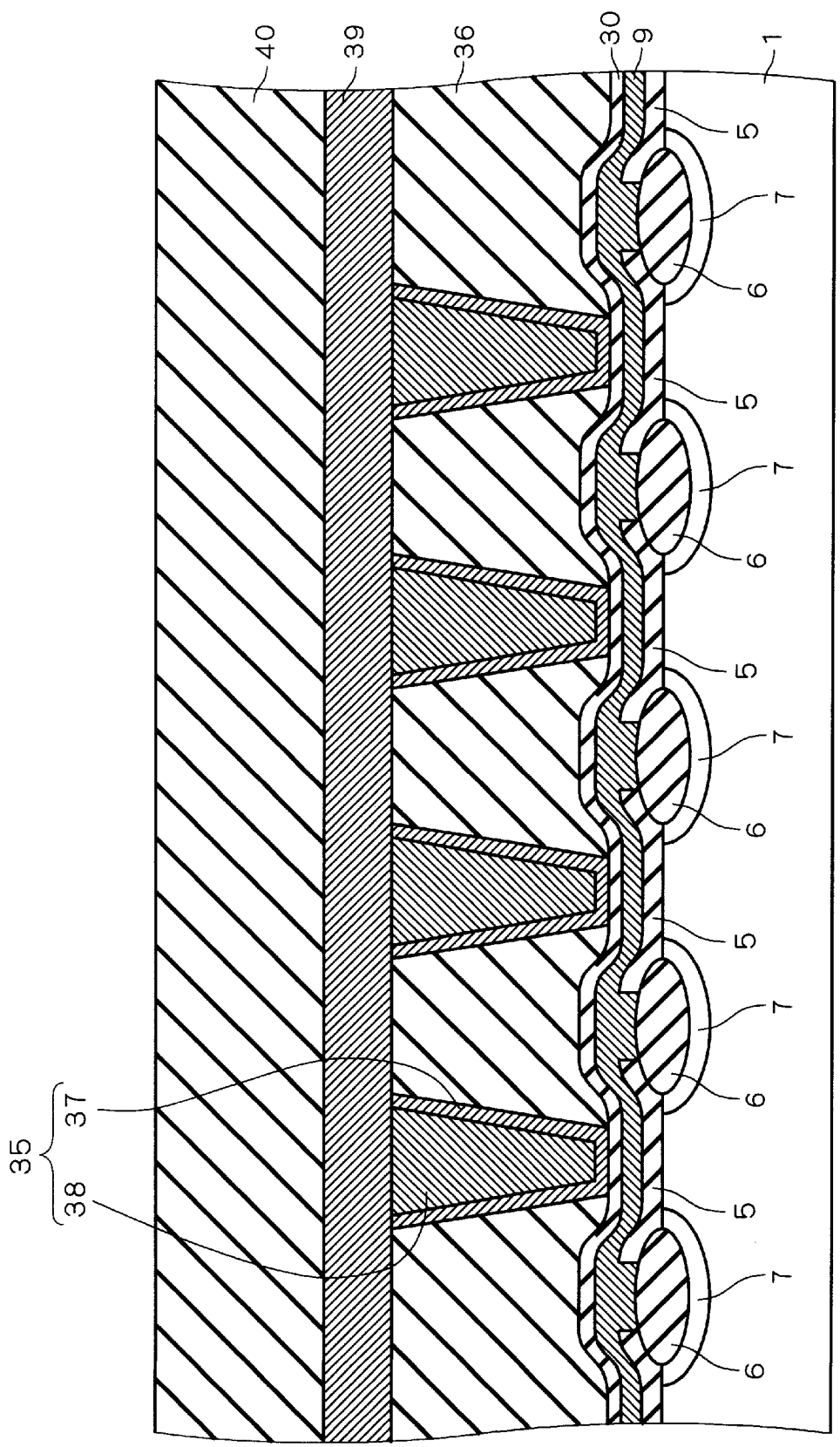
FIG. 30 is a sectional view illustrating a cross-sectional structure taken along the line A6—A6 in FIG. 29.

FIG. 29 is a top view schematically illustrating a non-volatile semiconductor memory structure according to a second modification of the second preferred embodiment. FIG. 30 is a sectional view illustrating a cross-sectional structure taken along the line A6—A6 in FIG. 29. This non-volatile semiconductor memory is characterized in that in the non-volatile semiconductor memory shown in FIGS. 27 and 28, plugs 35 are disposed at the location where they overlap with channel regions CH when viewed from above, instead of the location where they overlap with the bit lines BL when viewed from above. Even this structure can provide the same effect as the non-volatile semiconductor memory shown in FIGS. 27 and 28.

Figure 31:
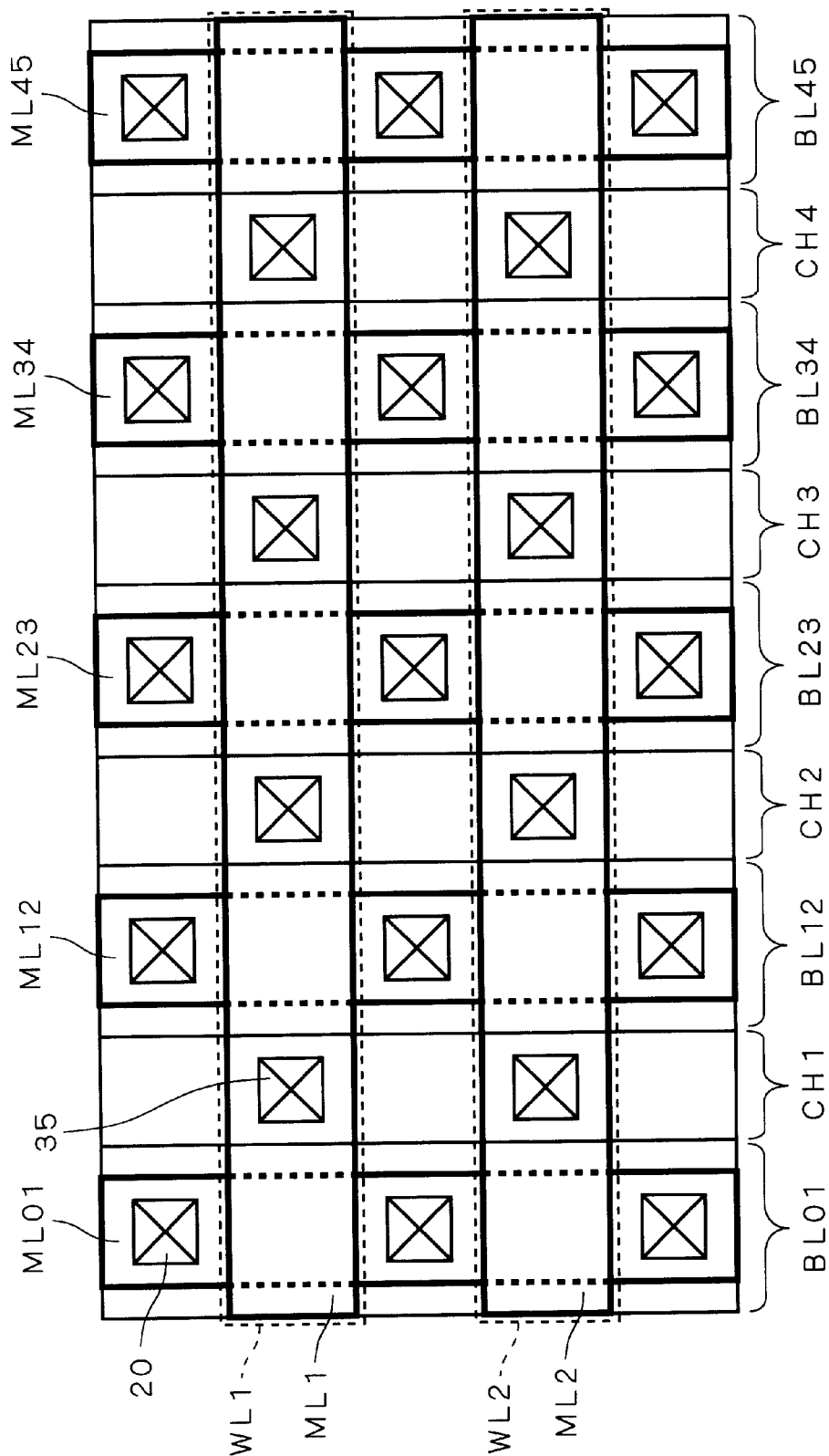
FIG. 31 is a top view schematically illustrating a non-volatile semiconductor memory structure according to a third modification of the second preferred embodiment.

FIG. 31 is a top view schematically illustrating a non-volatile semiconductor memory structure according to a third modification of the second preferred embodiment. This non-volatile semiconductor memory is characterized by forming both of the metal wirings ML01, ML12, ML23, ML34, ML45 and plugs 20 in FIG. 25, and the metal wirings ML1, ML2 and plugs 35 in FIG. 29. With the non-volatile semiconductor memory of the third modification of the second preferred embodiment, the delay time of signal transmission in the bit lines BL and the delay time of signal transmission in the word lines WL can be both reduced.

Figure 32:
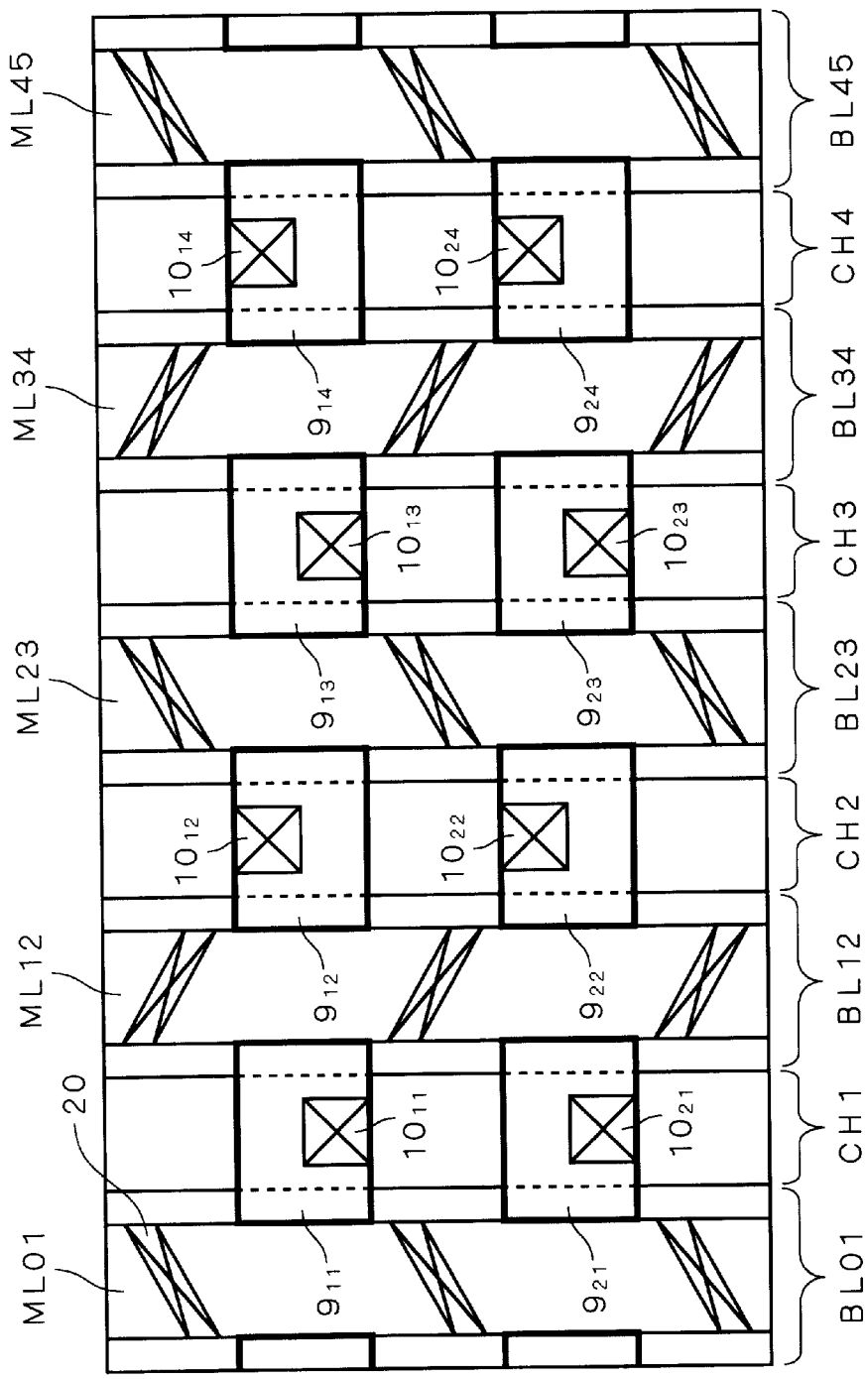
FIG. 32 is a top view schematically illustrating a non-volatile semiconductor memory structure according to a fourth modification of the second preferred embodiment.
Figure 33:
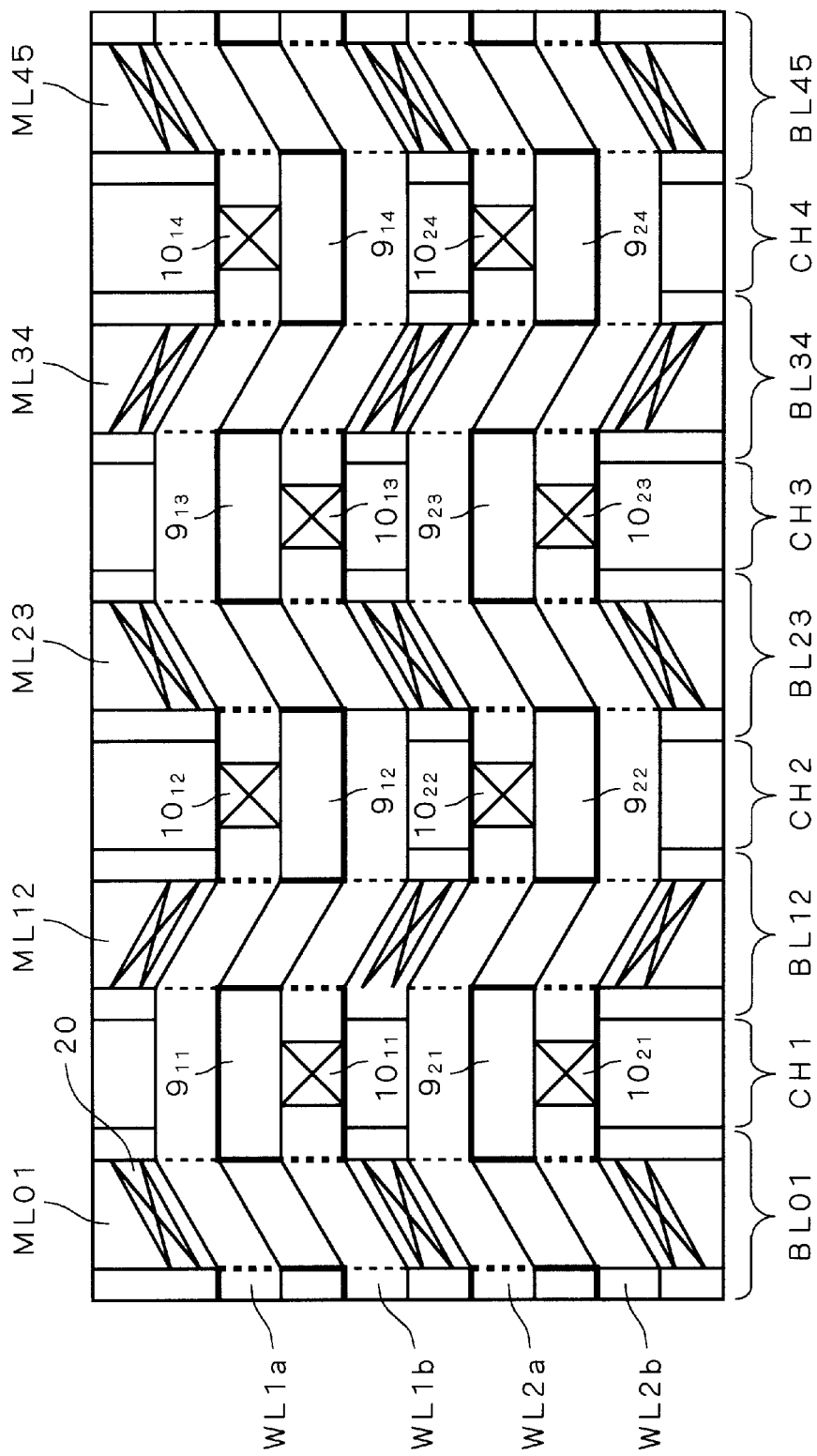
FIG. 33 is a top view obtained by adding word lines to the structure of FIG. 32.

FIG. 32 is a top view schematically illustrating a non-volatile semiconductor memory structure according to a fourth modification of the second preferred embodiment. This non-volatile semiconductor memory is obtained by applying the invention of the second preferred embodiment to the non-volatile semiconductor memory of the first preferred embodiment shown in FIGS. 1 and 2. FIG. 33 is a top view obtained by adding word lines to the structure of FIG. 32. With this non-volatile semiconductor memory, the effect of the invention according to the first preferred embodiment and the effect of the invention according to the invention of the second preferred embodiment are both obtainable.

Third Preferred Embodiment

Figure 34:
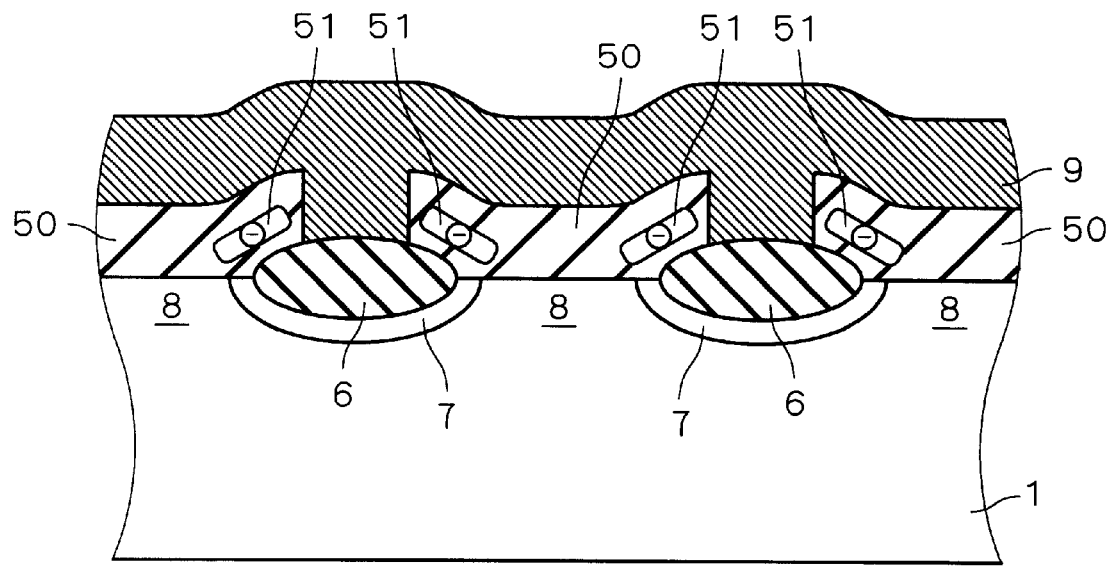
FIG. 34 is a sectional view illustrating a memory cell transistor structure in a non-volatile semiconductor memory according to a third preferred embodiment.

FIG. 34 is a sectional view illustrating a memory cell transistor structure in a non-volatile semiconductor memory according to a third preferred embodiment. A polysilicon film 51 is formed in a gate insulating film 50 composed of a silicon oxide film. An impurity diffusion region 7 functioning as the source/drain regions of memory cell transistors, underlies an isolation insulating film 6. The polysilicon film 51 is disposed only in the end portions of the gate insulating film 50 in the proximity to the impurity diffusion region 7. The polysilicon film 51 functions as the floating gate of the memory cell transistors, and the polysilicon film 51 can store electrons therein.

Writing is performed by introducing hot electrons into the polysilicon film 51. Erasing is performed by introducing hot holes induced by interband tunnel current, into the polysilicon film 51. Reading is performed by monitoring drain current or drain voltage in order to detect as to whether the threshold voltage is high or low, which is caused by the presence or absence of electrons in the polysilicon film 51.

Thus, in the non-volatile semiconductor memory of the third preferred embodiment, the polysilicon film 51 capable of storing electrons therein is disposed only in the end portions of the gate insulating film 50. Further, the gate insulating film 50 is formed by a silicon oxide film having a lower trap density than the silicon nitride film of the ONO film 5. Therefore, even if the memory cell transistors are repeatedly operated, they are less susceptible to miniaturization of WINDOW due to hopping of electrons. This permits accurate reading of the stored contents of the memory cell transistors.

Figure 35:
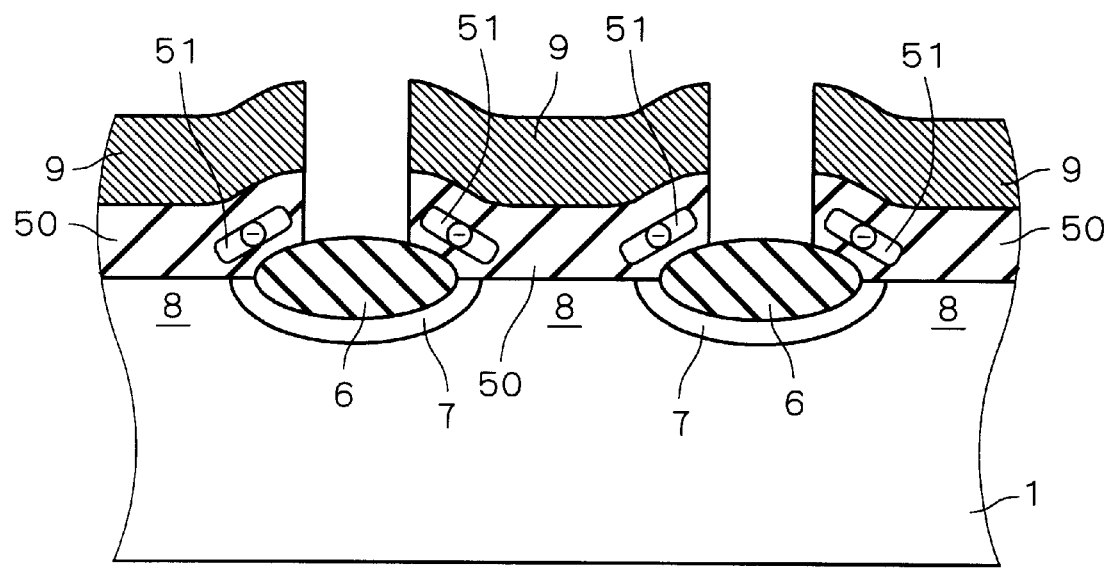
FIG. 35 is a sectional view illustrating a memory cell transistor structure of a non-volatile semiconductor memory according to a first modification of the third preferred embodiment.

FIG. 35 is a sectional view illustrating a memory cell transistor structure in a non-volatile semiconductor memory according to a first modification of the third preferred embodiment. This non-volatile semiconductor memory is obtained by applying the invention of the third preferred embodiment to the non-volatile semiconductor memory of the first preferred embodiment shown in FIGS. 3 and 4. With this non-volatile semiconductor memory, the effect of the invention according to the first preferred embodiment and the effect of the invention according to the invention of the third preferred embodiment are both obtainable.

Figure 36:
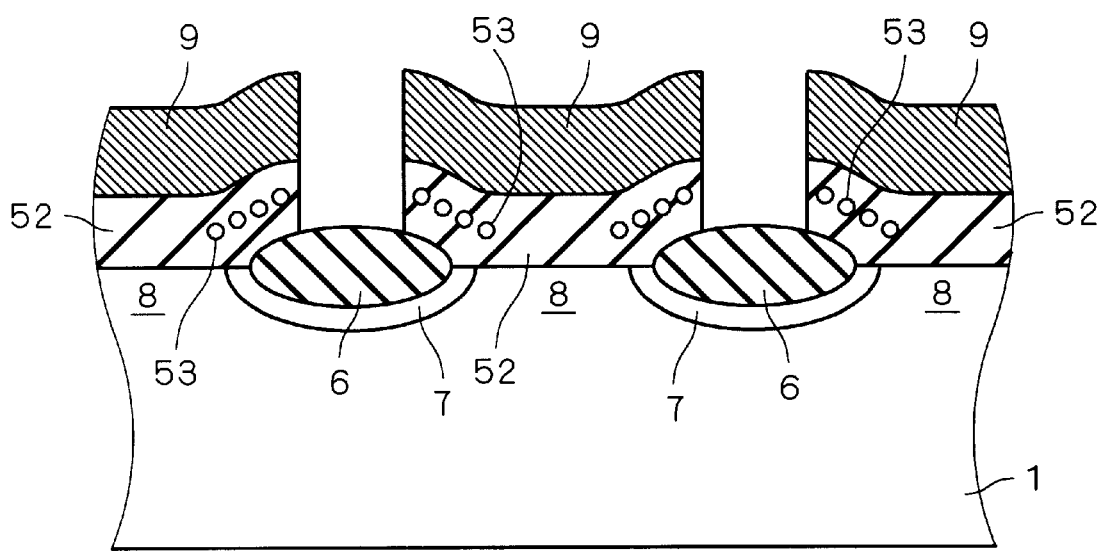
FIG. 36 is a sectional view illustrating a memory cell transistor structure of a non-volatile semiconductor memory according to a second modification of the third preferred embodiment.

FIG. 36 is a sectional view illustrating a memory cell transistor structure in a non-volatile semiconductor memory according to a second modification of the third preferred embodiment. This non-volatile semiconductor memory is characterized in that instead of the polysilicon film 51 of FIG. 34, a plurality of dotted silicon 53 are disposed in the end portions of a gate insulating film 52. These silicon 53 function as a floating gate, and can store charge. The gate insulating film 52 is formed by a silicon oxide film. Although FIG. 36 illustrates the case that four silicon 53 are disposed in the end portions of the gate insulating film 52, the number of the silicon 53 to be formed is not limited thereto. In place of the silicon 53, silicon nitride or oxide nitride silicon (SiON) may be formed.

Figure 37:
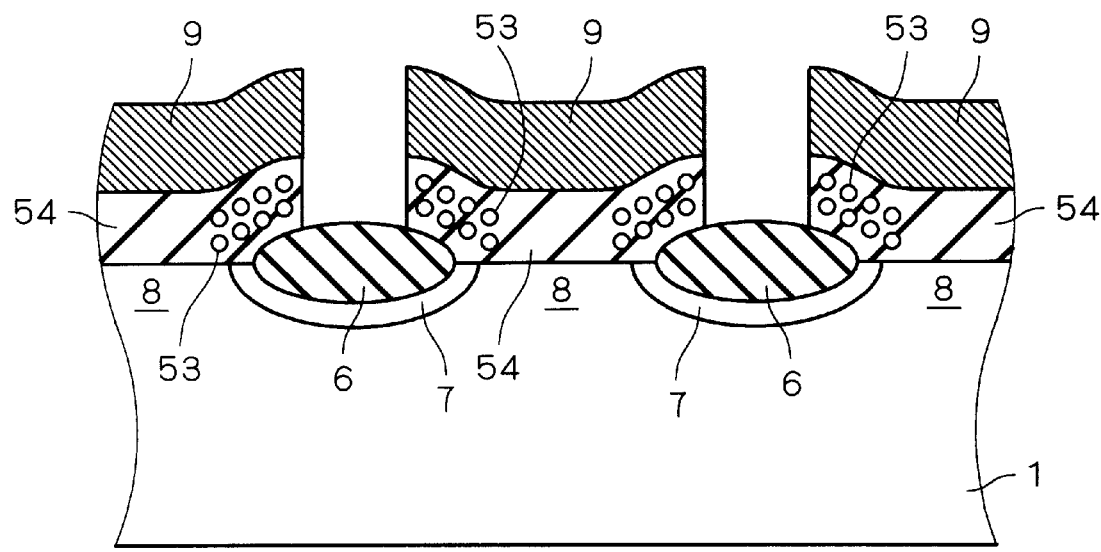
FIG. 37 is a sectional view illustrating a memory cell transistor structure of a non-volatile semiconductor memory according to a third modification of the third preferred embodiment.

FIG. 37 is a sectional view illustrating a memory cell transistor structure in a non-volatile semiconductor memory according to a third modification of the third preferred embodiment. This non-volatile semiconductor memory is characterized in that silicon 53 is disposed in two layers in the end portions of a gate insulating film 54 composed of a silicon oxide film, in the non-volatile semiconductor memory of FIG. 36.

Figure 38:
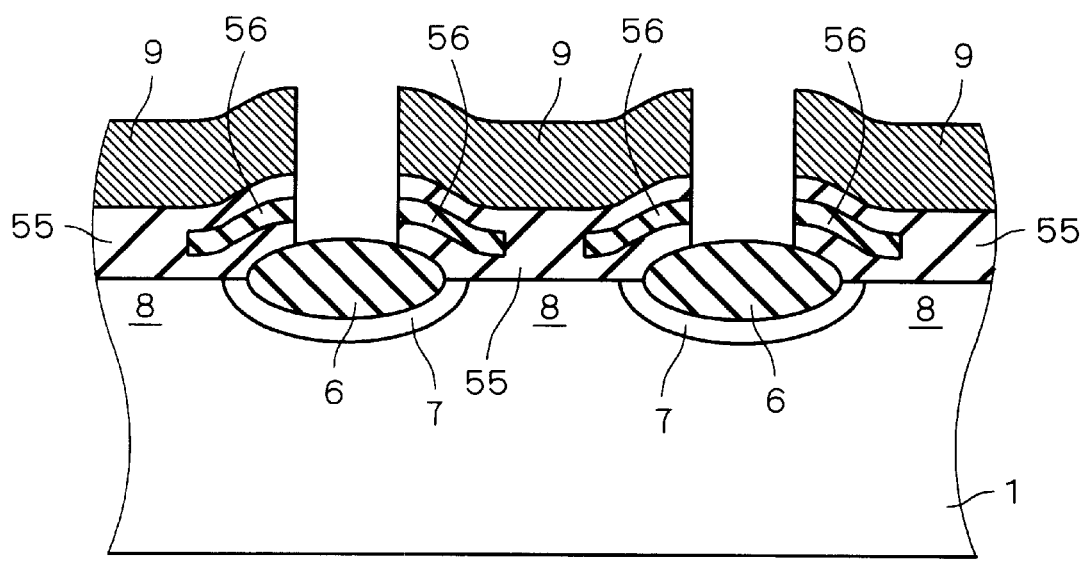
FIG. 38 is a sectional view illustrating a memory cell transistor structure of a non-volatile semiconductor memory according to a fourth modification of the third preferred embodiment.

FIG. 38 is a sectional view illustrating a memory cell transistor structure in a non-volatile semiconductor memory according to a fourth modification of the third preferred embodiment. This non-volatile semiconductor memory is characterized in that instead of the polysilicon film 51 of FIG. 34, a silicon nitride film 56 is disposed in the end portions of a gate insulating film 55 composed of a silicon oxide film. In place of the silicon nitride film 56, a silicon oxide nitride film may be disposed. Unlike the polysilicon 51 and silicon 53, the silicon nitride film 56 (or silicon oxide nitride film) stores charge at traps.

Even with the non-volatile semiconductor memory of the second, third or fourth modification of the third preferred embodiment, the effect of suppressing the miniaturization of WINDOW is also obtainable.

Figure 39:
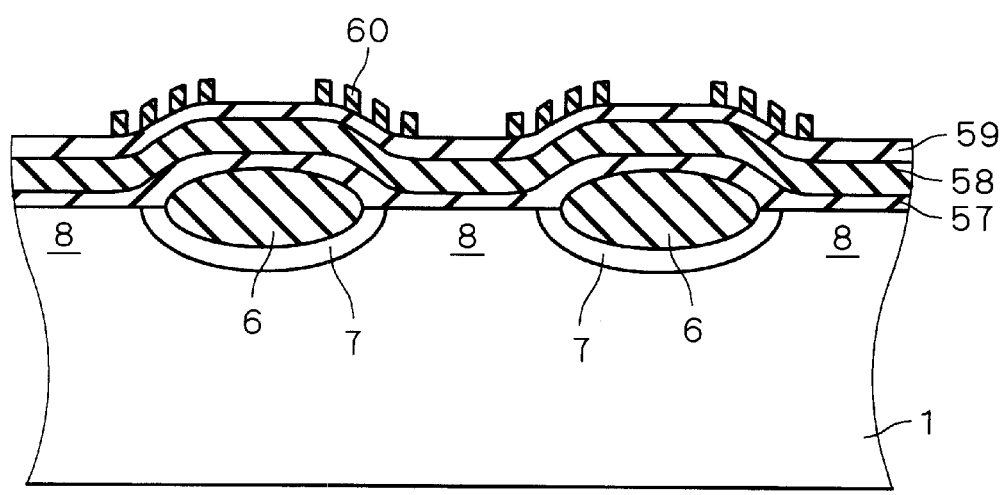
FIGS. 39 and 40 are sectional views illustrating the steps in sequence in a method of forming a gate insulating film shown in FIG. 36.
Figure 40:
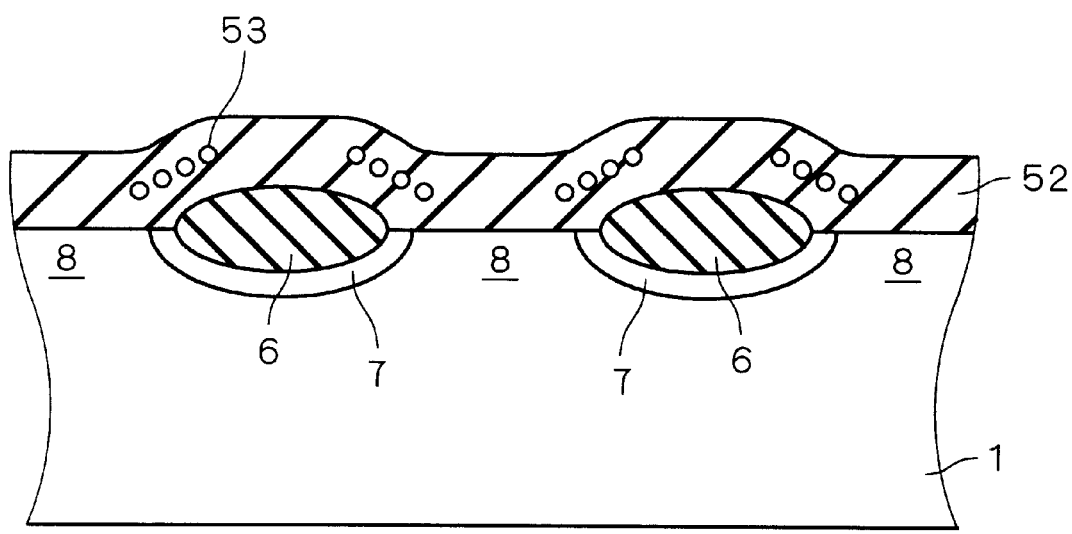

FIGS. 39 and 40 are sectional views illustrating in sequence the steps in a method of forming the gate insulating film 52 shown in FIG. 36. Referring to FIG. 39, first, an isolation insulating film 6, impurity diffusion region 7 and channel region 8 are formed in a silicon substrate 1. Then, a silicon oxide film 57, amorphous silicon film 58 and silicon oxide film 59 are formed in this order on the entire surface. A silicon nitride film is formed on the entire surface of the silicon oxide film 59, and the silicon nitride film is then patterned to form a silicon nitride film 60.

Referring to FIG. 40, the amorphous silicon film 58 is then oxidized in an oxidizing atmosphere. An oxidant is allowed to diffuse in the silicon oxide film 59 and reach the amorphous silicon film 58, thereby oxidizing the amorphous silicon film 58. At this time, no oxidant reaches the portion of the amorphous silicon film 58, which is located below the silicon nitride film 60. Therefore, that portion of the amorphous silicon 58 is not subjected to oxidation, and remains as silicon 53. The silicon nitride film 60 is then removed.

Figure 41:
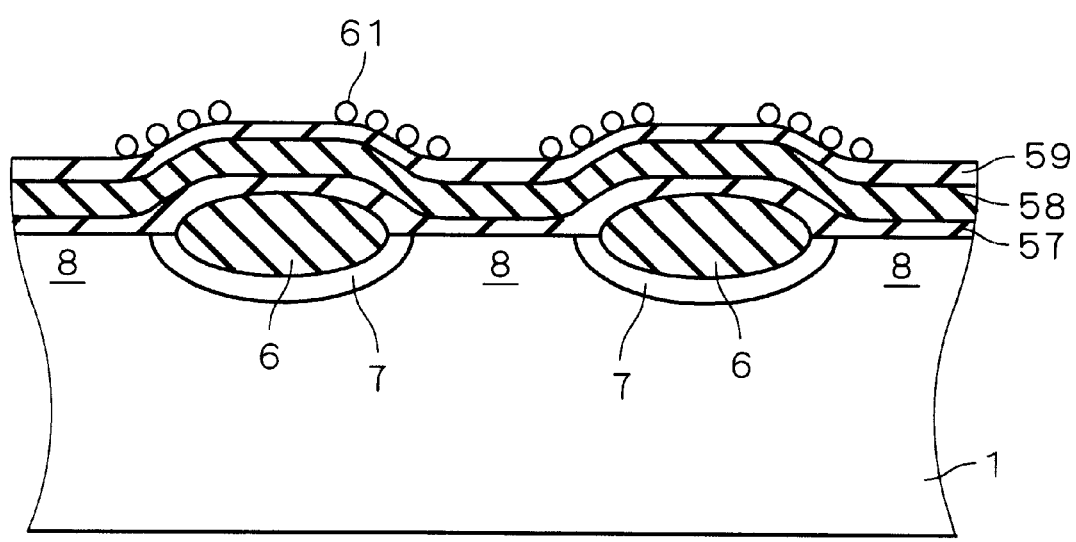
FIGS. 41 and 42 are sectional views illustrating the steps in sequence in a method of forming a gate insulating film shown in FIG. 37.
Figure 42:
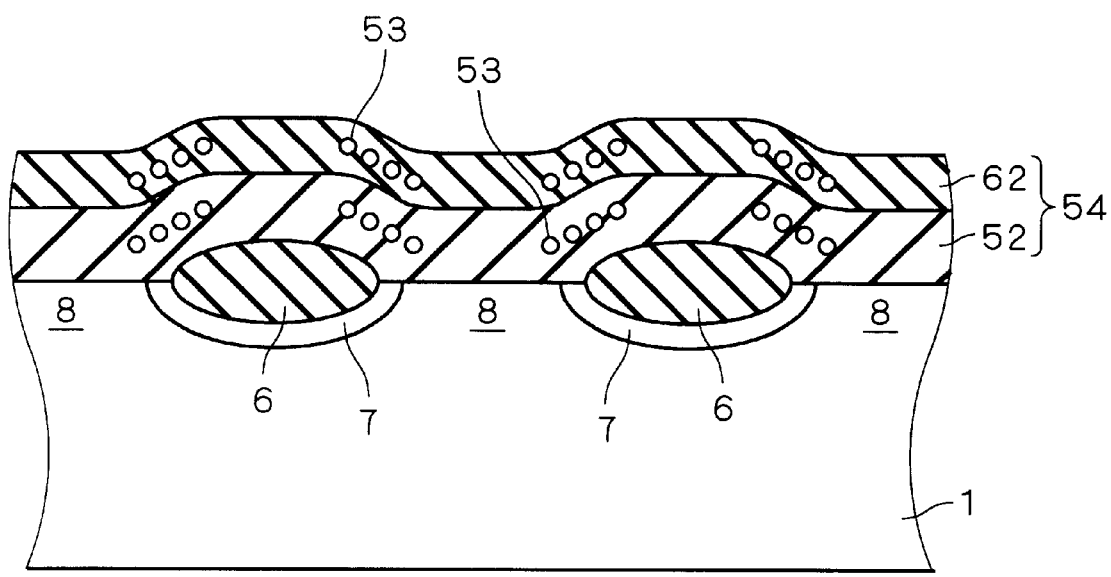

FIGS. 41 and 42 are sectional views illustrating in sequence the steps in a method of forming the gate insulating film 54 shown in FIG. 37. Referring to FIG. 41, first, an isolation insulating film 6, impurity diffusion region 7 and channel region 8 are formed in a silicon substrate 1. Then, a silicon oxide film 57, amorphous silicon film 58 and silicon oxide film 59 are formed in this order on the entire surface. Dotted silicon 61 are deposited on the entire surface of the silicon oxide film 59, and the unnecessary portions of the silicon 61 are then removed by patterning.

Referring to FIG. 42, the amorphous silicon film 58 is then oxidized in an oxidizing atmosphere. As set forth, an oxidant diffuses in the silicon oxide film 59 and reaches the amorphous silicon film 58, thereby oxidizing the amorphous silicon film 58. At this time, no oxidant reaches the portion of the amorphous silicon film 58, which is located below the silicon 61. Therefore, that portion of the amorphous silicon 58 is not subjected to oxidation, and remains as silicon 53. The surface of the silicon 61 is subjected to oxidation, resulting in silicon 53. Thereafter, a silicon oxide film is deposited on the entire surface, thereby forming a silicon oxide film 62.

Fourth Preferred Embodiment

FIG. 43 is a block diagram illustrating the overall configuration of a non-volatile semiconductor memory according to a fourth preferred embodiment. A plurality of memory cells are arranged in the form of a matrix in a memory cell array part 70. As shown in FIG. 43, memory cell $MC_{m \cdot even}$ and memory cell $MC_{m \cdot odd}$ belong to the same row in the matrix and are also memory cells adjacent each other in the row direction. A sub-word line $WL_{m(even)}$ is connected to the memory cell $MC_{m \cdot even}$, and a sub-word line $WL_{m(odd)}$ is connected to the memory cell $MC_{m \cdot odd}$. Bit lines $BL_{n-1}$ and $BL_n$ are connected to the memory cell $MC_{m \cdot even}$, and bit lines $BL_n$ and $BL_{n+1}$ are connected to the memory cell $MC_{m \cdot odd}$. The sub-word line $WL_{m(even)}$ and sub-word line $WL_{m(odd)}$ are connected to a row driver 72. The bit lines $BL_{n-1}$, $BL_n$ and $BL_{n+1}$ are connected to a bit detecting circuit 73. The bit detecting circuit 73 is made up of a known sense amplifier and the like. A row decoder 71 is connected to the row driver 72.

A parity check circuit 81 is connected to the row decoder 71. The parity check circuit 81 detects the parity of a column address and provides the result of the detection, i.e., a parity detecting signal PS, to the row decoder 71 (or the row driver 72). The non-volatile semiconductor memory of the fourth preferred embodiment is characterized in that two sub-word lines $WL_{m(even)}$ and $WL_{m(odd)}$, to which the same row address is provided, are disposed in the memory cell array part 70, and that either of the sub-word lines $WL_{m(even)}$ and $WL_{m(odd)}$ is selected based on the parity detecting signal PS.

In a row address buffer 78 and a column address buffer 79, a binary N-bit external address signal $A_i$ inputted from the external to an address terminal is converted to an N-pair of internal address signals ai, $\overline{ai}$, which are then inputted to the row decoder 71 and column decoder 74. As storage capacity is increased, the number of address terminals is increased. This results in the problem of increasing the package size. For the purpose of solving this, an address signal multiplex system has been proposed. In this system, an address terminal is shared between the row system and column system, and two external synchronous clocks $\overline{RAS}$, $\overline{CAS}$ are supplied in a time series fashion, thereby attaining time division sharing. Many NROM chips are often used as main memory and the like in one memory system. Therefore, the miniaturization of the package leads to the miniaturization of the overall system. Hence, the address signal multiplex system is employed in particularly memory to be mounted on portable equipment, etc.

Operation in the address signal multiplex system will be described hereinafter. An external address signal $A_i$ is firstly synchronized with $\overline{RAS}$, and applied to the row address buffer 78, which converts this signal to internal address signals (row address signals) ai, $\overline{ai}$. These signals are then sent to a row decoder 71 which, based on the row address signals ai, $\overline{ai}$, selects one row (which is taken here to be $WL_m$) among a plurality of rows in a memory cell array part 70.

When the latch of the external address signal $A_i$ is completed in the row address buffer 78, a latch completion signal LCH is inputted from the row address buffer 78 to the column address buffer 79, thereby applying the external address signal $A_i$ to the column address buffer 79. The buffer 79 converts this signal to internal address signals (column address signals) ai, $\overline{ai}$. These signals are then sent to a row decoder 74, an ATD (address transition detector) circuit 82 and a parity check circuit 81. Based on the column address signals ai, $\overline{ai}$, the column decoder 74 selects one column among a plurality of columns in the memory cell array part 70.

The parity check circuit 81 detects, based on, e.g., LSB (least significant bit) of the row address signals ai, $\overline{ai}$, its parity and inputs its result, i.e., a parity detecting signal PS, to the row decoder 71. Based on the parity detecting signal PS, the row decoder 71 selects one sub-word line (strictly speaking, a logic gate corresponding to the sub-word line) from two sub-word lines $WL_{m(even)}$ and $WL_{m(odd)}$ contained in the already selected row $WL_m$. Specifically, when the content of the parity detecting signal PS is "even", the $WL_{m(even)}$ is selected, and when it is "odd", the $WL_{m(odd)}$ is selected. For instance, when the logic gate corresponding to the sub-word line $WL_{m(even)}$ is selected, the row driver 72 connected thereto is activated, and a predetermined voltage is applied to the corresponding sub-word line $WL_{m(even)}$.

After the latch completion signal LCH is inputted, the column address buffer 79 can always accept a column address signal without being restricted by $\overline{CAS}$. The address signal after a certain period of time is elapsed since $\overline{RAS}$ is inputted, is regarded as significant column address signal, and a column decoder 74 is selected without being restricted by $\overline{CAS}$, so that the signal is sent to an output buffer 76. At this final stage, synchronization with $\overline{CAS}$ is established for the first time, and $Dout_R$ and $DOUt_L$ are outputted. Reference numerals $Dout_R$ and $Dout_L$ mean the information of bit R and bit L of the memory cell of each address.

It is therefore able to omit the time taken to establish synchronization with $\overline{CAS}$ at the initial stage of circuits in the series of columns. Therefore, the access time taken from the application of a column address signal to the output of data can be reduced by the mentioned omission of the time. The function of $\overline{CAS}$ is merely to apply a column latch signal and latch the column latch signal, and the control of $\overline{CAS}$ is conducted at the final stage, thus exerting no direct influence on the access time. Note that an ATD circuit 82 for detecting transition of the column address signal becomes a necessity, and an output pulse $\overline{EQ}$ from the ATD circuit 82 controls the circuits in the series of columns. The output pulse $\overline{EQ}$ occurs every time the column address signal is changed. A variety of pulses generated based on this pulse are used to control the circuits in the series of columns. AND circuit 83 receives the pulse $\overline{EQ}$ and a cell amplify completion signal YE to be outputted from a buffer 77. Then the AND circuit 83 outputs an output signal CY to activate a column driver 75.

Thus, with the non-volatile semiconductor memory of the fourth preferred embodiment, the parity check circuit 81 detects the parity of a column address signal and selects, based on the result of the detection, i.e., a parity detecting signal PS, either of the sub-word lines $WL_{m(even)}$ and $WL_{m(odd)}$. This enables realizing selection operation of sub-word lines in the non-volatile semiconductor memory according to the foregoing first preferred embodiment.

Fifth Preferred Embodiment

Figure 44:
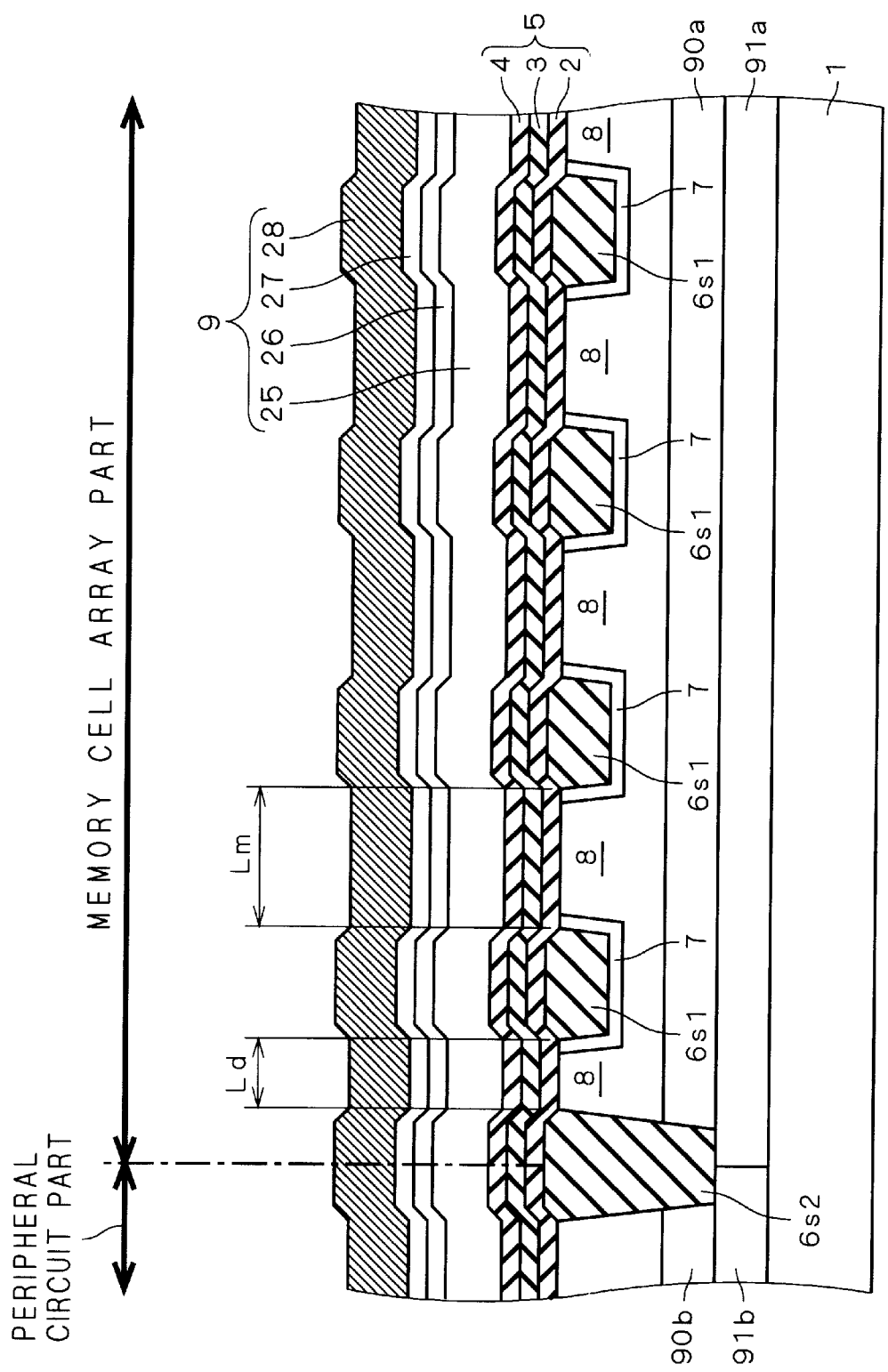
FIG. 44 is a sectional view illustrating a non-volatile semiconductor memory structure according to a fifth preferred embodiment.

FIG. 44 is a sectional view illustrating a non-volatile semiconductor memory structure according to a fifth preferred embodiment. In a memory cell array part, a STI (shallow trench isolation) 6s1 is disposed instead of the LOCOS type isolation insulating film 106 of the conventional non-volatile semiconductor memory shown in FIG. 62. $N^+$ type impurity diffusion region 7 functioning as bit lines BL, is disposed at the interface portion between a silicon substrate 1 and the STI 6s1. STI 6s2 deeper than the STI 6s1 is disposed at the interface portion between the memory cell array part and a peripheral circuit part. Although not shown in FIG. 44, an isolation insulating film of the peripheral circuit part is also STI, and its depth is the same as that of the STI 6s1 or STI 6s2.

A punch-through stopper layer 90a and a channel stopper layer 91a, each being of p-type, are formed in the silicon substrate 1 located at the memory cell array part. The punch-through stopper layer 90a is disposed for preventing punch-through between the source and drain of a MOS transistor. The channel stopper 91a is disposed for increasing the threshold voltage of a parasitic MOS transistor, in order to prevent leakage between elements.

A punch-through stopper layer 90b and a channel stopper layer 91b are formed in the silicon substrate 1 located at the peripheral circuit part. These layers are of n-type in the region where a P type MOS transistor is disposed, and are of p-type in the region where an N type MOS transistor is disposed.

FIG. 44 illustrates the case that the punch-through stopper layer 90a has the same forming depth as the punch-through stopper layer 90b, and the channel stopper layer 91a has the same forming depth as the channel stopper layer 91b. It is however necessarily required that these layers have the same forming depth. For instance, the punch-through stopper layer 90a and channel stopper layer 91a in the memory cell array part may be shallower than the punch-through stopper layer 90b and channel stopper layer 91b in the peripheral circuit part.

A dummy cell is disposed at the end portion of the memory cell array part located at the boundary portion with the peripheral circuit part. In a region having a large pattern density difference, such density difference increases a large variation in finished shape during the transferring and arranging steps. Pattern density difference is large at the boundary portion of the peripheral circuit part and memory cell array part. Forming a dummy cell at the boundary portion with the peripheral circuit part can avoid that the usual memory cell finished shape is subjected to the influence of the density difference. By making the channel length Ld of the dummy cell shorter than the channel length Lm of the usual memory cell, the area occupied by the dummy cell can be reduced to increase integration degree.

Thus, the non-volatile semiconductor memory of the fifth preferred embodiment has the feature that in the memory cell array part, the STI 6s1 is disposed instead of the LOCOS type isolation insulating film 106 of the conventional non-volatile semiconductor memory. In general, STI has a smaller bird's beak than LOCOS. Therefore, integration degree can be increased by the amount that using the STI 6s1 as an isolation insulating film reduces the area occupied by the bird's beak.

In addition, forming the STI 6s2 deeper than the STI 6s1 at the boundary portion of the memory cell array part and the peripheral circuit part can suppress interference between the memory cell and the peripheral circuit. This effect will be fully described as below. If in the peripheral circuit part, electrons as minority carrier are introduced into the p-type silicon substrate 1, the diffusion length of the electrons in the silicon substrate 1 is not less than 100 μm, the electrons diffuse to the memory cell array part. These electrons are captured by the potential well of the memory cells, and then accelerated by the peripheral high field of the impurity diffusion region 7, resulting in hot carriers which are to be introduced into the ONO film 5. Even if a small amount of electrons are introduced into the ONO film 5 at a time, when this is repeated a large number of times, the stored contents of the memory cells are broken. On the contrary, in some cases hot carriers caused by write or erase operation of the memory cells are diffused to the peripheral circuit part, resulting in the malfunction of the peripheral circuit. However, forming the deep STI 6s2 at the boundary portion between the memory cell array part and the peripheral circuit part, can suppress mutual diffusion of carriers, thereby suppressing interference of the memory cell and peripheral circuit.

Figure 45:
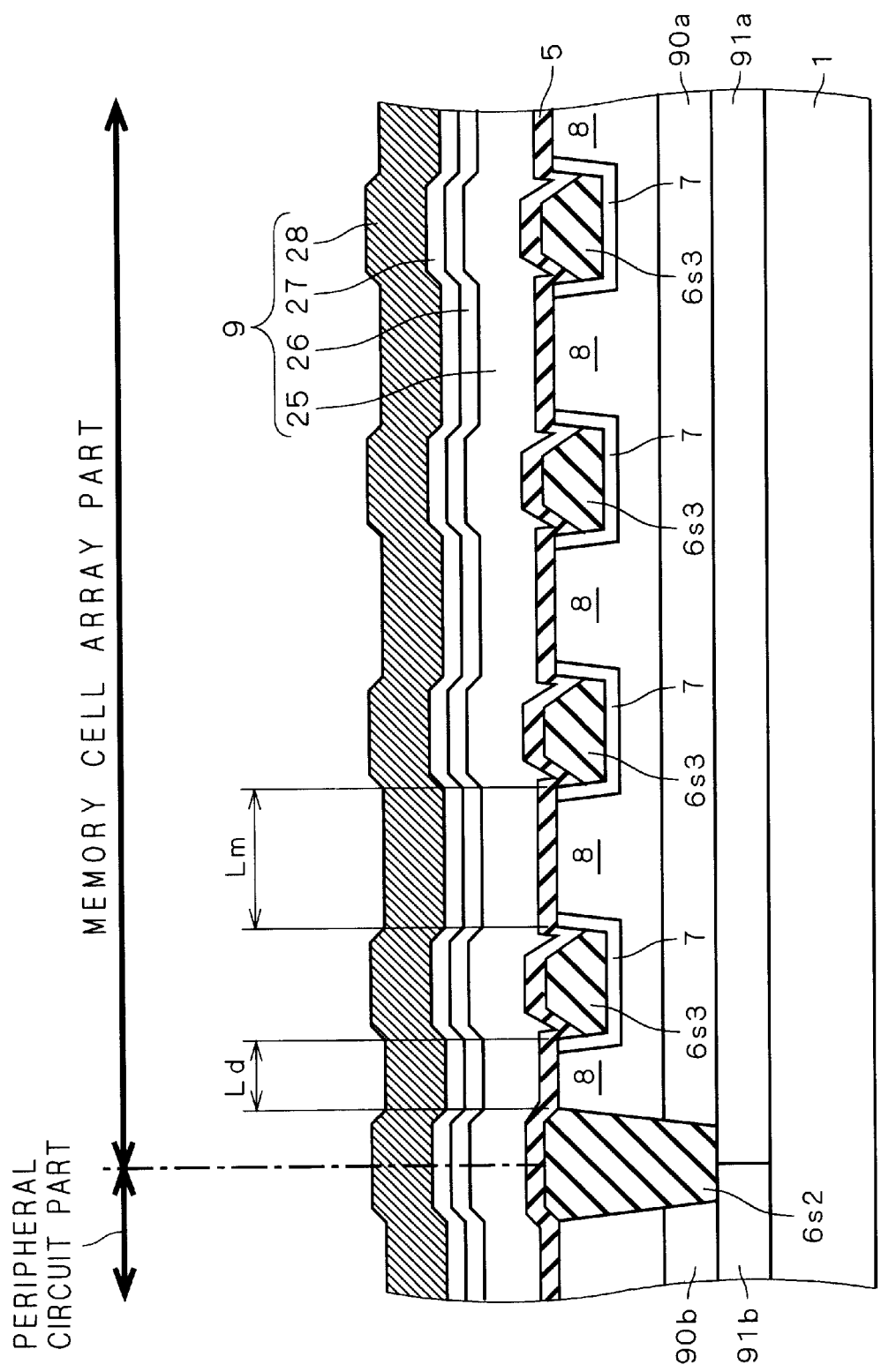
FIG. 45 is a sectional view illustrating a non-volatile semiconductor memory structure according to a first modification of the fifth preferred embodiment.

FIG. 45 is a sectional view illustrating a non-volatile semiconductor memory structure according to a first modification of the fifth preferred embodiment. This non-volatile semiconductor memory is characterized in that a STI 6s3 having a recess at the end portion of the upper surface is disposed instead of the STI 6s1 in FIG. 44. In this non-volatile semiconductor memory, part of a doped polysilicon film 25 is formed so as to fill the recess. Therefore, to part of an impurity diffusion region 7 which is in contact with the upper end portion of the STI 6s3, voltage is applied from two directions, namely from the sidewall of the STI 6s3 and from the upper surface of a silicon substrate 1. The field strength is therefore increased at such locations, and hot carriers of high energy are generated during write or erase operation. As a result, hot carriers can be efficiently introduced into an ONO film 5, thus permitting a reduction in write time and erase time.

Figure 46:
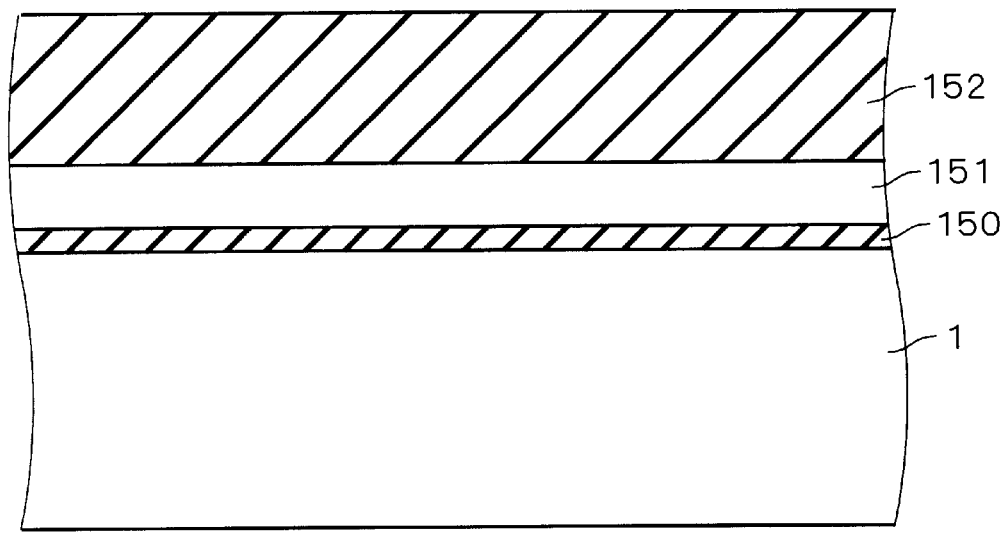
Figure 47:
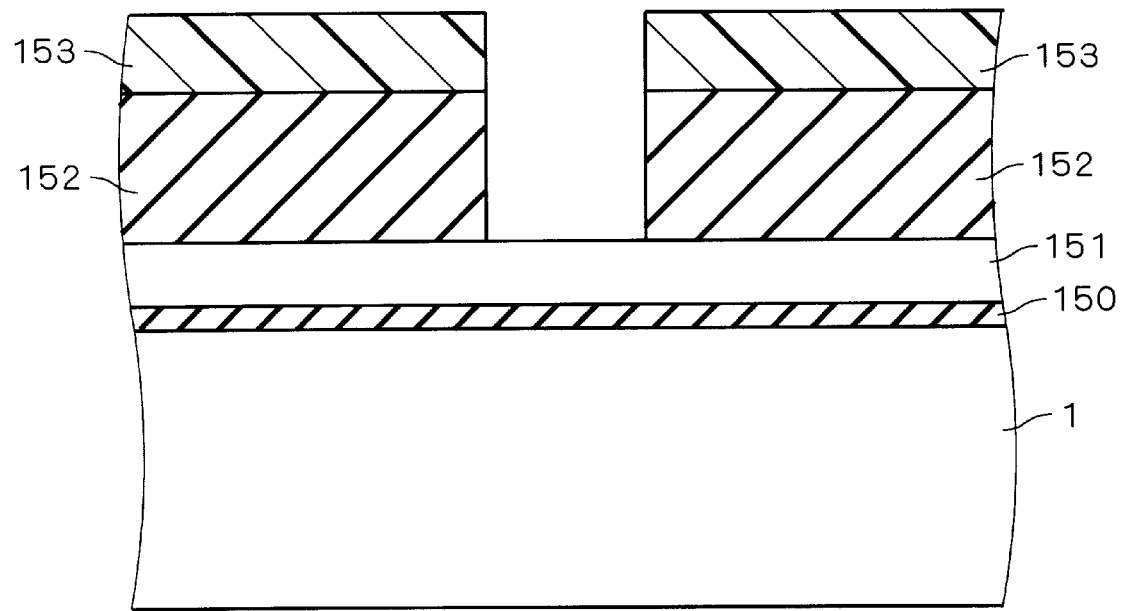

FIGS. 46 to 53 are sectional views illustrating in sequence the steps in a method of forming a STI 6s3. Referring to FIG. 46, firstly, a silicon oxide film 150, polysilicon film 151 and silicon nitride film 152 are formed in this order on the entire surface of a silicon substrate 1. Note that the polysilicon film 151 may be omitted. Referring to FIG. 47, a photoresist 153 is formed on the silicon nitride film 152. By using the photoresist 153 as an etching mask, the silicon nitride film 152 is removed by anisotropic etching method, until the upper surface of the polysilicon film 151 is exposed. Referring to FIG. 48, the photoresist 153 is then removed. By using the silicon nitride film 152 as an etching mask, the polysilicon film 151, silicon oxide film 150 and silicon substrate 1 are removed by anisotropic etching. Thereby, a trench 154 having a depth of about 200 to 400 nm is formed in the upper surface of the silicon substrate 1.

Figure 50:
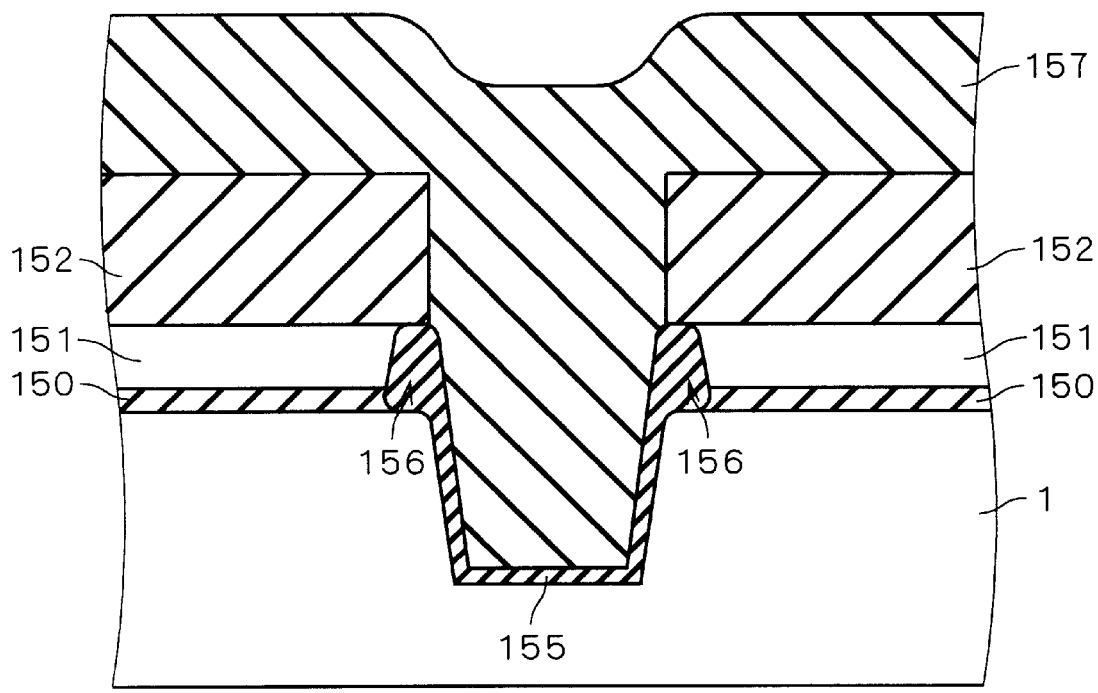
Figure 51:
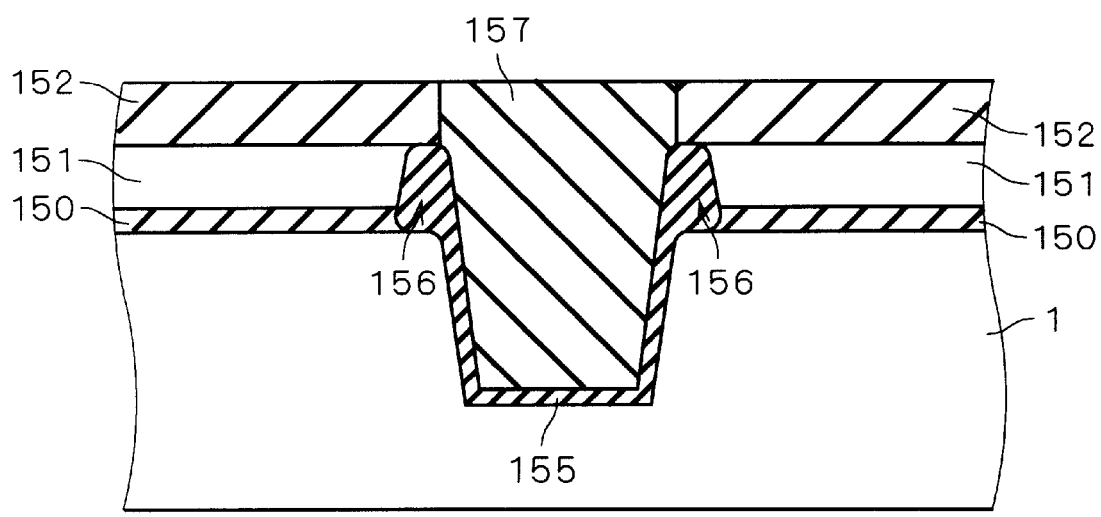

Referring to FIG. 49, the inner wall of the trench 154 is subjected to nitriding by performing heat treatment in a nitriding atmosphere. Then, a silicon oxide film 155 is formed on the inner wall of the trench 154 by thermal oxidation method. At this time, the upper surfaces of the polysilicon film 151 and silicon substrate 1 are also oxidized to form a bird's beak 156. Referring to FIG. 50, a silicon oxide film 157 is formed on the entire surface so as to fill the trench 154. Referring to FIG. 51, the upper surface of the silicon oxide film 157 is planarized by CMP method. This CMP is stopped while leaving the bottom portion of the silicon nitride film 152.

Referring to FIG. 52, the remaining silicon nitride film 152 and the polysilicon film 151 are then removed by etching. Referring to FIG. 53, the silicon oxide film 150 is then removed by etching. At this time, by increasing the over etching amount, a recess 158 located at a lower position than the upper surface of the silicon substrate 1 is formed in the bird's beak 156. The recess 158 can be formed easily in the absence of the polysilicon film 151. This is because the thickness of the bird's beak 156 is reduced in the absence of the polysilicon film 151.

Figure 54:
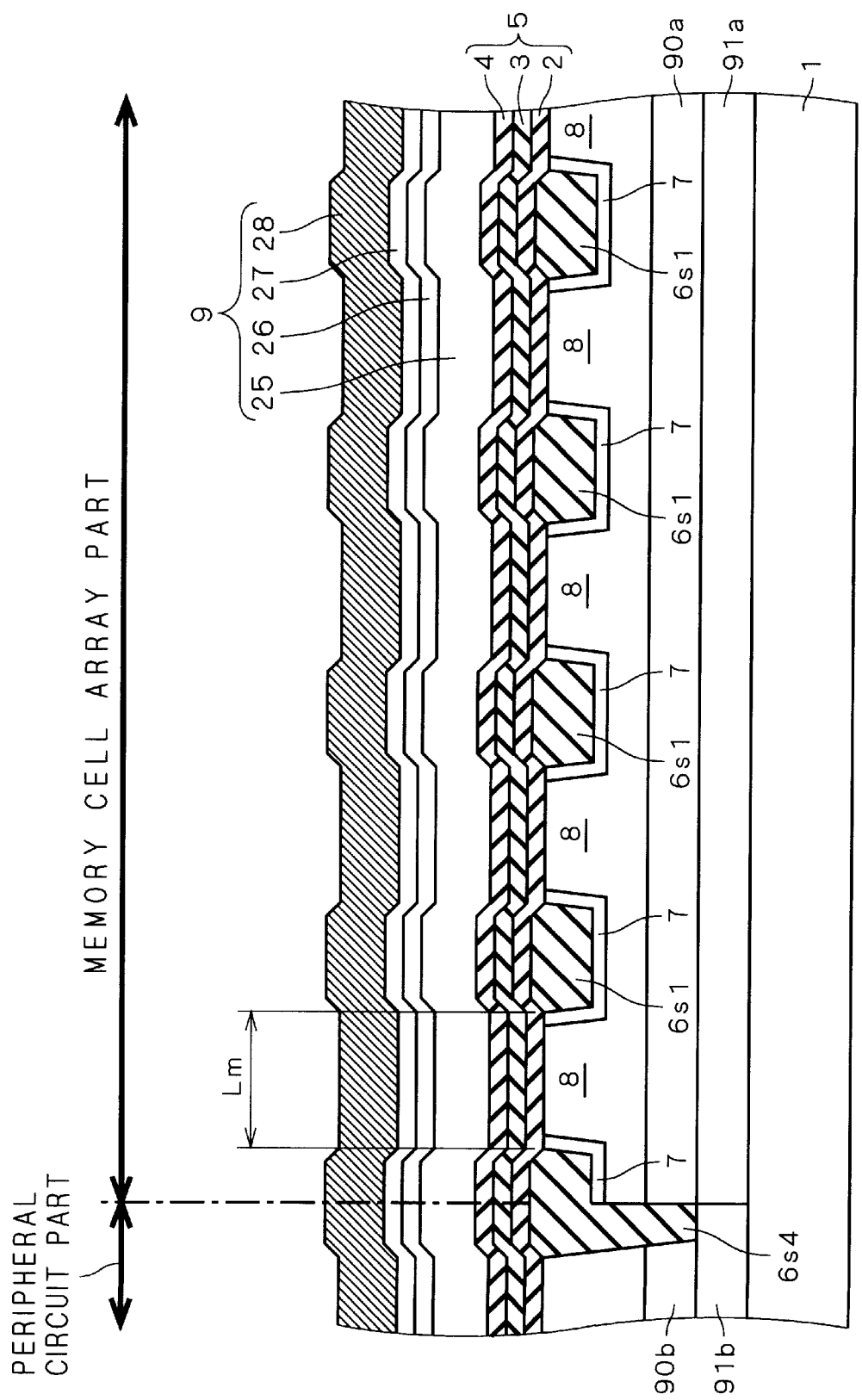
FIG. 54 is a sectional view illustrating a non-volatile semiconductor memory structure according to a second modification of the fifth preferred embodiment.

FIG. 54 is a sectional view illustrating a non-volatile semiconductor memory structure according to a second modification of the fifth preferred embodiment. This non-volatile semiconductor memory is characterized by omitting the dummy cell in the structure of FIG. 44. STI 6s4 is obtained by forming the STI 6s2 and STI 6s1 in FIG. 44 so as to make contact with each other. With this non-volatile semiconductor memory, the area of a memory cell array part can be reduced by the area occupied by a dummy cell because of the above mentioned omission.

Figure 55:
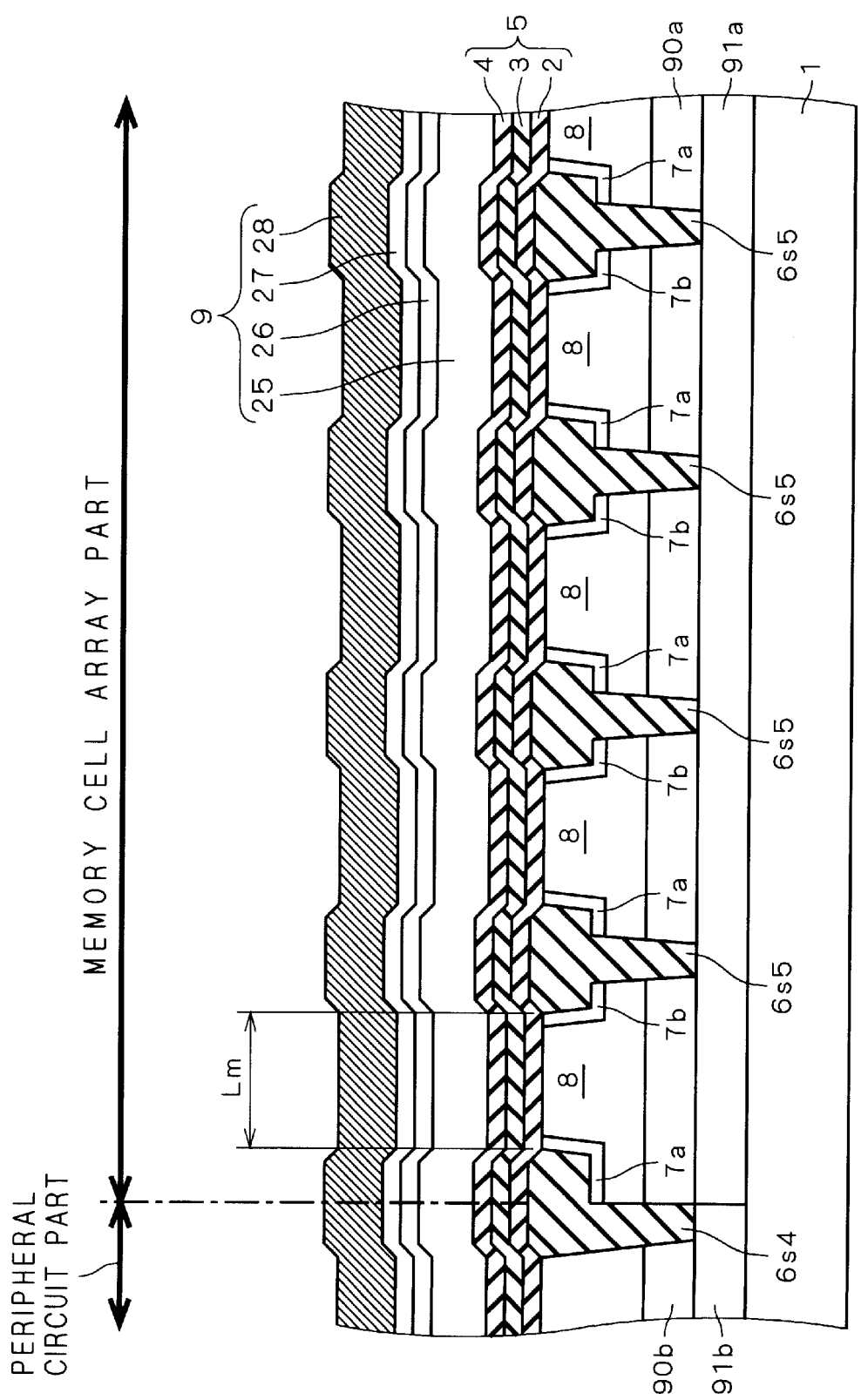
FIG. 55 is a sectional view illustrating a non-volatile semiconductor memory structure according to a third modification of the fifth preferred embodiment.

FIG. 55 is a sectional view illustrating a non-volatile semiconductor memory structure according to a third modification of the fifth preferred embodiment. This non-volatile semiconductor memory is characterized in that STI 6s5 is formed instead of the STI 6s1 in FIG. 54. The STI 6s5 has a cross section of substantially T-shape, and the central portion is deeper than the end portion. The central portion of the STI 6s5 divides an impurity diffusion region 7 into an impurity diffusion region 7a and an impurity diffusion region 7b. With this non-volatile semiconductor memory, the voltage application to the impurity diffusion region 7a and that to the impurity diffusion region 7b can be controlled independently. It is therefore able to completely prevent disturb failure during erase operation.

Figure 56:
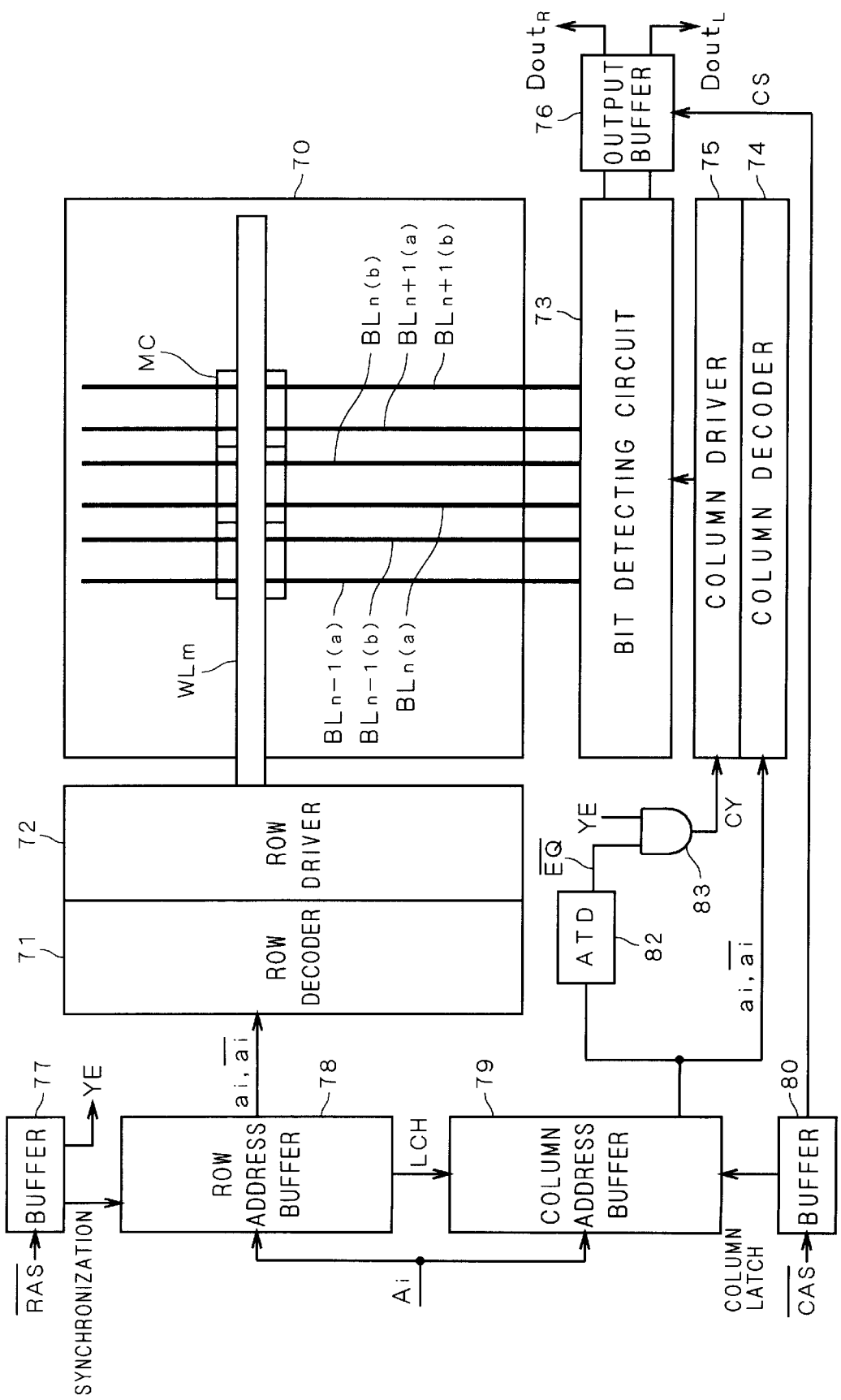
FIG. 56 is a block diagram illustrating the overall configuration of a non-volatile semiconductor memory in the third modification of the fifth preferred embodiment.

FIG. 56 is a block diagram illustrating the overall configuration of a non-volatile semiconductor memory according to a third modification of the fifth preferred embodiment. Sub-bit lines $BL_{n-1(a)}$, $BL_{n(a)}$, $BL_{n+1(a)}$ correspond to the impurity diffusion region 7a of FIG. 55. Sub-bit lines $BL_{n-1(b)}$, $BL_{n(b)}$, $BL_{n+1(b)}$ correspond to the impurity diffusion region 7b of FIG. 55. Column addresses for selecting bit lines and column sub-addresses for selecting sub-bit lines are stored in a column address buffer 79. ATD circuit 82 detects the transition of the column addresses and column sub-address. A column decoder 74 has the function of selecting a bit line based on a column address, and also selecting a sub-bit line based on a column sub-address. A column driver 75 applies a predetermined voltage to the sub-bit line corresponding to the column address and column sub-address selected by the column decoder 74.

Figure 57:
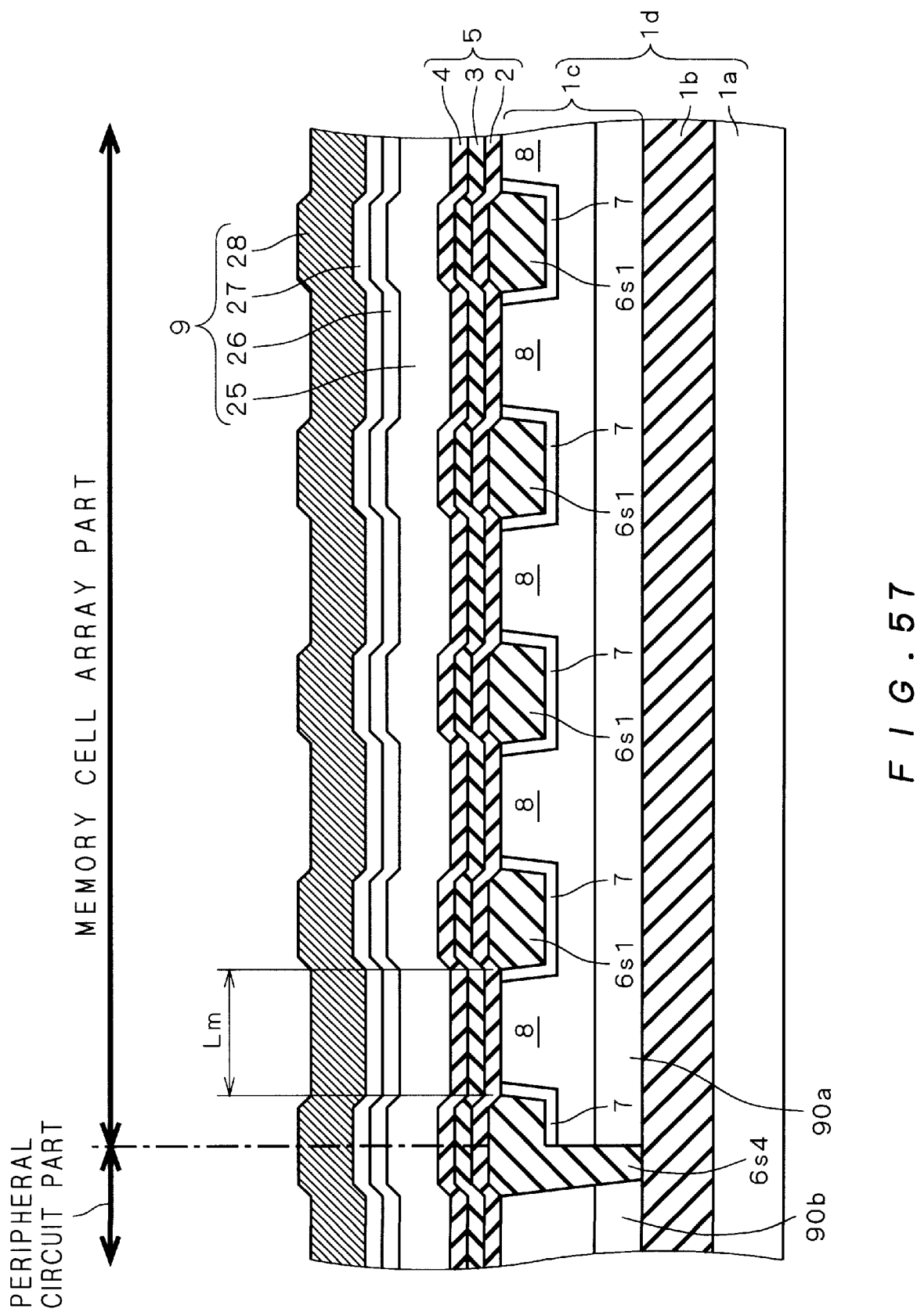
FIG. 57 is a sectional view illustrating a non-volatile semiconductor memory structure according to a fourth modification of the fifth preferred embodiment.

FIG. 57 is a sectional view illustrating a non-volatile semiconductor memory structure according to a fourth modification of the fifth preferred embodiment. This non-volatile semiconductor memory is characterized by employing an SOI (Silicon on Insulator) substrate 1d in place of the silicon substrate 1 shown in FIG. 54. The SOI substrate 1d has such a structure that a silicon substrate (support substrate) 1a, a buried oxide film 1b and a silicon layer 1c are stacked in this order. STIs 6s1, 6s4 and a channel region 8 are disposed in the silicon layer 1c of the SOI substrate 1d. The bottom surface of the STI 6s4 reaches the buried oxide film 1b of the SOI substrate 1d. With the non-volatile semiconductor memory of the fourth modification of the fifth preferred embodiment, there is the advantage that particularly in the peripheral circuit part, soft error due to cosmic rays such as neutron can be suppressed by employing the SOI substrate 1d. Further, since the bottom surface of the STI 6s4 reaches the buried oxide film 1b, the interference between the peripheral circuit part and the memory array part can be completely prevented.

Figure 58:
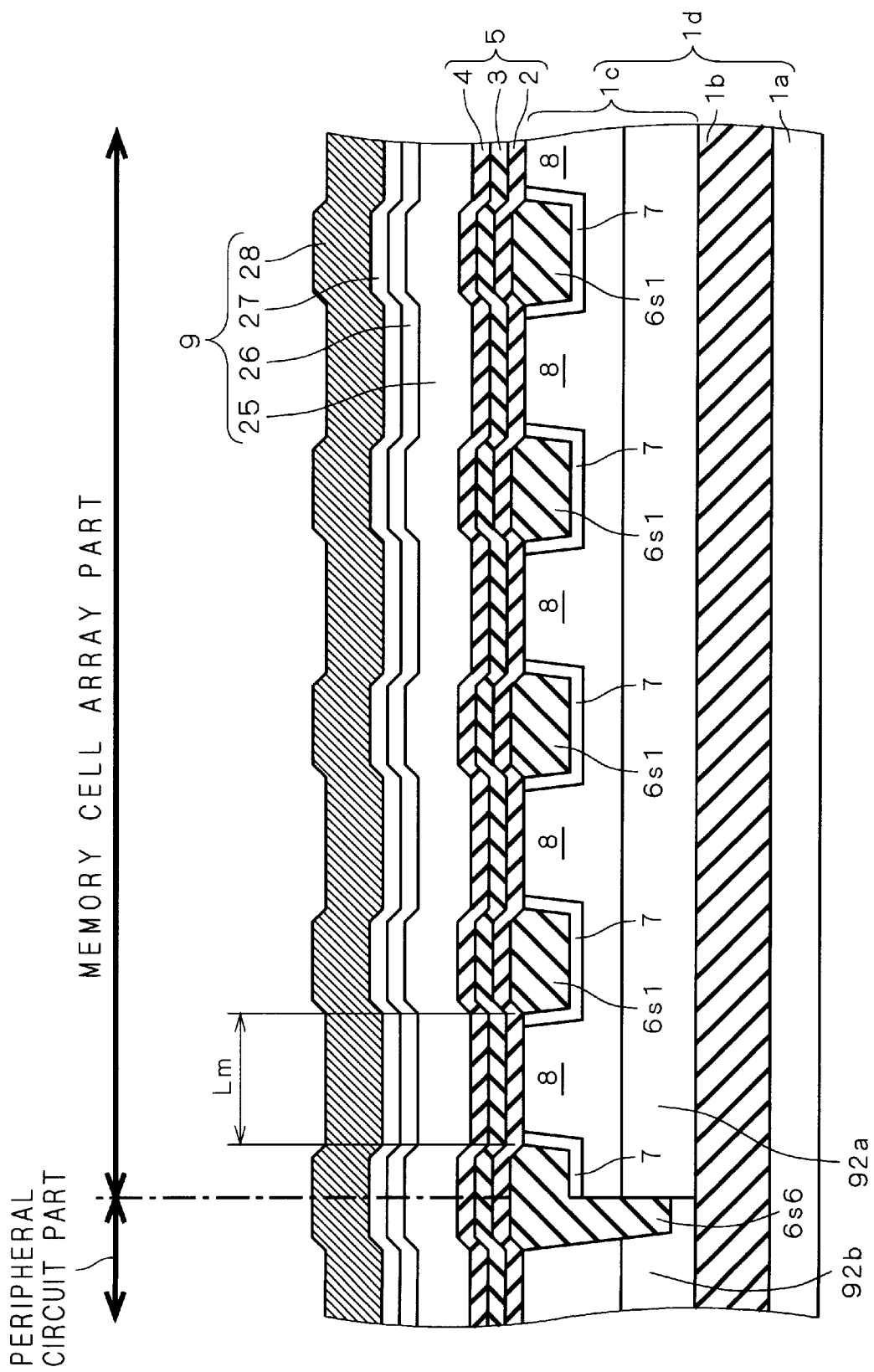
FIG. 58 is a sectional view illustrating a non-volatile semiconductor memory structure according to a fifth modification of the fifth preferred embodiment.

FIG. 58 is a sectional view illustrating a non-volatile semiconductor memory structure according to a fifth modification of the fifth preferred embodiment. This non-volatile semiconductor memory is characterized by employing an STI 6s6 in place of the STI 6s4 shown in FIG. 57. The bottom surface of the STI 6s6 does not reach a buried oxide film 1b of an SOI substrate 1d, and a silicon layer 1c is present between the bottom surface of the STI 6s6 and the upper surface of the buried oxide film 1b. An impurity diffusion layer 92a corresponds to the punch-through stopper layer 90a and the channel stopper layer 91a in FIG. 44. An impurity diffusion layer 92b corresponds to the punch-through stopper layer 90b and the channel stopper layer 91b in FIG. 44. With the non-volatile semiconductor memory of the fifth modification of the fifth preferred embodiment, the silicon layer 1c in the memory cell array part and the silicon layer 1c in the peripheral circuit part are electrically connected via the impurity diffusion layers 92a and 92b underlying the STI 6s6. Therefore, in fixing the potential of a body region of a MOSFET, the body potential of the memory cell array part and peripheral circuit part can be fixed by using a single body voltage generating circuit. That is, since the body voltage generating circuit can be shared between the memory cell array part and peripheral circuit part, the area occupied by the body voltage generating circuit can be reduced.

Figure 59:
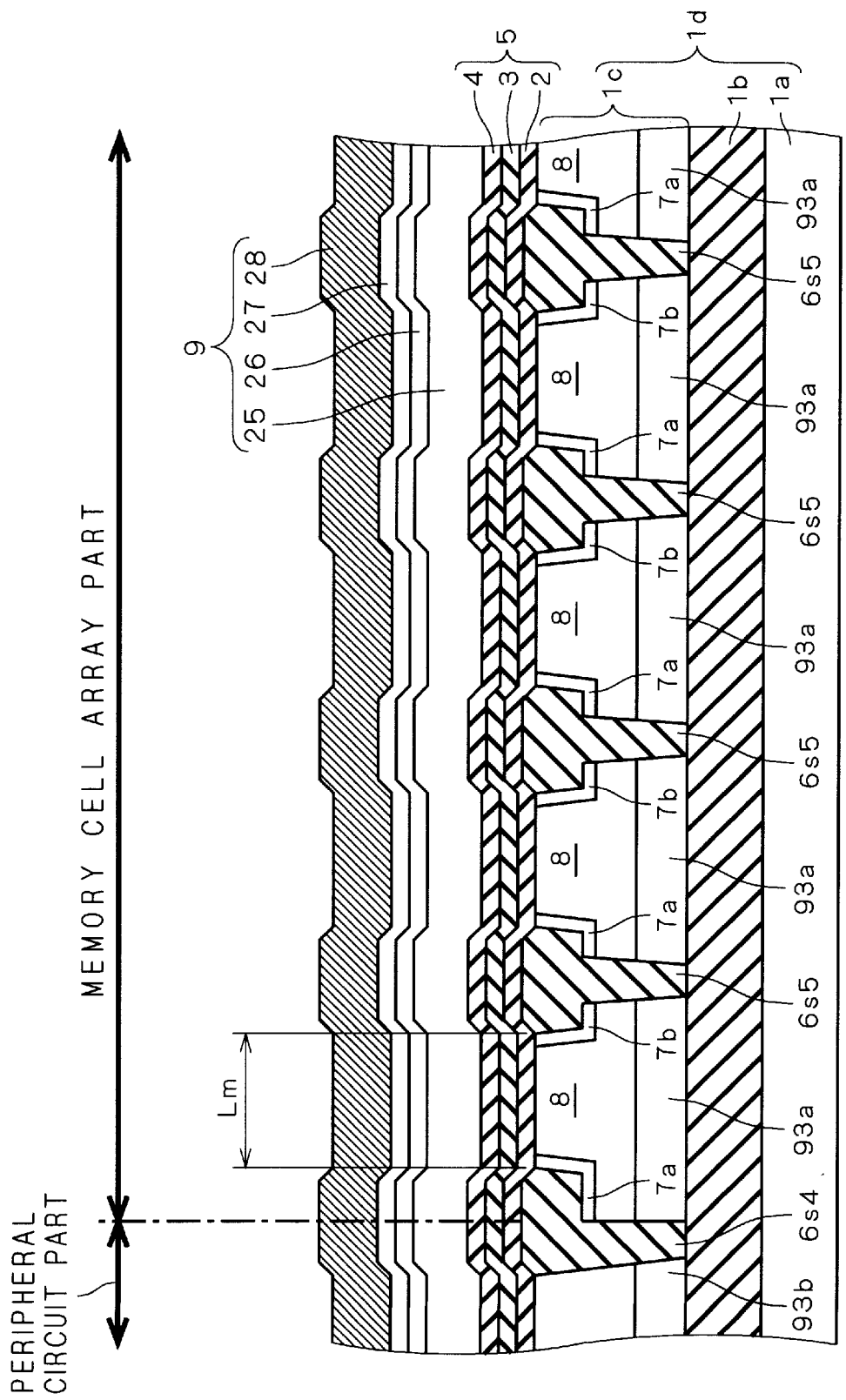
FIG. 59 is a sectional view illustrating a non-volatile semiconductor memory structure according to a sixth modification of the fifth preferred embodiment.

FIG. 59 is a sectional view illustrating a non-volatile semiconductor memory structure according to a sixth modification of the fifth preferred embodiment. This non-volatile semiconductor memory is characterized by employing an SOI substrate 1d in place of the silicon substrate 1 shown in FIG. 55. An impurity diffusion layer 93a corresponds to the punch-through stopper layer 90a and the channel stopper layer 91a in FIG. 44. An impurity diffusion layer 93b corresponds to the punch-through stopper layer 90b and the channel stopper layer 91b in FIG. 44. With the non-volatile semiconductor memory of the sixth modification of the fifth preferred embodiment, the effect of increasing resistance to soft error can be obtained, in addition to the effect of the non-volatile semiconductor memory shown in FIG. 55.

Figure 60:
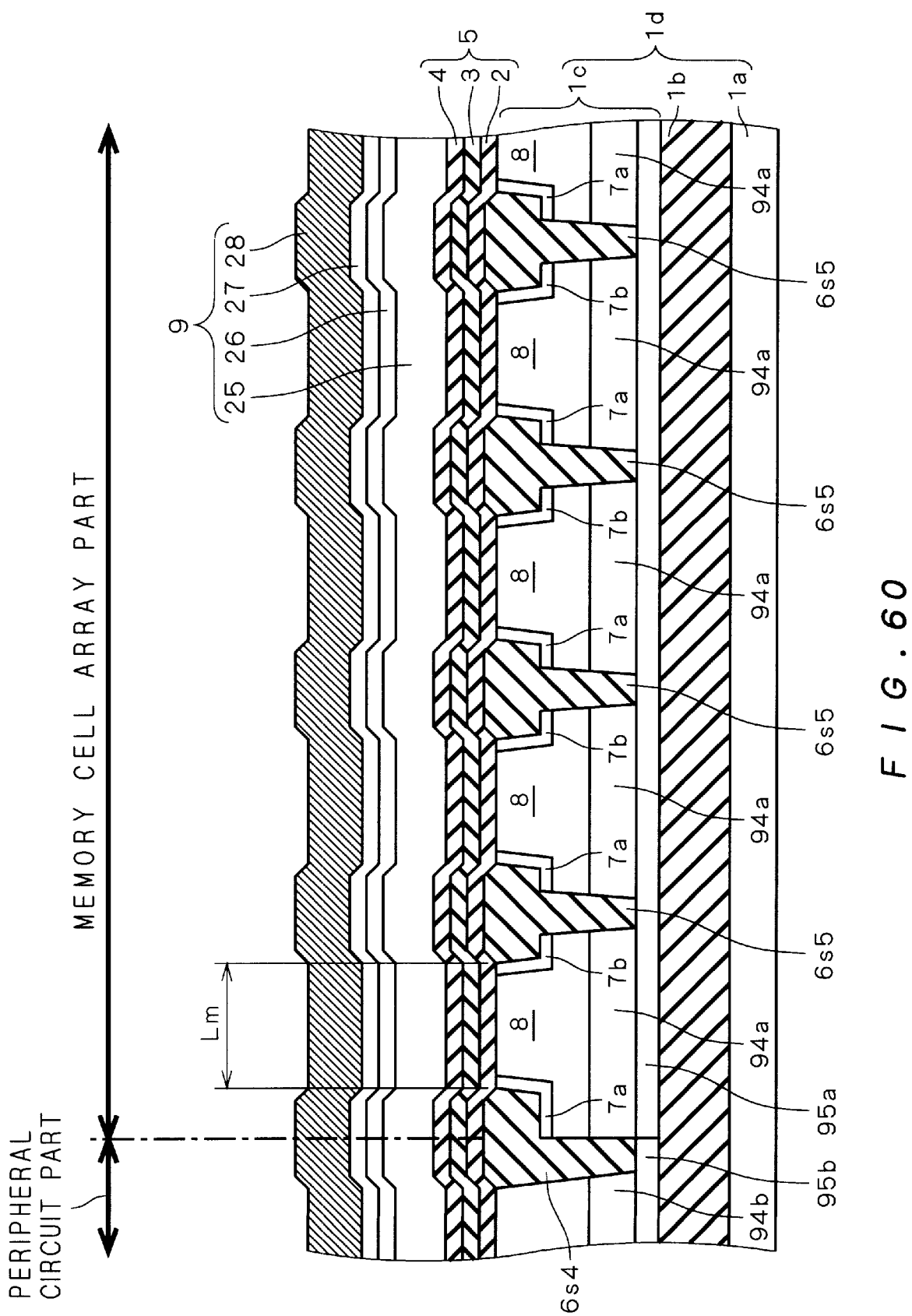
FIG. 60 is a sectional view illustrating a non-volatile semiconductor memory structure according to a seventh modification of the fifth preferred embodiment.

FIG. 60 is a sectional view illustrating a non-volatile semiconductor memory structure according to a seventh modification of the fifth preferred embodiment. This non-volatile semiconductor memory is characterized by forming a STI 6s5 with the bottom surface not reaching a buried oxide film 1b, in place of the STI 6s5 with the bottom surface reaching the buried oxide film 1b as shown in FIG. 59. Punch-through stopper layer 94a and 94b and channel stopper layers 95a and 95b are disposed in a silicon layer 1c. With the non-volatile semiconductor memory of the seventh modification of the fifth preferred embodiment, the effect of reducing the area occupied by a body voltage generating circuit can be obtained, in addition to the effect of the non-volatile semiconductor memory shown in FIG. 55.

Of course, the structure according to the foregoing first to fifth preferred embodiments and the structure according to the modifications of these embodiments can be arbitrarily combined for application. Similar effect is obtainable even if any of these structures is formed in an SOI substrate.

While the invention has been shown and described in detail, the foregoing description is in all aspects illustrative and not restrictive. It is therefore understood that numerous modifications and variations can be devised without departing from the scope of the invention.

What is claimed is:

1. A non-volatile semiconductor memory comprising:

a semiconductor substrate;

plural memory cell transistors disposed in the form of a matrix in said semiconductor substrate;

plural bit lines disposed at each column of said matrix; and plural word lines disposed at each row of said matrix;

wherein said word lines have plural sub-word lines; and gate electrodes of said memory cell transistors adjacent each other in the row direction of said matrix are connected to said sub-word lines different from each other.

2. The non-volatile semiconductor memory according to claim 1 further comprising:

an interlayer insulating film covering said memory cell transistors, wherein said sub-word lines extend in the row direction of said matrix and are disposed in said interlayer insulating film;

said gate electrodes are disposed on said semiconductor substrate via a gate insulting film capable of storing electrons, and are connected to said sub-word lines via a plug disposed in said interlayer insulating film; and a wide portion of said gate electrodes is disposed at a contact portion between said gate electrodes and said plug.

3. The non-volatile semiconductor memory according to claim 1 further comprising:

an interlayer insulating film covering said memory cell transistors, wherein said sub-word lines extend in the row direction of said matrix and are disposed in said interlayer insulating film;

said gate electrodes are disposed on said semiconductor substrate via a gate insulting film capable of storing electrons, and are connected to said sub-word lines via a plug disposed in said interlayer insulating film; and said plug is in contact with the central portion of said gate electrodes.

4. The non-volatile semiconductor memory according to claim 1 further comprising:

an interlayer insulating film covering said memory cell transistors, wherein said sub-word lines are disposed in said interlayer insulating film;

said gate electrodes are disposed on said semiconductor substrate via a gate insulting film capable of storing electrons, and are connected to said sub-word lines via a plug disposed in said interlayer insulating film; and said sub-word lines extend linearly in the row direction of said matrix.

5. The non-volatile semiconductor memory according to claim 1 wherein said bit lines have an impurity diffusion region extending in the column direction of said matrix and being disposed in said semiconductor substrate, further comprising:

an interlayer insulating film covering said memory cell transistors; and wiring extending in the column direction of said matrix and being disposed in said interlayer insulating film, said wiring being connected to said impurity diffusion region via a plug disposed in said interlayer insulating film and having higher conductivity than said impurity diffusion region.

6. The non-volatile semiconductor memory according to claim 1 wherein said sub-word lines extend in the row direction of said matrix and have a portion functioning as said gate electrodes of said memory cell transistors and overlying said semiconductor substrate via a gate insulating film capable of storing electrons, further comprising:

an interlayer insulating film covering said memory cell transistors; and wiring extending in the row direction of said matrix and being disposed in said interlayer insulating film, said wiring being connected to said sub-word lines via a plug disposed in said interlayer insulating film and having higher conductivity than said sub-word lines.

7. The non-volatile semiconductor memory according to claim 1 wherein said gate electrodes are disposed on a main surface of said semiconductor substrate via a gate insulating film having a charge storing region capable of storing charge;

said memory cell transistors further have source/drain regions disposed in said main surface of said semiconductor substrate; and said charge storing region is disposed only in the end portion of said gate insulating film adjacent to said source/drain regions.

8. The non-volatile semiconductor memory according to claim 7 wherein said gate insulating film is a silicon oxide film; and said charge storing region is a polysilicon film disposed in said silicon oxide film.

9. The non-volatile semiconductor memory according to claim 1 further comprising:

a detecting circuit to detect a bit line to be activated from said plural bit lines, based on a column address signal; and a selecting circuit to select a sub-word line to be activated from said plural sub-word lines, based on a row address signal and the result of detection of said detecting circuit.

10. The non-volatile semiconductor memory according to claim 1 wherein said word lines have two sub-word lines, further comprising:

a parity check circuit to detect the parity of a column address signal; and a selecting circuit to select one sub-word line to be activated from said two sub-word lines, based on a row address signal and the result of detection of said parity check circuit.

11. The non-volatile semiconductor memory according to claim 1 further comprising:

a first isolation insulating film of trench type being disposed in a main surface of said semiconductor substrate and isolating said memory cell transistors adjacent each other in the row direction of said matrix;

wherein said bit lines have an impurity diffusion region disposed in the interface between said semiconductor substrate and said first isolation insulating film.

12. The non-volatile semiconductor memory according to claim 11 wherein said semiconductor substrate has:

a memory cell array part in which said plural memory cell transistors are disposed; and a peripheral circuit part in which a peripheral circuit for controlling said memory cell transistors is disposed, further comprising:

a second isolation insulating film of trench type disposed at the boundary portion between said memory cell array part and said peripheral circuit part, in said main surface of said semiconductor substrate, said second isolation insulating film being deeper than said first isolation insulating film.

13. The non-volatile semiconductor memory according to claim 11 wherein said gate electrodes are formed so as to overlie the end portion of said first isolation insulating film at the boundary portion with said main surface of said semiconductor substrate; and a recess buried with said gate electrodes is disposed in the upper surface of said end portion of said first isolation insulating film.

14. The non-volatile semiconductor memory according to claim 11 wherein
said first isolation insulating film has a cross-section of substantially T-shape of which central portion has a larger depth than its end portion; and
said impurity diffusion region of one said memory cell transistor and said impurity diffusion region of the other said memory cell transistor adjacent to the one said memory cell transistor via said first isolation insulating film, are isolated by said central portion of said first isolation insulating film.

15. The non-volatile semiconductor memory according to claim 1 wherein
said semiconductor substrate is a semiconductor layer of a SOI substrate having such a structure that a support substrate, an insulating layer and said semiconductor layer are stacked in this order.

16. The non-volatile semiconductor memory according to claim 12 wherein
said semiconductor substrate is a semiconductor layer of a SOI substrate having such a structure that a support substrate, an insulating layer and said semiconductor layer are stacked in this order; and
said second isolation insulating film is in contact with said insulating layer.

17. The non-volatile semiconductor memory according to claim 12 wherein
said semiconductor substrate is a semiconductor layer of a SOI substrate having such a structure that a support substrate, an insulating layer and said semiconductor layer are stacked in this order; and
the bottom surface of said second isolation insulating film is present in said semiconductor layer.

18. A non-volatile semiconductor memory comprising:
a semiconductor substrate;
plural memory cell transistors disposed in the form of a matrix in said semiconductor substrate;
plural bit lines disposed at each column of said matrix;
plural word lines disposed at each row of said matrix; and
an interlayer insulating film covering said memory cell transistors;
wherein
said bit lines have an impurity diffusion region extending in the column direction of said matrix and being disposed in said semiconductor substrate,
further comprising:
wiring extending in the column direction of said matrix and being disposed in said interlayer insulating film, said wiring being connected to said impurity diffusion region via a plug disposed in said interlayer insulating film and having higher conductivity than said impurity diffusion region.

19. The non-volatile semiconductor memory according to claim 18 wherein
said word lines extend in the row direction of said matrix and have a portion functioning as said gate electrodes of said memory cell transistors and overlying said semiconductor substrate via a gate insulating film capable of storing electrons;
further comprising:
wiring extending in the row direction of said matrix and being disposed in said interlayer insulating film, said wiring being connected to said word lines via a plug disposed in said interlayer insulating film and having higher conductivity than said word lines.

20. A non-volatile semiconductor memory comprising:
a semiconductor substrate; and
plural memory cell transistors disposed in the form of a matrix in said semiconductor substrate,
said memory cell transistors having:
a gate insulating film being disposed on a main surface of said semiconductor substrate and having a charge storing region capable of storing charge;
a gate electrode disposed on said gate insulating film; and
source/drain regions disposed in said main surface of said semiconductor substrate;
wherein
said charge storing region is disposed only in the end portion of said gate insulating film adjacent to said source/drain regions.

* * * * *